United States Patent [19]

Oomori et al.

[11] Patent Number: 5,115,135
[45] Date of Patent: May 19, 1992

[54] ION SOURCE

[75] Inventors: Tatsuo Oomori; Kouichi Ono, both of Amagasaki, Japan

[73] Assignee: Mitsubishi Denki Kabushiki Kaisha, Tokyo, Japan

[21] Appl. No.: 487,460

[22] Filed: Mar. 2, 1990

[30] Foreign Application Priority Data

Apr. 21, 1989 [JP] Japan .................................. 1-103177

[51] Int. Cl.$^5$ ............................................. H01J 37/08
[52] U.S. Cl. .......................... 250/423 P; 250/423 R; 250/492.2; 250/493.1; 313/363.1; 315/111.81
[58] Field of Search ............ 250/423 P, 423 R, 423 F, 250/424, 282; 204/157.22; 313/359.1, 360.1, 363.1, 231.41; 315/111.81

[56] References Cited

U.S. PATENT DOCUMENTS

| | | |
|---|---|---|
| 3,914,655 | 10/1975 | Dreyfus et al. . |
| 3,987,302 | 10/1976 | Hurst et al. . |
| 4,020,350 | 4/1977 | Ducas ................. 250/423 P |
| 4,061,921 | 12/1977 | Cantrell et al. ................. 250/423 P |
| 4,070,580 | 1/1978 | Gallagher et al. . |
| 4,149,077 | 4/1979 | Yamashita et al. ................. 250/282 |
| 4,293,769 | 10/1981 | Keppner ................. 250/423 P |
| 4,433,241 | 2/1984 | Boesl et al. ................. 250/282 |
| 4,692,627 | 9/1987 | Ueda et al. . |
| 4,716,295 | 12/1987 | Ueda et al. . |
| 4,893,019 | 1/1990 | Oomori et al. ................. 250/423 P |

Primary Examiner—Jack I. Berman
Assistant Examiner—Kiet T. Nguyen

[57] ABSTRACT

An ion source includes a partial flow generator for generating particle flow including atoms or molecules, a laser beam generator for generating a laser beam with one or a plurality of wavelengths which irradiates the whole or one part of the atoms or molecules in the particle flow near an exhaust nozzle of the particle flow generator, a pair of electrodes for applyinig an electric field over one part or the whole of the particle flow in the downstream region of the region irradiated with the laser beam, and a power supply for applying a voltage to generate the electric field between the electrodes to the electrodes. Wherein the laser has one or a plurality of excitation wavelengths for exciting specific atoms or molecules in the particle flow from a ground state to a highly excited state, that is, the Rydberg state in which the principal quantum number of a valence electron is large, a voltage for generating an electric field more than the minimum electric field for ionizing the atoms or molecules in the Rydberg state is applied between the electrodes after irradiation of the laser beam, and one or a plurality of outlet holes through which an ion beam is drawn out are provided at one part of the electrodes.

36 Claims, 58 Drawing Sheets

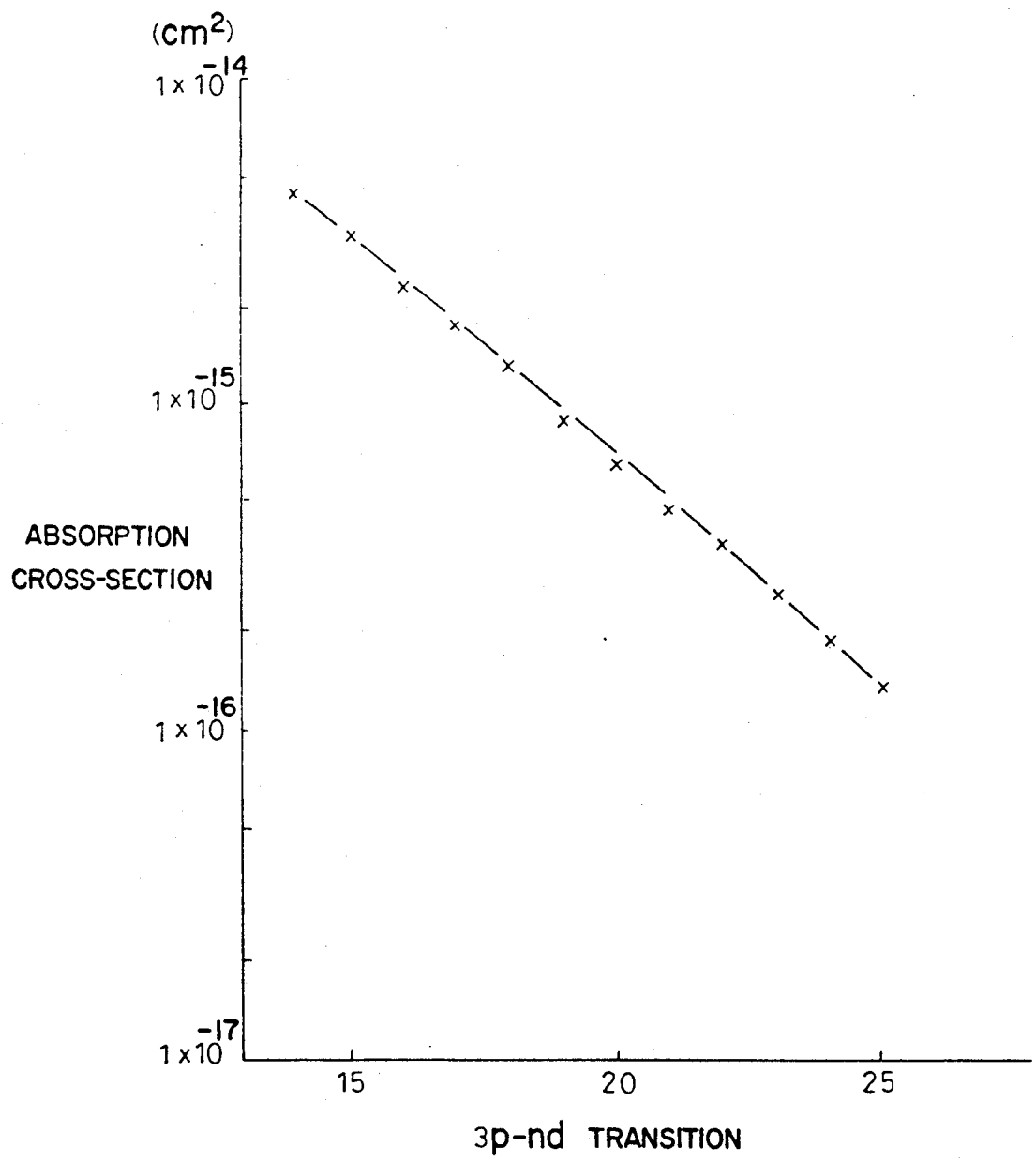
F I G .6.

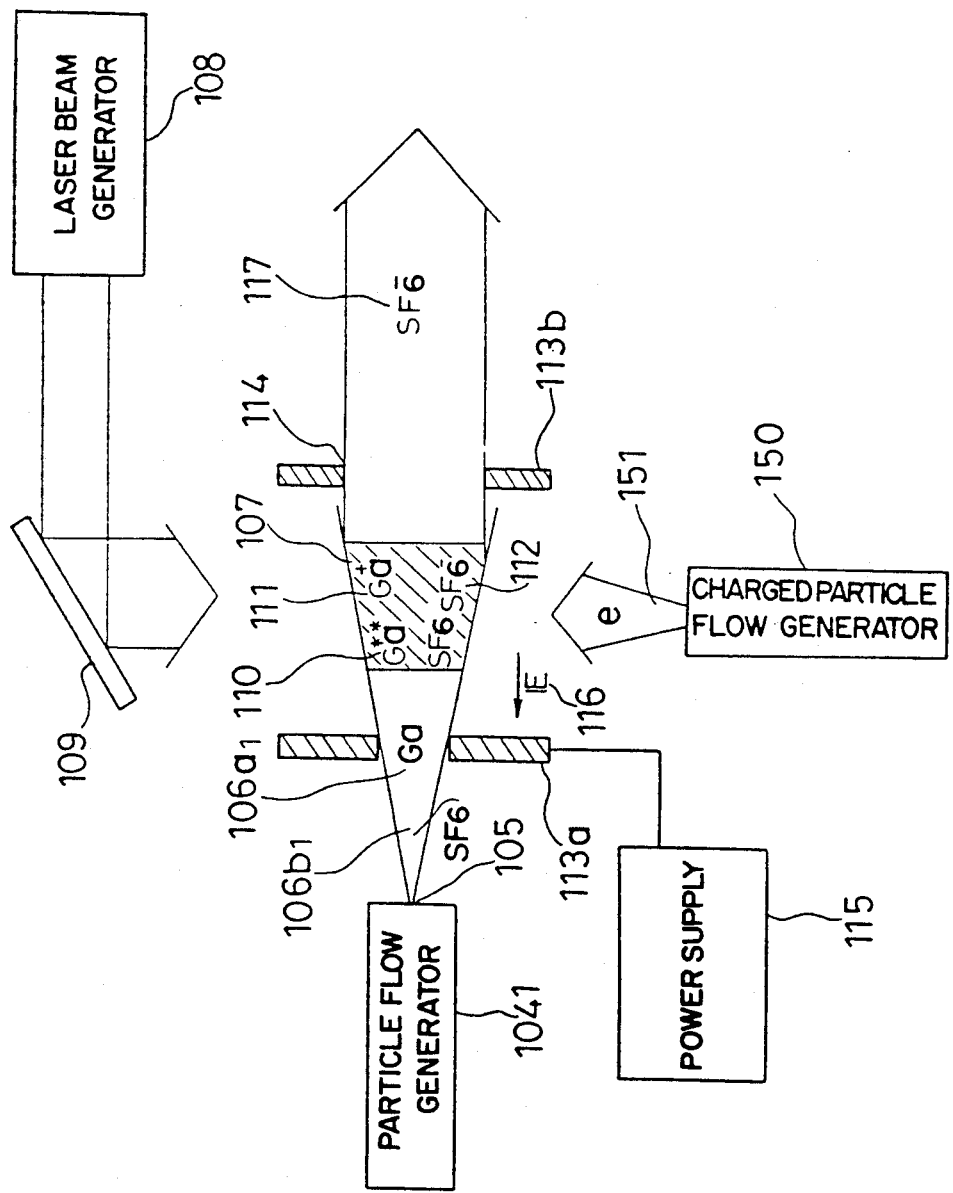

ION SOURCE

FIELD OF THE INVENTION

The present invention relates to an ion source for ionizing a material using a laser, and more particularly to an ion flow generator used for formation of thin films, ion implantation, etching, sputtering or the like.

BACKGROUND OF THE INVENTION

FIG. 1 illustrates a conventional ion source apparatus using a laser beam disclosed, for example in Japanese Patent Laid Open Gazette No. 50-22999. In figure reference numeral 1 designates a particle flow generator for generating a material to be ionized in the form of atomic flow or molecular flow, reference numeral 2 designates an exhaust nozzle of the particle flow generator 1, reference numeral 3 designates an atomic beam drawn out from the exhaust nozzle 2, reference numeral 4 designates three dye laser apparatuses, reference numeral 5 designates lenses for converging the laser beams from the dye laser apparatuses 4 with the atomic beam 3 at a point P, reference numeral 6 designates an atomic beam in which one part of the atomic beam 3 is ionized by irradiation of the laser beam and reference number 7 designates electrodes for selecting only ions from the atomic beam including ions.

The conventional ion source using the laser beam includes those described above. A description is given of an operation when, for example Na (sodium) is put in the particle flow generator 1 and the atomic beam 3 of Na is generated and then is ionized by the laser beam.

When the atomic beam 3 of Na from the exhaust nozzle 2 of the particle flow generator 1 passes through the point P at a certain speed, the laser beams from the dye laser apparatuses 4a, 4b and 4c are converged by the lenses 5a, 5b and 5c at the point P.

Since an energy level diagram of the Na atom is as shown in FIG. 2, when a wavelength ($\lambda a$) of the first dye laser apparatus 4a is 589 nm and a wavelength ($\lambda b$) of the second dye laser apparatus 4b is 568.8 nm, the Na atoms at the point P are optically excited from a ground state of $3s\ ^2S_{\frac{1}{2}}$ to a $4d$ state through a state of $3p\ ^2P_{3/2}$ by the laser beam. Since the $4d$ state of the Na atoms is at a distance of approximately 7000 cm$^{-1}$ from an ionization limit of the NA atoms, when a wavelength ($\lambda c$) of the third dye laser apparatus 4c is 1.4 $\mu$m or less, the Na atoms are directly ionized by the laser beam and ions are partially included in the atomic beam which passed through the point P. When an electric field is applied to the atomic beam 6 including the ions by the electrodes 7, only ions are deflected and irradiated to a predetermined region as an ion beam.

According to the conventional ion source using the laser beam described above, when the wavelength band width of the laser beam is equal to an absorption wavelength band width of each transition, a power density of the first dye laser beam required when the Na atoms irradiated by the laser beam at the point P are effectively ionized is approximately 10 W/cm$^2$ or more because Einstein's A coefficient of $3s\ ^2S_{\frac{1}{2}} - 3p\ ^2P_{3/2}$ transition (a transition wavelength is 589 nm) of Na is approximately $6.3 \times 10^7 (1/s)$, a required power density of the second dye laser beam is approximately 40 W/cm$^2$ or more because Einstein's A coefficient of $3p\ ^2P - 4d$ transition (a transition wavelength is 568.8 nm) is approximately $1.3 \times 10^7 (1/s)$ and a required power density of the third dye laser beam is $10^7$ W/cm$^2$ or more because an absorption cross section of the beam when Na in the $4d$ state is directly ionized is $10^{-18}$ cm$^2$ or less.

According to the conventional ion source using the laser beam, because the absorption cross section of the beam in the case of direct ionization is $10^{-18}$ cm$^2$ or less, the dye laser beam has to have a large output of $10^7$ W/cm$^2$ or more as a laser beam power density. However, an output of a large size dye laser with a high output, which is available in general, is approximately $10^6$ W in the case of a pulse laser and the output is approximately 1W in the case of a continuously oscillating laser. Therefore, it is necessary to converge the laser beam to a small region of $10^{-1}$ cm$^2$ or less in case of the pulse laser and $10^{-7}$ cm$^2$ or less in case of the continuously oscillating laser to increase the laser beam power density.

Therefore, ions cannot be sufficiently obtained because a region for ionization is small.

In addition, even if a density of atoms in the atomic beam 3 is increased in order to increase an amount of ions, when the ion density is $10^{10}$/cm$^3$ or more, a space-charge electric field of the ion itself becomes 3 kV/cm or more, so that ions are spread in the region of the atomic beam 6 including ions after the point P. Therefore, an amount of ions, which effectively reaches the electrodes 7 and enters the predetermined region, is not increased. As a result, it is found that the amount of ions cannot be largely obtained even if the density of atoms in the atomic beam 3 is increased.

Furthermore, when atoms or molecules other than alkali metal such as Na or alkaline earth metal such as Ca (calcium) are ionized, the wavelength $\lambda a$ of the first dye laser apparatus 4a has to be a wavelength ranging from an ultraviolet region of approximately 400 nm or less to a vacuum ultraviolet region of approximately 100 nm. However, a lower limit of the oscillation wavelength of the generally available dye laser is 200 nm, so that a material which can be ionized is limited.

SUMMARY OF THE INVENTION

The present invention was made to solve the abovedescribed problems and it is an object of the present invention to provide an ion source using a laser beam, capable of highly and effectively ionizing an atomic beam over a large region with a dye laser apparatus having a low output and generating an ion beam with a large aperture diameter and a large current.

It is another object of the present invention to provide various kinds of ion sources using a laser beam, capable of highly and effectively ionizing an atomic beam over a large region with a dye laser apparatus having a low output and generating ion flow with a large aperture diameter and a large current of a specific material.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

BRIEF DESCRIPTION OF THE DRAWINGS

FIG. 6 is a graph illustrating an absorption cross section of a beam of optical transition from a state of $3p\ ^2P_{3/2}$ to a state of nd of the Na atom;

FIGS. 49 through 59 are views illustrating thirtieth through fortieth embodiments of the present invention.

DETAILED DESCRIPTION OF PREFERRED EMBODIMENTS

An embodiment of the present invention will be described in detail with reference to the drawings.

Figure 1:
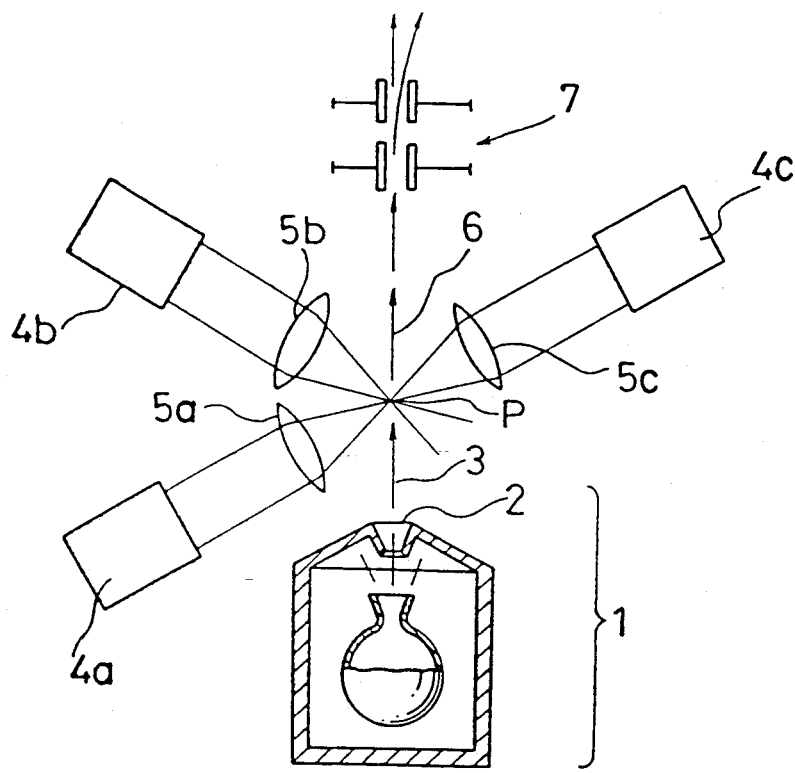
FIG. 1 is a view illustrating a conventional ion source apparatus using a laser beam.
Figure 2:
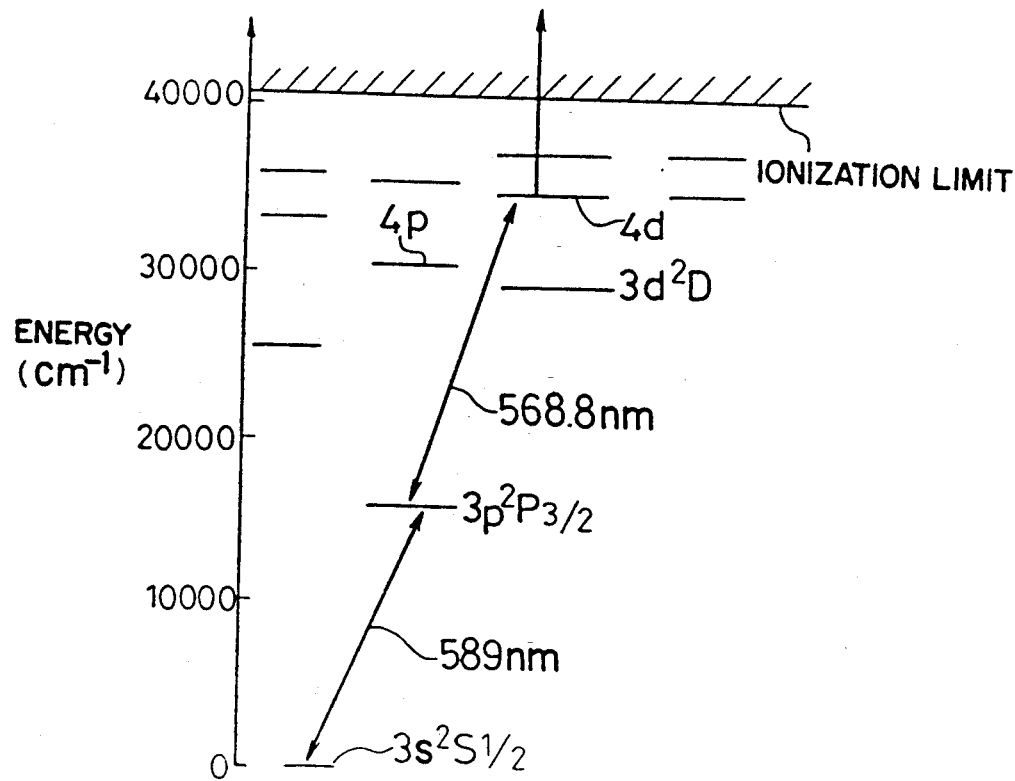
FIG. 2 is a graph illustrating an energy level diagram of an Na atom.
Figure 3:
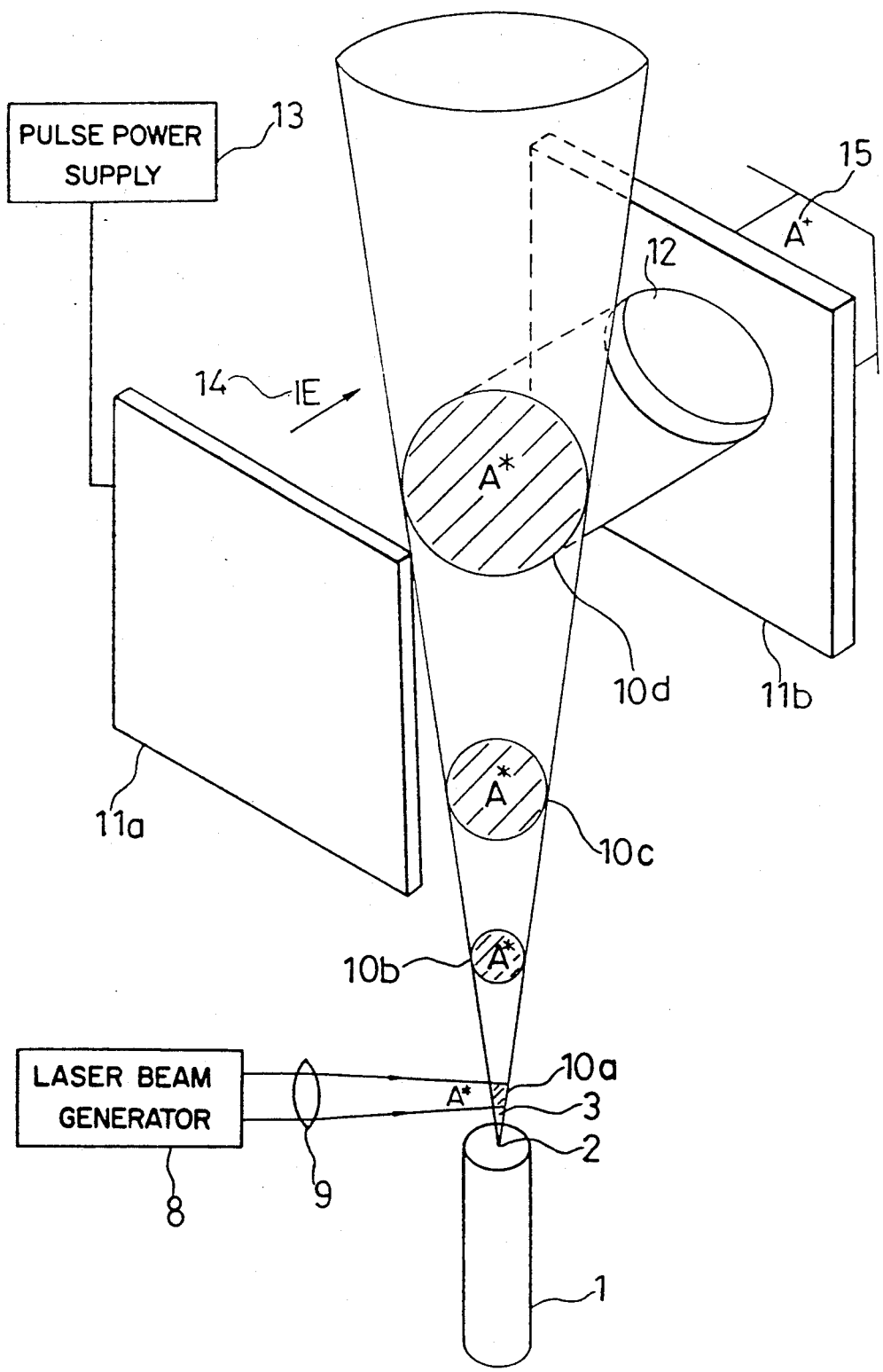
FIG. 3 is a view illustrating an ion source in accordance with a first embodiment of the present invention.

FIG. 3 illustrates an ion source in accordance with a first embodiment of the present invention. In FIG. 3, reference numeral 1 designates a particle flow generator for generating a material to be ionized in the form of atomic or molecular flow, reference numeral 2 designates an exhaust nozzle of the particle flow generator 1, reference numeral 3 designates an atomic beam from the exhaust nozzle 2, reference numeral 8 designates a laser beam generator for generating a laser beam having a single or a plurality of wavelengths which excites atoms in this atomic beam from a ground state to a highly excited state, that is, the Rydberg state in which the principal quantum number of a valence electron is large and reference numeral 9 designates an optical path adjuster for irradiating the laser beam from the laser beam generator 8 to the atomic beam 3 in the vicinity of the exhaust nozzle of the particle flow generator 1. A convex lens is used as this optical path adjuster in this embodiment. Reference numeral 10a designates a region in which the atomic beam 3 is irradiated with the laser beam and the atoms in the atomic beam are excited into the Rydberg state. Reference numerals 10b, 10c and 10d are regions, through which the atomic beam excited in the Rydberg state moves downstream with the passage of time and distributions of the atoms in the Rydberg state after a certain amount of time are illustrated in those regions. Reference numerals 11a and 11b designate a pair of electrodes arranged at a downstream region 10d of the atomic beam in the Rydberg state and in this embodiment, plate electrodes are arranged in parallel, to which a voltage generating an electric field for ionizing the atoms in the Rydberg state is applied.

Reference numeral 12 designates an outlet hole on the electrode 11b opposite to the electrode 11a. Reference numeral 13 designates a power supply connected to the electrode 11a and in this embodiment, a pulse power supply which generates a pulse voltage of a positive voltage is used. Reference numeral 14 designates an electric field generated between the electrodes by the pulse voltage applied from the power supply 13 to the electrodes 11a and 11b after the atomic beam 3 is irradiated with the laser beam from the laser beam generator 8 and the atomic beam 3 is excited into the atomic beam 10 in the Rydberg state. Reference numeral 15 designates an ion beam emitted through the outlet hole 12 on the electrode 11b when the atomic beam in the Rydberg state between the electrodes 11a and 11b is ionized and accelerated by the electric field 14.

Figure 4:
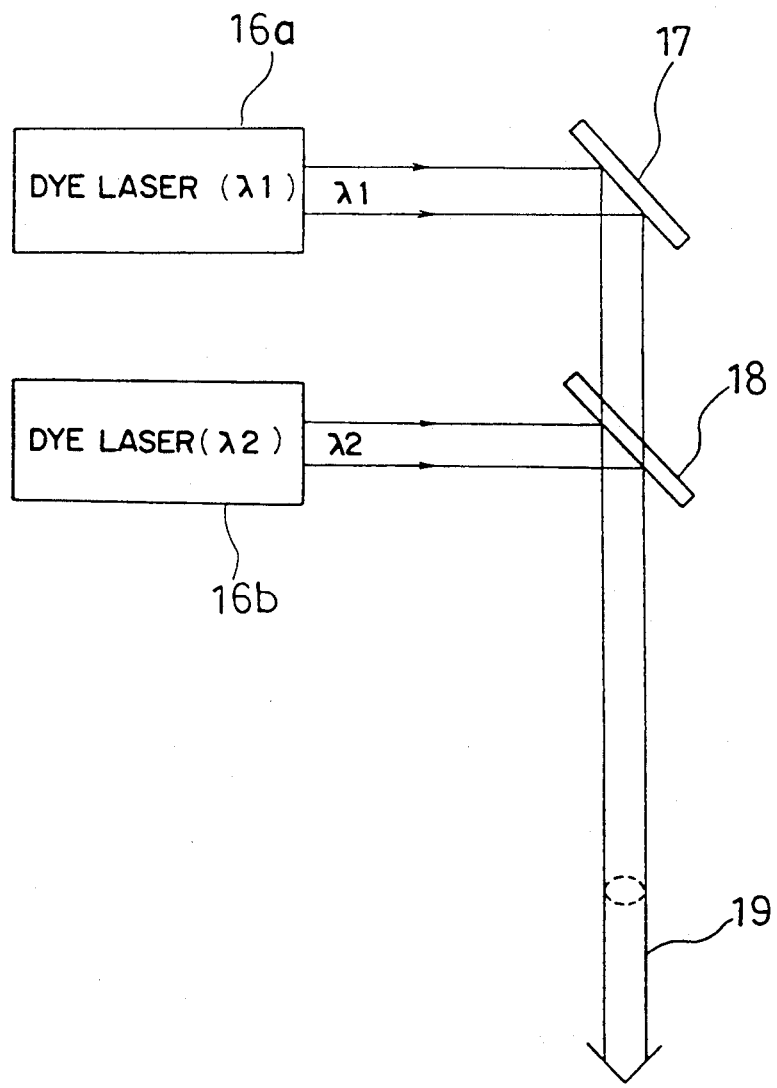
FIG. 4 is a view illustrating one example of a laser beam generator used in the first embodiment of the present invention.

FIG. 4 illustrates one example of the laser beam generator 8 used in the first embodiment which generates the laser beam having two different kinds of wavelengths on the same optical axis. Reference numeral 16a designates a dye laser oscillating with a wavelength $\lambda_1$ as a center wavelength and reference numeral 16b designates a dye laser oscillating with a wavelength as a center wavelength, reference numeral 17 designates an optical device for adjusting an optical path of the laser beam from the dye laser ($\lambda_1$) 16a, which is a mirror in this example. Reference numeral 18 designates a mirror which transmits the beam with an oscillating wavelength $\lambda_1$ of the dye laser ($\lambda_1$) 16a and reflects the beam with an oscillating wavelength ($\lambda_2$) of the dye laser ($\lambda_2$) 16b, wherein the mirror is a dielectric reflecting mirror in this first embodiment of the present invention. Reference numeral 19 designates a laser beam having wavelengths of $\lambda_1$ and $\lambda_2$.

Figure 5:
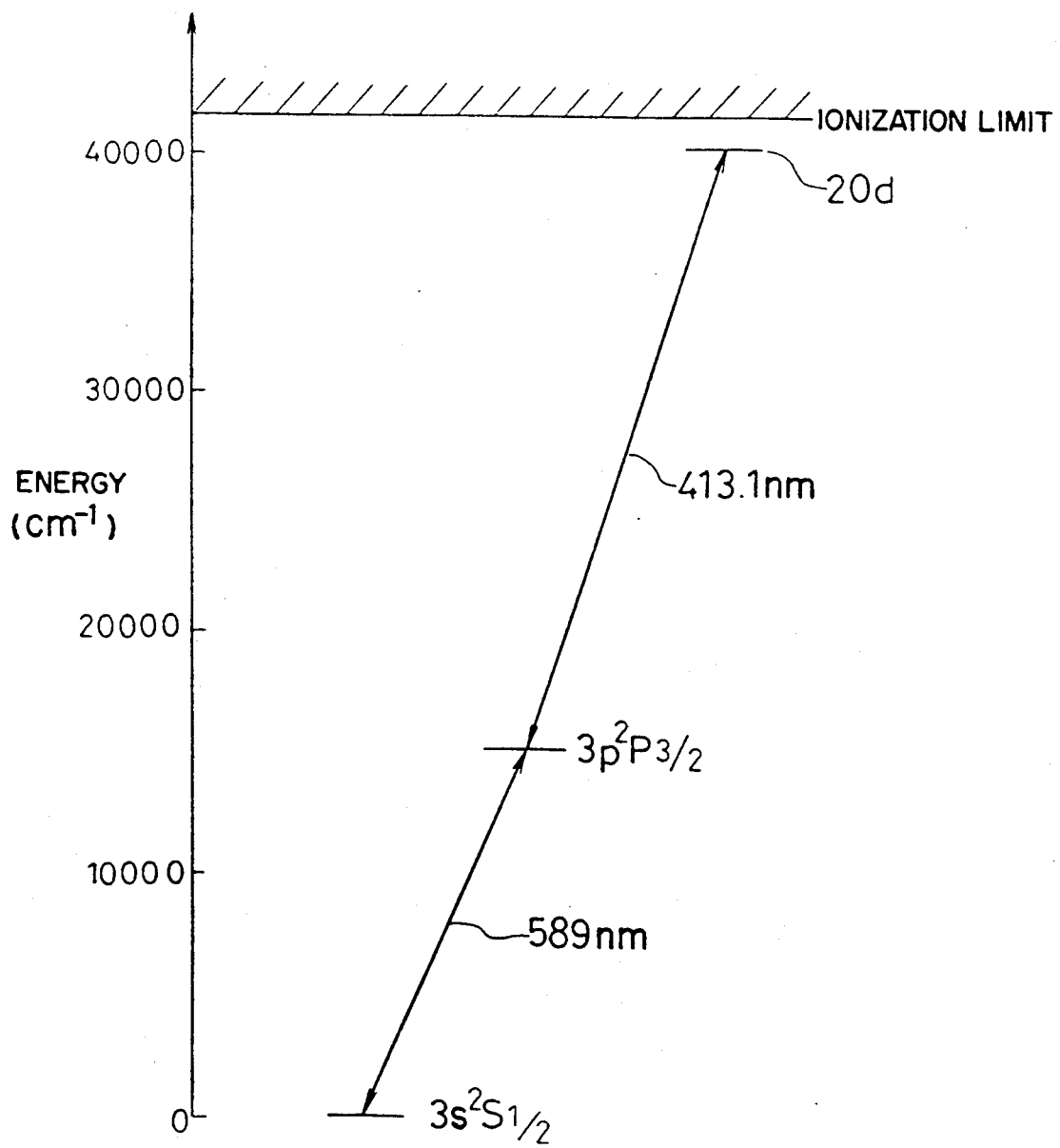
FIG. 5 is a graph illustrating an energy level diagram of an Na atom in which one example of the Na atom in the Rydberg state is illustrated.

According to the structured ion source in accordance with the first embodiment of the present invention, when an ion beam of, for example Na (sodium) is generated, Na is put in the particle flow generator 1 and the atomic beam 3 of Na is generated from the exhaust nozzle 2. A pulse laser beam with a wavelength of 589 nm ($\lambda_1$) and a pulse laser beam with a wavelength of 431.1 nm ($\lambda_2$) are put on the same optical axis by the mirror 17 and the dielectric reflecting mirror in the laser beam generator 8 and then irradiate the atomic beam 3 in the vicinity of the exhaust nozzle 2 of the particle flow generator through the optical path adjuster 9. FIG. 5 is a graph illustrating an energy level diagram of the Na atom in which one example of the Na atom in a highly excited state is illustrated. Na atoms in the Na atomic flow irradiated with the laser beam are excited from a ground state of $3s\ ^2S_{\frac{1}{2}}$ to a state of $3p\ ^2P_{3/2}$ by the laser beam ($\lambda_1$) with a wavelength of 589 nm and then to a highly excited state (Rydberg state) in which the principal quantum number of a valence electron of 20d state is 20 by the laser beam ($\lambda_2$) with a wavelength of 413.1 nm. As for a necessary laser output, because Einstein's A coefficient of $3s\ ^2S_{\frac{1}{2}} - 3p\ ^2P_{3/2}$ transition (a transition wavlength is 589 nm) of Na is approximately $6.3 \times 10^7(1/s)$, if the laser beam $\lambda_1$ with a wavelength of 589 nm has a power density of approximately 10 W/cm$^2$ or more, excitation from the group state to the $3p\ ^2P_{3/2}$ of the Na atoms is saturated. An absorption cross section of the beam when the Na atoms are excited from the $3p\ ^2P_{3/2}$ state to the highly excited state of nd state is illustrated in FIG. 6, which ranges from $10^{-14}$ cm$^2$ to $10^{-17}$ cm$^2$ in accordance with a value of the principal quantum number (n) of the highly excited state. Because the absorption cross section in case of $3p\ ^2P_{3/2} - 20d$ transition (a transition wavelength is 413.1 nm) is approximately $10^{-15}$ cm$^2$, if the laser beam $\lambda_2$ with a wavelength of 413.1 nm has a power density of approximately $10^4$ W/cm$^2$ or more, excitation of the Na atoms from $3p\ ^2P_{3/2}$ state to 20d state is saturated.

As described above, when the power density of the pulse laser beam with two wavelengths from the laser beam generator 8 is $10^4$ W/cm$^2$ or more, excitation of the Na atoms from the ground state to the highly excited state of 20d can be saturated, whereby the Na atoms can effecitvely become the Rydberg state.

Figure 7:
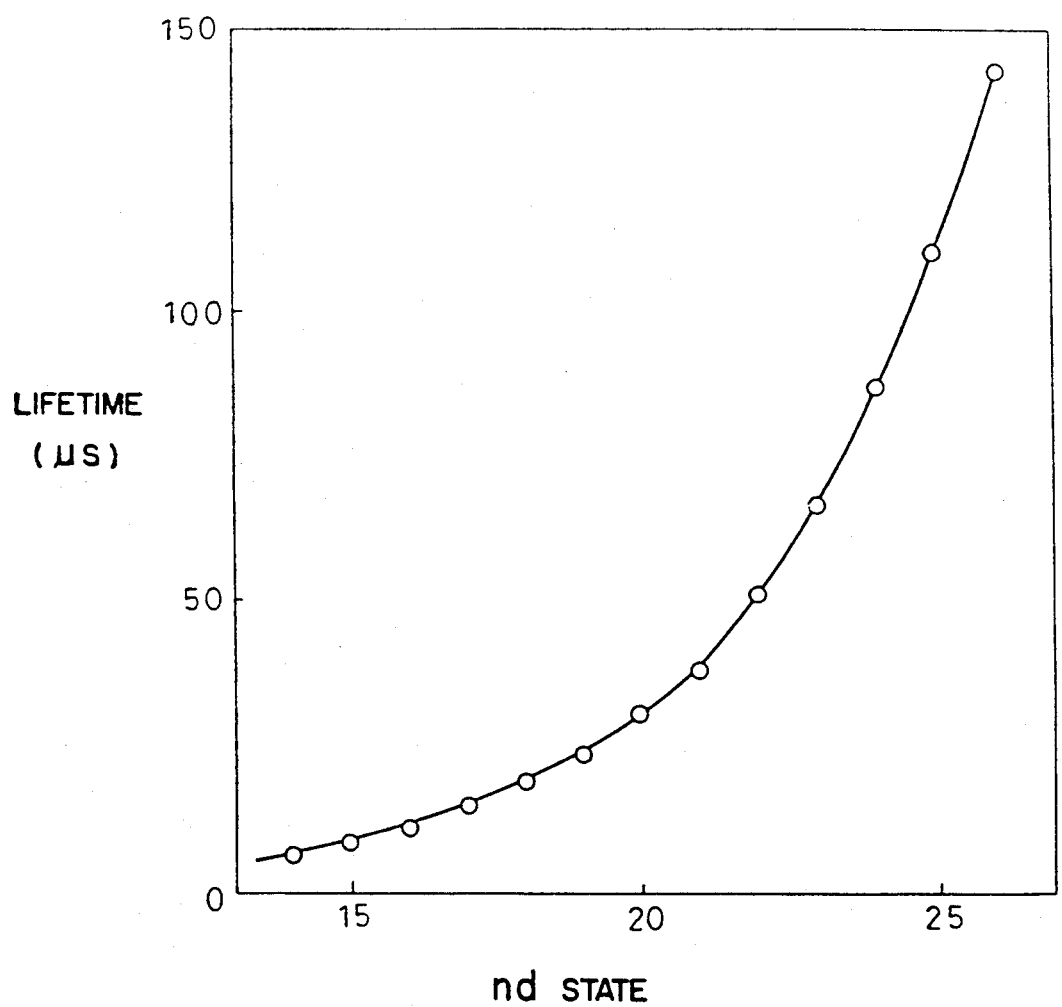
FIG. 7 is a view illustrating a radiative lifetime of the nd state of the Na atom.

In addition, FIG. 7 illustrated a radiation lifetime of the Rydberg state, which changes in accordance with a value of the principal quantum number (n) in the excited state. More specifically 30 μs, which means that once the n atoms ar excited into a state of 20d by the laser beam, the Na atoms can be in the Rydberg state of 20d for approximately 30 μs after the laser beam is stopped.

Therefore, as the Na atoms excited into the Rydberg state by the pulse laser beam with two wavelengths in the atomic beam 3 having a high particle density in the vicinity of the exhaust nozzle 2 flow downstream, the Na atoms diffuse around while reducing their density along their flow. At this time, their Rydberg state is kept for approximately 30 μs or more even after irradiation of the laser beam is finished. More specifically, the atomic beam in the Rydberg state in the region 10a irradiated with the laser beam increases its volume as illustrated by the regions 10b, 10c and 10d and decreases its density as the laser beam flows downstream with the passage of time. The ratio of increase of volume is as follows that is, if the volume of the atomic beam in the Rydberg state in the region 10a is Vo, the volume becomes approximately $l^3$/Vo times in a region at a distance of 1 from the region 10a because velocity distribution of the Na atoms is the Maxwell's distribution and the flow of the atomic beam 3 spreads in accordance with a cosine rule when the Na atoms in the particle flow generator is in a thermal equilibrium state and the exhaust nozzle 2 is a thin single hole. For example, when the laser beam irradiation area is $\sim 10^{-1}$ cm$^2$ and the atomic beam in the Rydberg state in the region 10a has a volume of $\sim 3 \times 10^{-2}$ cm$^3$, the volume of the atomic beam in the Rydberg state when the atomic beam flows downstream by a distance of 15 mm is $\sim 3$ cm$^3$, that is, the volume becomes approximately 100 times and the density of the Na atoms becomes approximately 1/100.

The nature described above can be applied to another atom in the Rydberg state. According to R. F. Stebbings, et al., in "Rydberg States of Atoms and Molecules," published by Cambridge University Press, London, 1983, the nature of any atom or molecule in the highly excited state (Rydberg state), in which the principal quantum number of a valence electron is large, is mostly determined by the principal quantum number (n), in which a lifetime τ in the Rydberg state is expressed by:

$$\tau \alpha n3$$

Therefore, the lifetime becomes long as the number n increases. In addition, since the valence electron in the highly excited state is at an energy level near an ionization limit, the valence electron can be easily ionized by an external electric field and a minimum electric field Ec for ionization is given by:

$$Ec \sim 3.2 \times 10^8 \, n^{-4} \, (V/cm) \ldots \quad (1)$$

and when n=20, Ec~2 kV/cm is obtained.

Figure 8:
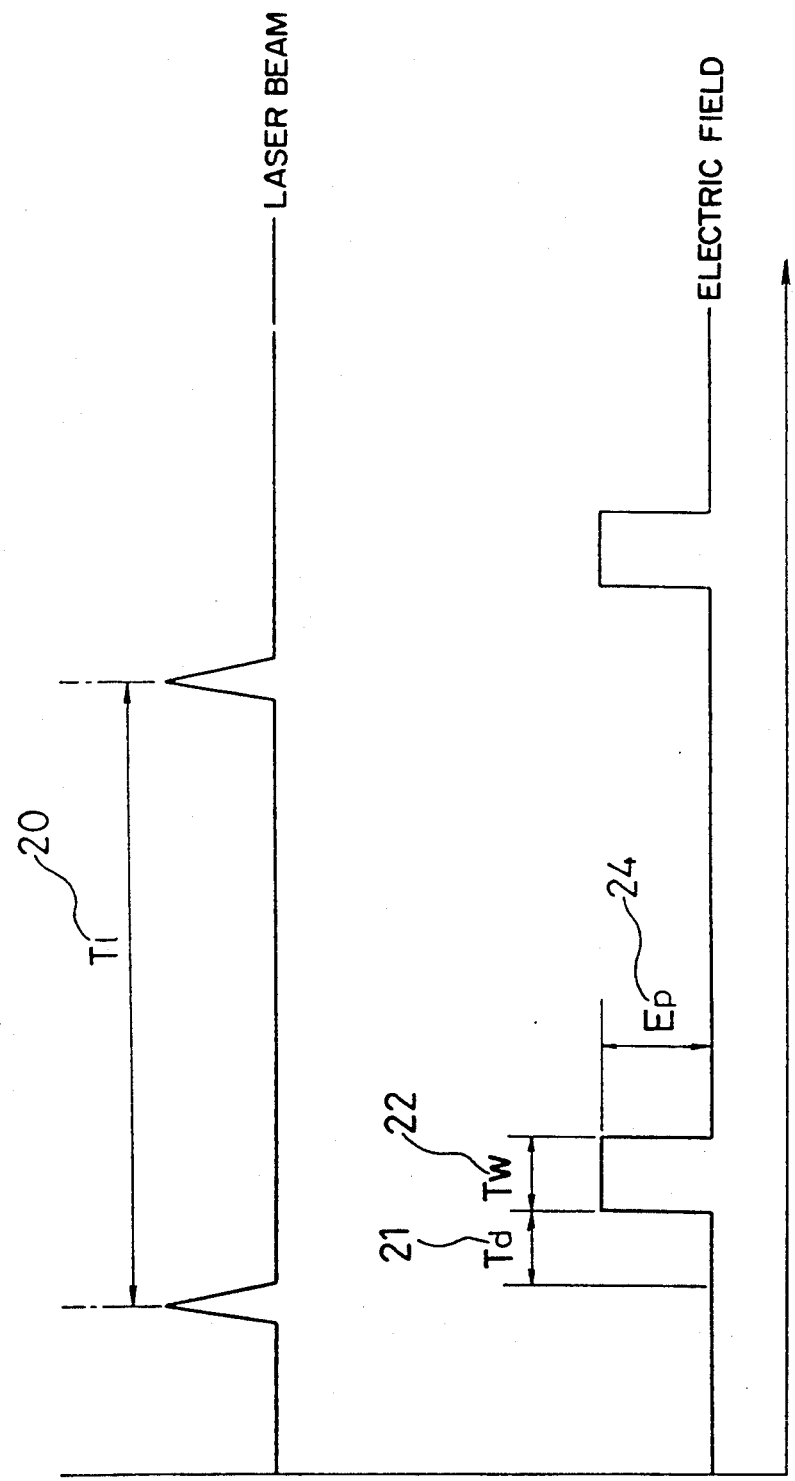
FIG. 8 is a view illustrating a timing between pulse laser beam irradiation and electric field application in the first embodiment of the present invention.

Then, the Na atomic beam 3 is irradiated with the pulse laser beam and the Na atomic beam is excited into the Rydberg state having the principal quantum number of 20. Thereafter, a pulse voltage is applied from the power supply 13 to the electrodes 11a and 11b, whereby the electric field 14 is repetitively applied between the electrodes at the timing illustrated in FIG. 8. In FIG. 8, reference numeral 20 designates an oscillation cycle of the pulse laser beam, reference numeral 21 designates a delay time of the application of the electric field until the electric field is applied between the electrodes after the pulse laser beam is irradiated. Reference numeral 22 designates a period of time that the electric field is applied between the electrodes and reference numeral 24 designates an intensity of the electric field.

In the first embodiment, the oscillation cycle 20 of the pulse laser beam is approximately 1 ms, the delay time 21 of the application of the electric field is approximately 30 μs, the period of time 22 of electric field application is approximately 1 μs and the intensity of the electric field 24 is 5 kV/cm. The laser beam irradiation area is approximately $10^{-1}$ cm$^2$ and the distance between the laser beam irradiated position and the atomic beam in the Rydberg state in the region 10a between both electrodes 11a and 11b is 15 mm.

Since an average thermal velocity of the atomic beam 3 is approximately 100 m/s, the atomic beam excited into the Rydberg state by the laser beam at the region 10a reaches the region 10d between the electrodes when the electric field is applied. Since the intensity of the electric field applied between the electrodes is 5 kV/cm, the Na atoms in the Rydberg state between the electrodes are easily ionized and generated Na ions are accelerated by the electric field and drawn outside through the outlet hole 12 of the electrode 11b.

As described above, the region 10d where the atoms in the Rydberg state are distributed is approximately 3 cm$^3$, which is 100 times as large as the volume of the laser irradiation region 10a and the density of Na atoms becomes 1/100. Therefore, the amount of Na ions obtained without being influenced by a space-charge electric field of the generated Na ions themselves also becomes 100 times.

According to the first embodiment, because of the abovedescribed operation, an ion current of 100 times or more as compared with the conventional opera&:ion can be generated using the pulse dye laser beam having a low output of approximately 1 kW.

In addition, in the first embodiment of the present invention, when the distance between the regions 10a and 10d is 15 mm or longer and the Na atoms are excited into the Rydberg state in which the principal quantum number is 20 or more by changing the laser wavelength and the delay time of the electric field application is 30 μs or more, an ion beam having a larger current can be generated. Furthermore, other than the laser beams having the same optical axis are irradiated in the vicinity of the exhaust nozzle from a horizontal direction, even if laser beams having different optical axes are irradiated from the upper regions so as to overlap each other near the exhaust nozzle, the same ion beam with a large current can be generated.

In addition, although the Na ion beam is generated in the first embodiment of the present invention, any atom or molecule can be generated as an ion beam because in the Rydberg state, the nature thereof is determined by the principal quantum number (n) in the excited state. When a Ga ion beam is generated, if the oscillation wavelength $\lambda_1$ of the dye laser 16a is set at a transition wavelength of 403.3 nm from the ground state to the excited state of 5s of Ga and the oscillation wavelength $\lambda_2$ of the dye laser 16b is set at a transition wavelength of 5s−np which is shorter than 429 nm, the ion beam can be similarly generated.

Figure 9:
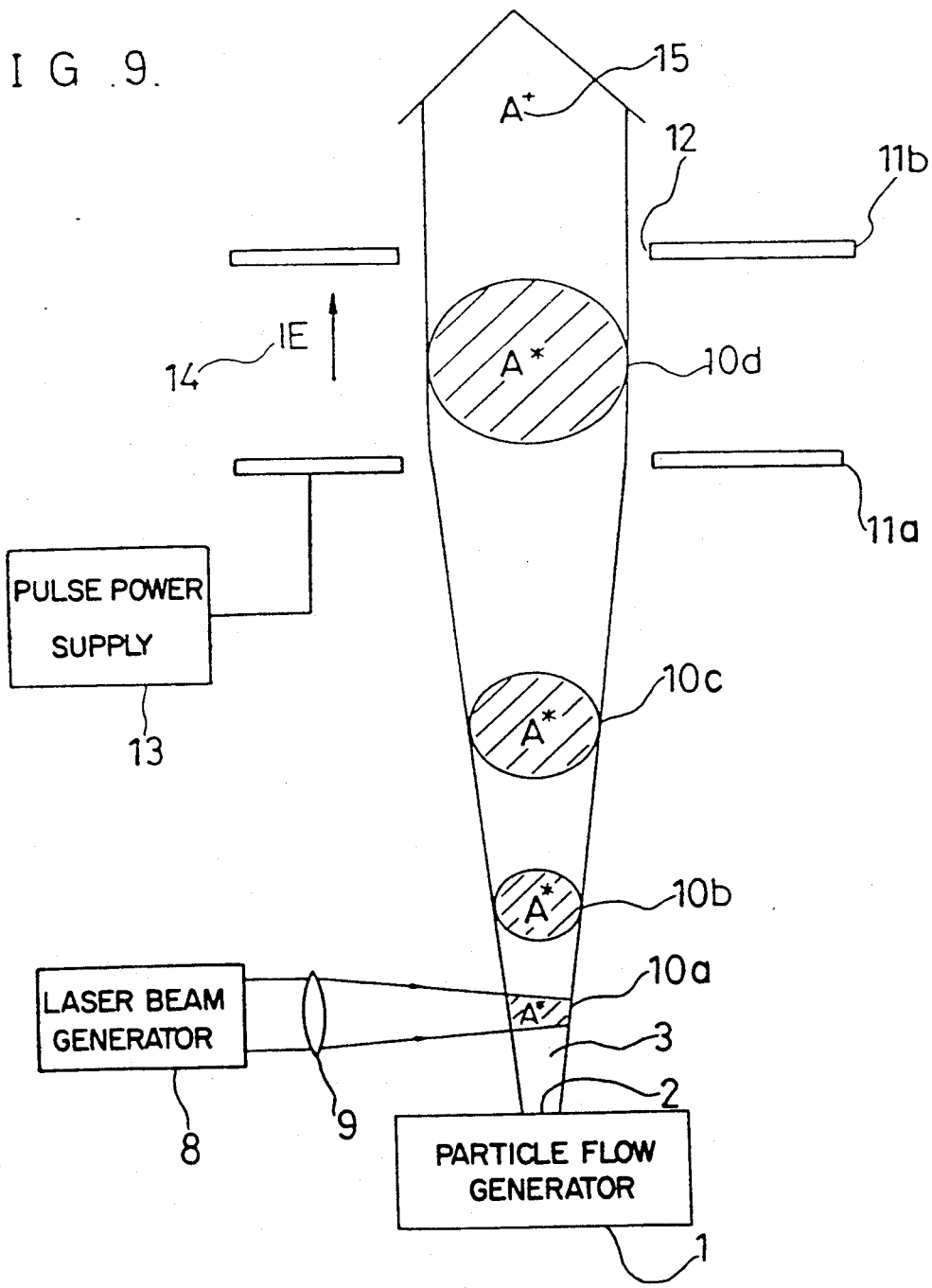
FIG. 9 is a view illustrating an example in which an electric field is applied in almost parallel to particle flow in accordance with a second embodiment of the present invention.

FIG. 9 illustrates a second embodiment of the present invention in which electrodes 11a and 11b having holes are arranged in order to apply an electric field to the atomic beam in the Rydberg state almost in parallel to the flow of the atomic beam. In the second embodiment of the present invention, a pulse electric field or a direct current electric field is applied between the electrodes 11a and 11b from the power supply 13 and an ion beam is generated on the same axis of the atomic beam. In addition, in this second embodiment, because the hole 12 on the electrode 11a through which the atomic beam 10 in the Rydberg state flows between the electrodes and the hole 12 on the electrode 11b through which the ion beam is drawn out are provided on the same axis, all atoms between the electrodes can be drawn out as an ion beam.

Figure 10:
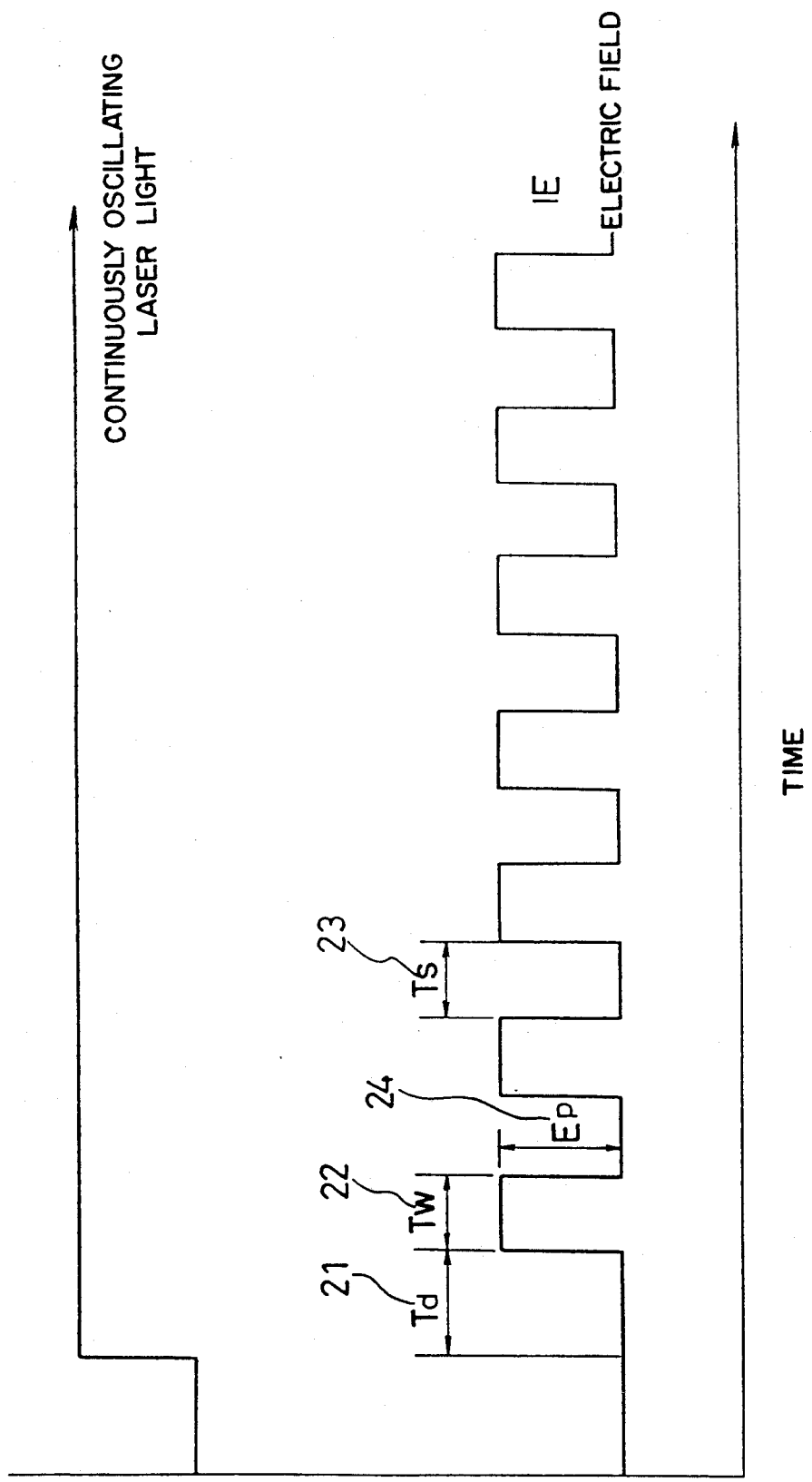
FIG. 10 is a view illustrating a timing between laser beam irradiation and an electric field application when a continuously oscillating laser beam is used in accordance with a third embodiment of the present invention.

FIG. 10 illustrates the timing of the application of the pulse electric field when the ion beam is generated by using a continuously oscillating laser beam in accordance with the second embodiment of the present invention, in which the electric field is applied at a predetermined period.

When atoms are excited into the Rydberg state by using the continuously oscillating laser beam, even if power density is fairly low as compared with the case of the pulse laser beam, the lifetime in the Rydberg state is as long as several $\mu s$, whereby excitation into the Rydberg state and its accumulation can be gradually implemented. For example, when Na atoms are excited from a state of $3p\ ^2P_{3/2}$ to a state of $20d$, its transition can be saturated by a density of several 10 W/cm$^2$.

Therefore, when atoms are excited into the Rydberg state by using the continuously oscillating laser beam, the atomic beam 3 can reach the electrodes as the atomic beam in the Rydberg state by a laser output of approximately several 10 W/cm$^2$ which is lower than the laser output in case of the pulse laser beam.

When the pulse electric field is applied as illustrated in FIG. 10, since atoms in the Rydberg state always exist between the electrodes, a frequency of the generation of the pulse ion beam coincides with a repeated frequency of the applied electric field. Therefore, if the application of the electric field is repeated at approximately 1 MHz, an ion beam of several mA/cm$^2$ can be generated. When a dc electric field is applied between the electrodes 11a and 11b, the atoms in the Rydberg state between the electrodes can be all ionized and drawn out as an ion beam, so that in this case, a current value which can be drawn out depends on the number of atoms in the Rydberg state between the electrodes. As a result, an ion beam with high purity of approximately several mA/cm$^2$ can be continuously drawn out without difficulty.

Figure 11:
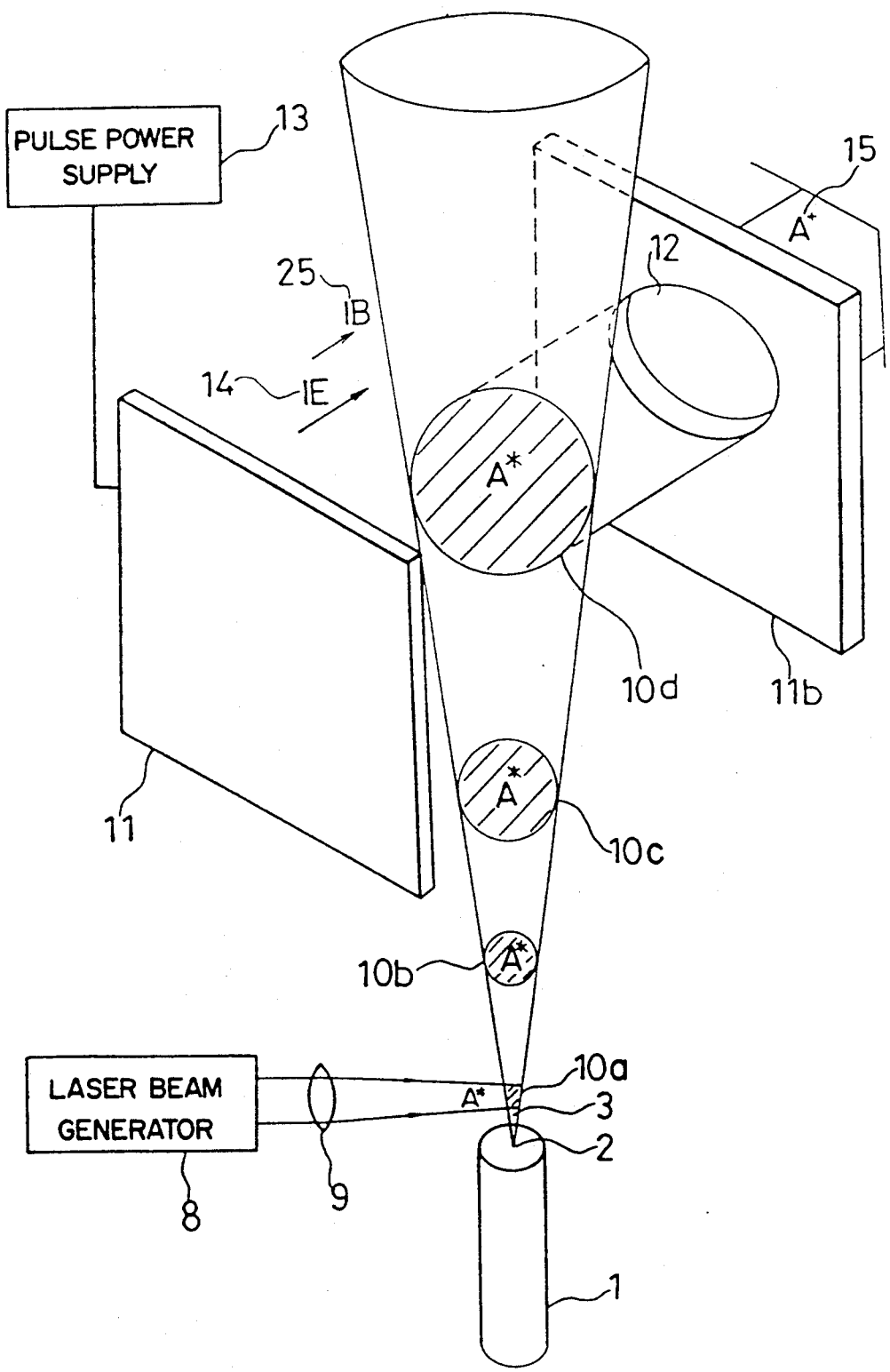
FIG. 11 is a view illustrating an example in which a magnetic field is applied in parallel to the electric field in accordance with a fourth embodiment of the present invention.

FIG. 11 illustrates a third embodiment of the present invention in which a magnetic field 25 is applied between the electrodes 11a and 11b in parallel to the electric field, whereby the ion beam is prevented from diffusing.

Although a description was given for the generation of the ion beam of atoms or molecules in the above first to third embodiments, it is needless to say that an ion beam containing many specific isotopes may be generated in such a manner that a wavlength band width of a laser beam which excites atoms into the Rydberg state is reduced so that isotropic uranium 235 ($^{235}U$) is selectively ionized from uranium (U).

Figure 12:
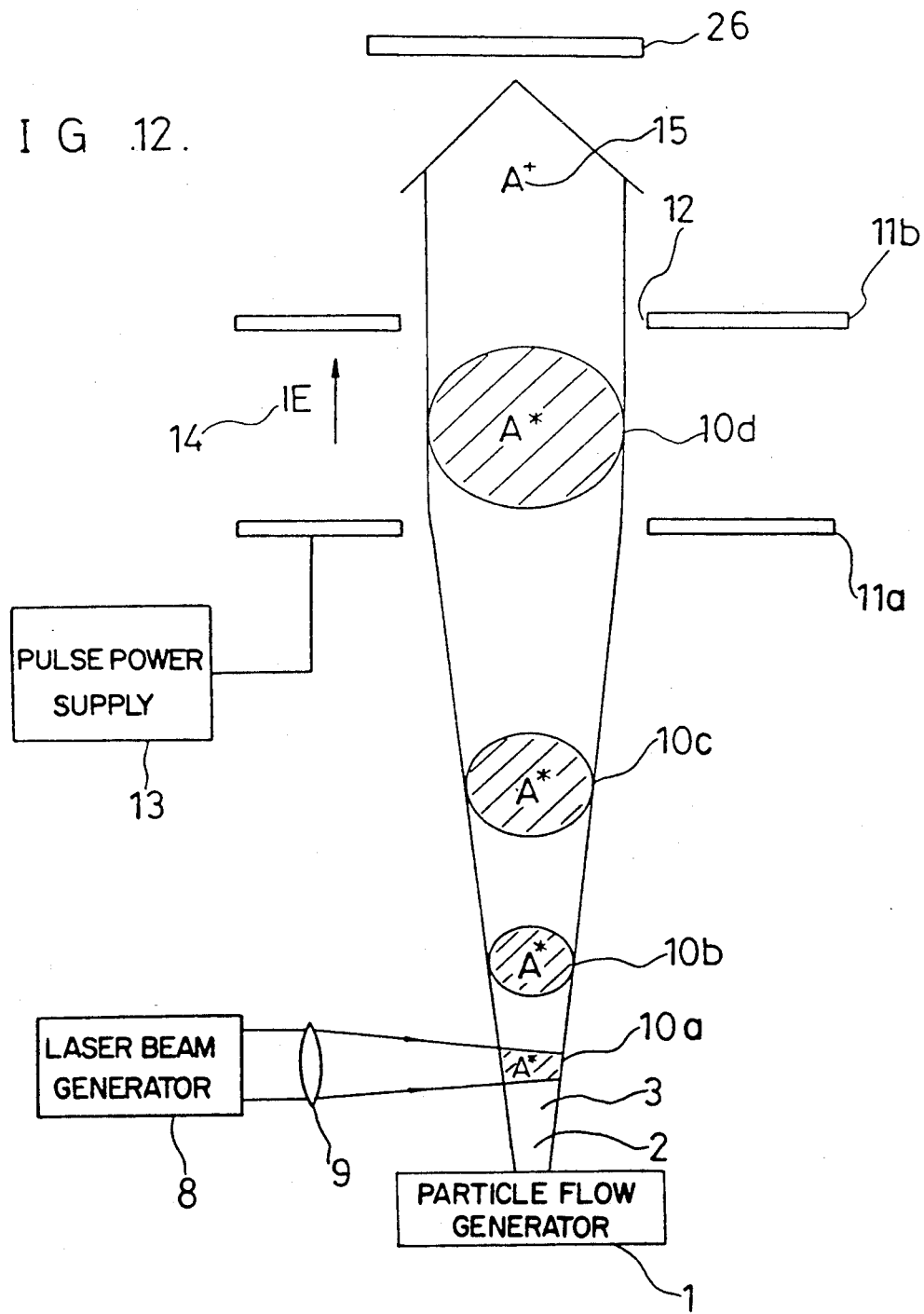
FIG. 12 is a view illustrating one example in which a thin film is formed on a substrate by using the ion source in accordance with the present invention.

FIG. 12 illustrates a fourth embodiment of the present invention in which a thin film of Ga or the like is formed on a substrate using the ion source in accordance with the second embodiment of the present invention in FIG. 9.

A substrate 2b is arranged outside the electrode 11b through which the ion is drawn out and the ion beam irradiates the substrate.

In addition, if material atoms such as P or As used for ion implantation are similarly ionized and the intensity of a voltage of the electric field is set at several 10 kV/cm or more, an ion beam reaches the substrate 26 as atomic flow at a high speed and then the ion source can be used for ion implantation instead of thin film formation.

In addition, if atoms or molecules such as fluorine and chlorine are similarly ionized and an ion beam is generated as atomic flow, a layer to be etched on the substrate 26 can be etched away by this ion beam and then the ion source can be used for etching.

Although the substrate 26 is arranged outside the electrodes in the fourth embodiment, because ionization can be uniformly performed between the electrodes 11a and 11b, the substrate 26 can be used instead of the electrode 11b. Therefore, even if the substrate 26 is arranged between the electrodes 11a and 11b, the same effect can be obtained.

According to the first to fourth embodiments of the present invention, the particle flow containing a material to be ionized is irradiated with the laser beam at a region near the exhaust nozzle and this specific material is excited into the highly excited state, that is the Rydberg state and then the electric field is applied to the material excited into the Rydberg state in a downstream region. As a result, the ion beam with high purity and a large current can be easily and effectively generated using the laser beam with a low output in the simple structure.

Figure 13:
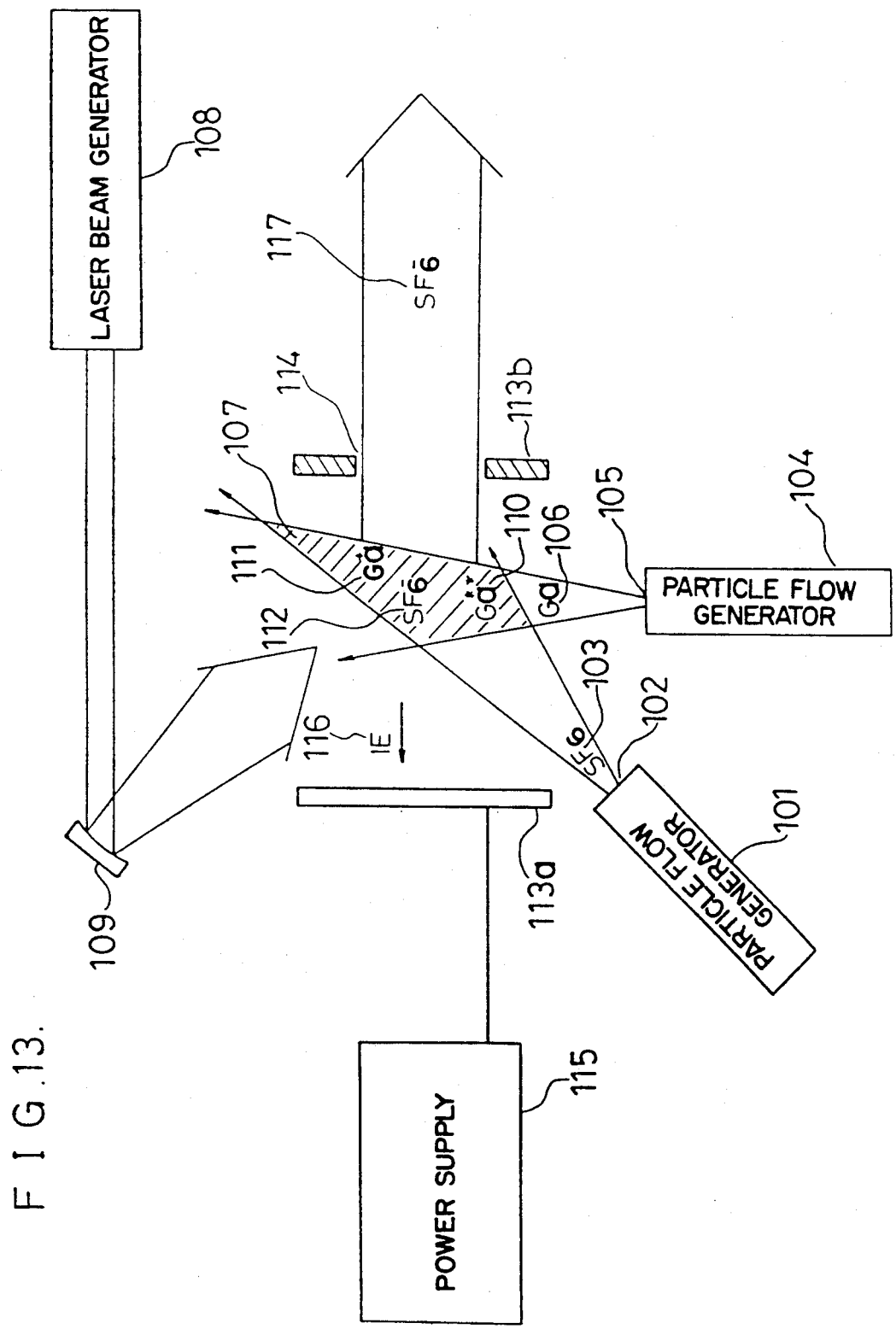
FIG. 13 is a view illustrating an ion flow generator in accordance with a fifth embodiment of the present invention.
Figure 14:
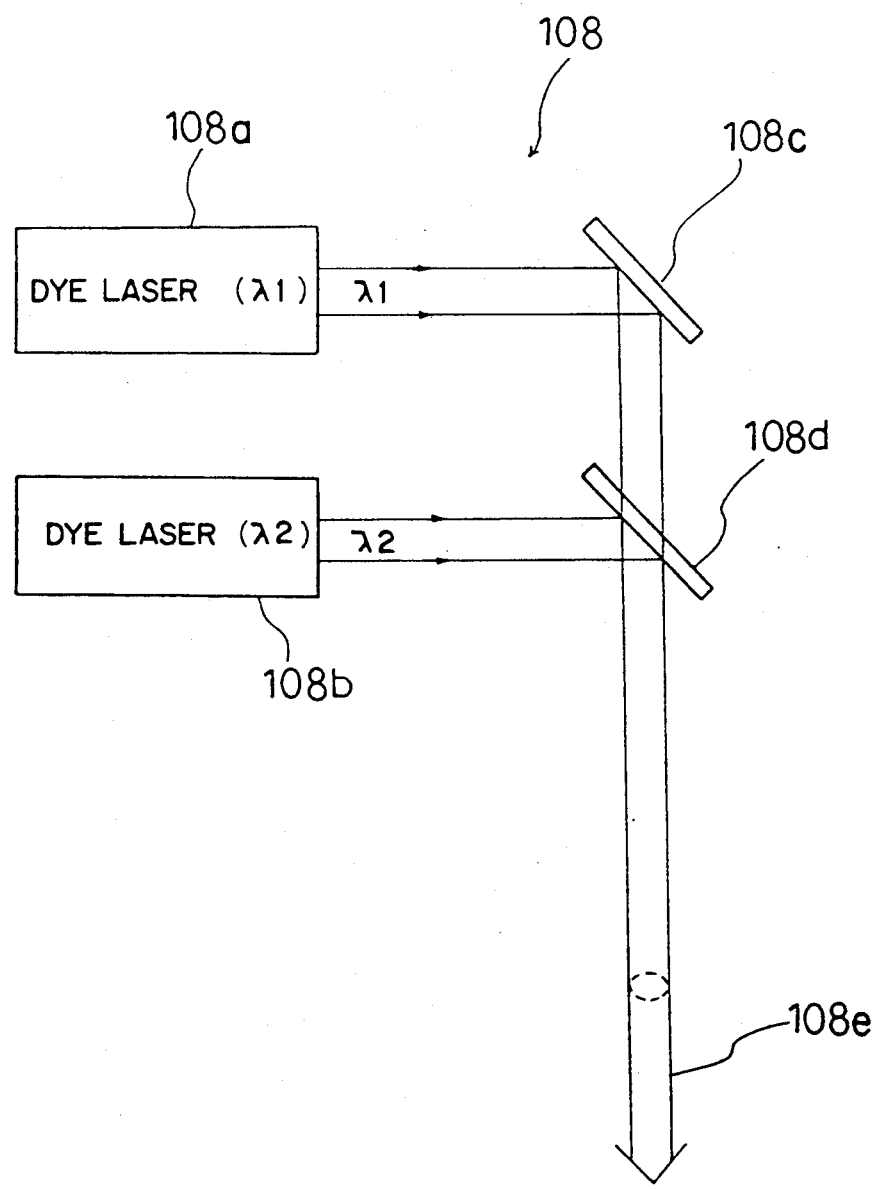
FIG. 14 is a view illustrating one example of the laser beam generator used in the fifth embodiment of the present invention in FIG. 13.

FIGS. 13 and 14 illustrate a fifth embodiment of the invention. In FIGS. 13 and 14, reference numeral 101 designates a first particle flow generator for generating particle flow of a material in the form of atomic flow or molecular flow, which generates the particle flow of SF$_6$ in this fifth embodiment of the present invention. Reference numeral 102 designates an exhaust nozzle of the first particle flow generator 101, reference numeral 103 designates particle flow in the form of a beam drawn from the exhaust nozzle 102, which is a molecular flow of SF$_6$ in this fifth embodiment of the present invention. Reference numeral 104 designates a second particle flow generator for generating atoms or molecules to be excited into the Rydberg state as particle flow, which generates the particle flow of Ga in this fifth embodiment of the invention. Reference numeral 105 designates an exhaust nozzle of the second particle flow generator 104 and reference numeral 106 designates particle flow in the form of a beam from the exhaust nozzle 105 of the second particle flow generator 104, which is an atomic flow of Ga in this fifth embodiment of the present invention.

Reference numeral 107 designates a cross region of the first particle flow 103 from the first particle flow generator 101 and the second particle flow 106 from the second particle flow generator 104, reference numeral 108 designates a laser beam generator for generating a laser beam having a single or a plurality of wavelengths, which constitutes an exciting device for exciting atoms at the cross region 107 from a ground state to a highly excited state, that is, the Rydberg state in which the principal quantum number of a valence electron is large. Reference numeral 109 designates an optical path adjuster for adjusting the laser beam from the laser beam generator such that the second particle flow 106 in the cross region 107 of the first and second particle flows or the second particle flow 106 at the upstream of the cross region 107 is irradiated with the laser beam, which is a concave mirror in this fifth embodiment of the present invention.

Reference numeral 110 designates atoms excited from the ground state to the Rydberg state in the second particle flow 106 by the laser beam, which are Ga atoms in this fifth embodiment of the present invention. Reference numeral 111 designates ionized atoms at the cross region 107 of the first and second particle flows, which are Ga⁻ in this fifth embodiment of the present invention. Reference numeral 112 designates ionized molecules at the cross region 107 of the first and second particle flow, which are $SF_6^-$ ions in this embodiment. Reference numeral 113a and 113b designate a pair of electrodes arranged so as to sandwich the cross region 107, which are plate electrodes arranged in parallel in this fifth embodiment of the present invention.

Reference numeral 114 designates an outlet hole on the electrode 103b and reference numeral 115 designates a power supply connected to the electrode 103a, which generates a negative voltage in this fifth embodiment of the present invention. Reference numeral 116 designates an electric field generated by a voltage applied from the power supply to the electrodes 113a and 113b, reference numeral 117 designates an ion flow drawn out from the outlet hole 114 on the electrode 113b, which is an $SF_6^-$ ion flow in this fifth embodiment of the present invention. The $SF_6^-$ ion flow includes $SF_6^-$ ions 112 which was ionized at the cross region 107 of the first and second particle flows and accelerated by the electric field 116.

The laser beam generator 109 used in the fifth embodiment is constituted, for example as illustrated in FIG. 14 in which the laser beam having two kinds of different wavelengths is generated on the same optical axis. In FIG. 14, reference numeral 108a designates a dye laser which oscillates with a wavelength $\lambda_1$ as a center wavelength, reference numeral 108b designates a dye laser which oscillates a wavelength $\lambda_2$ as a center wavelength, reference numeral 108c designates an optical device for adjusting an optical path of the laser beam from the dye laser 108a, which is a plane mirror in this fifth embodiment of the present invention. Reference numeral 108d designates an optical device which transmits the beam with the oscillation wavelength $\lambda_1$ from the dye laser 108a but reflects the beam with the oscillation wavelength $\lambda_2$ from the dye laser 108b, which is a dielectric reflecting mirror in this fifth embodiment of the present invention. Reference numeral 108e designates a laser beam with the wavelengths of $\lambda_1$ and $\lambda_2$.

Figure 15:
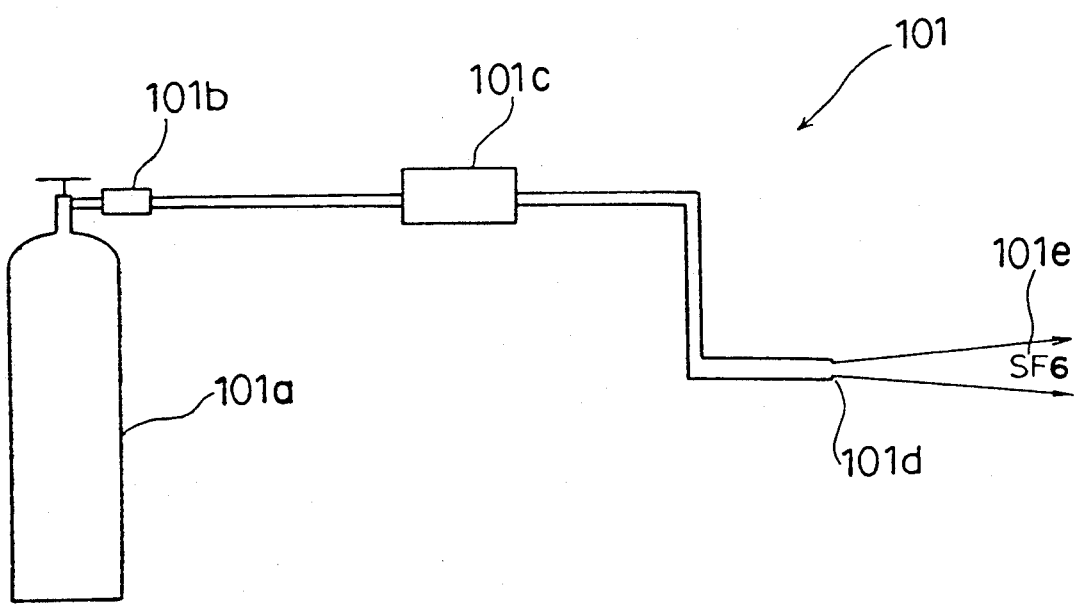
FIG. 15 is a view illustrating one example of a first particle flow generator used in the fifth embodiment of the present invention in FIG. 13.

The first particle flow generator 101 used in the fifth embodiment of the present invention is illustrated in FIG. 15, which generates molecular or atomic particle flow of a material which is in a gas state at room temperature. In FIG. 15, reference numeral 101a designates a container filled with the material, which is a gas bomb in this example. Reference numeral 101b designates a pressure reducing valve for adjusting a pressure of the material in the container 101a. Reference numeral 101c designates a flow regulator for adjusting a quantity of flow of the material which passed through the pressure reducing valve 101b. Reference numeral 101d designates an opening at one end of an inlet tube mounted on the output side of the flow regulator. Reference numeral 101e designates particle flow blowing out through the opening, which is $SF_6$ molecular flow in this embodiment.

Figure 16:
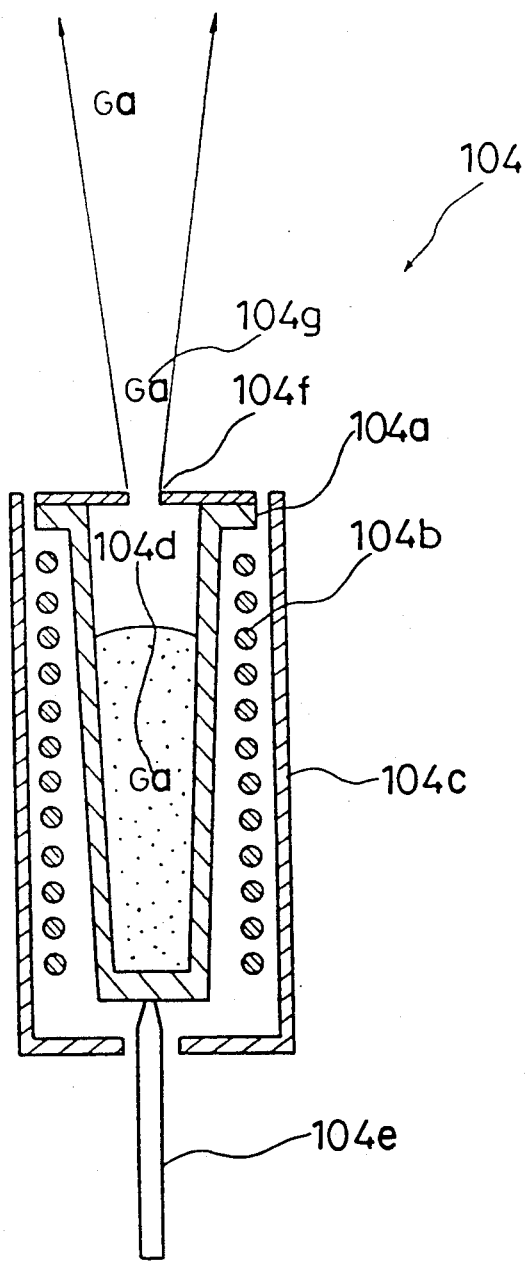
FIG. 16 is a view illustrating one example of a second particle flow generator used in the fifth embodiment of the present invention in FIG. 13.

In addition, the second particle flow generator 104 used in the fifth embodiment of the present invention is illustrated in FIG. 16, which generates molecular or atomic particle flow of a material which is in a solid state at room temperature. In FIG. 16, reference numeral 104a designates a crucible, reference numeral 104b designates a heater provided around the crucible 104a, reference numeral 104c designates a heat shielding plate for preventing heat of the heater 104b from escaping outside and reference numeral 104d designates a material in the crucible 104a, which is Ga in this example. Reference numeral 104e designates a temperature gauge arranged so as to be in contact with a lower part of the crucible 104a, reference numeral 104f designates an opening on the crucible 104a and reference numeral 104g designates particle flow blown out from the opening 104f, which is Ga atomic flow in this example.

According to the structured ion flow generator in accordance with the fifth embodiment of the present invention, when, for example negative ion flow of $SF_6^-$ is generated, the gas bomb used as the container 101a in the first particle flow generator 101 is filled with $SF_6$ and $SF_6$ is blown out with a predetermined pressure and a quantity of flow as $SF_6$ molecular flow through the opening 101d, which is adjusted by the pressure reducing valve 101b and the flow regulator 101c. This $SF_6$ molecular flow passes through the exhaust nozzle 102 and spreads and flows in the cross region 107. Meanwhile, Ga is filled in the crucible 104a in the second particle flow generator 104. Then, a temperature of the crucible 104a is increased by a current applied from the outside to the heater 104b around the crucible and the crucible temperature is kept constant by using the temperature gauge 104e. Ga 104d in the crucible 104a is vaporized as the temperature of the crucible 104a is increased and then Ga is blown out from the opening 104f as Ga atomic flow. Then, Ga passes through the exhaust nozzle 105, spreads around and also flows in the cross region 107.

Then, the second particle flow 106 in the cross region 107 or in the upstream of the cross region 107 is irradiated with the laser beam which includes a pulse dye laser beam with a wavelength of 403.3 nm ($=\lambda_1$) and a pulse dye laser beam with a wavelength of 426.2 nm ($=\lambda_2$) arranged on the same axis by the plane mirror 108c, the dielectric reflecting mirror 108d and the optical path adjuster 109.

Figure 17:
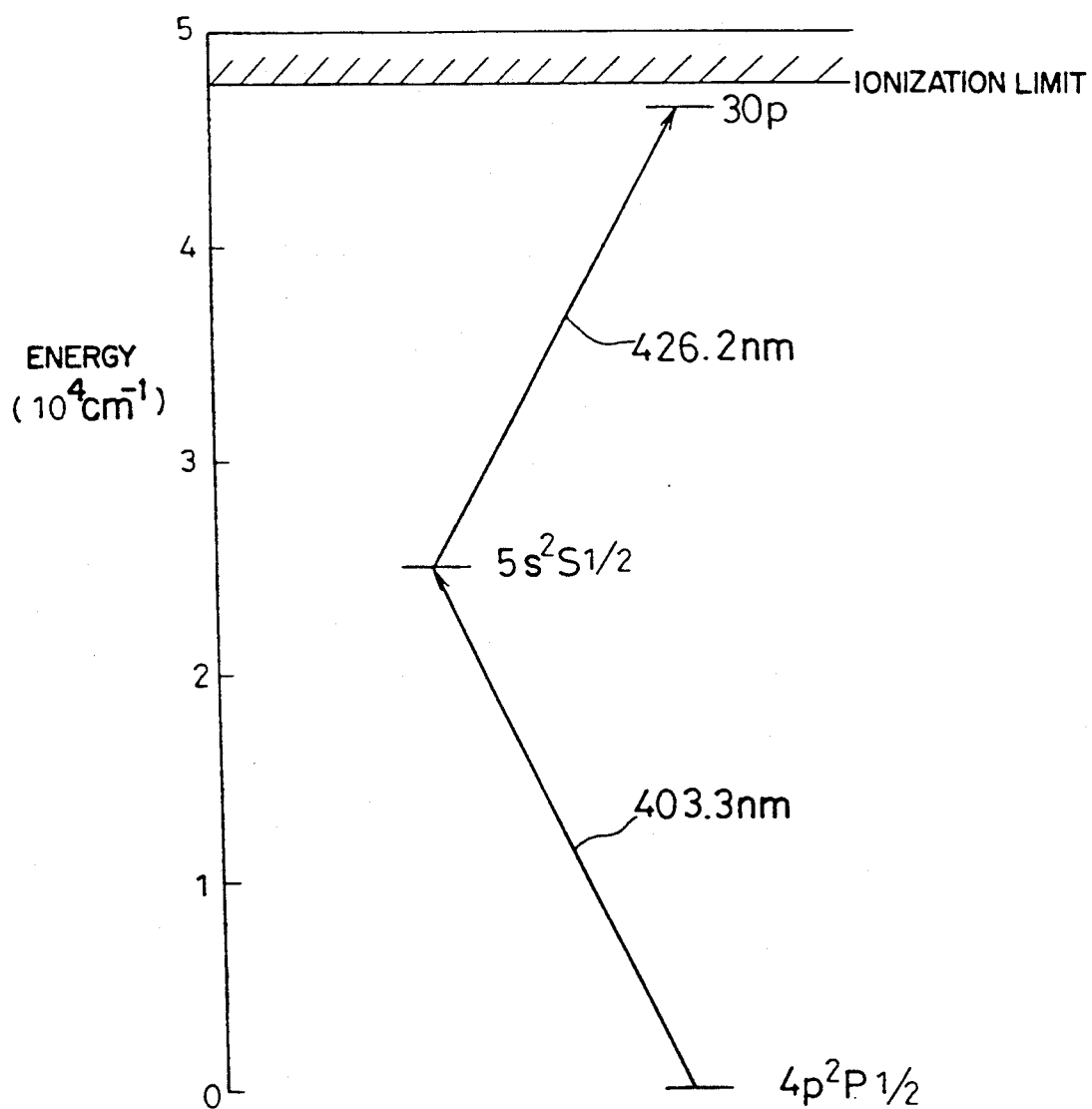
FIG. 17 is a view illustrating an energy level diagram of a Ga atom in which one example of the Ga atom in the Rydberg state is illustrated.

FIG. 17 is a graph illustrating an energy level diagram of the Ga atom in which one example of Ga atoms in the Rydberg state is illustrated. Ga atoms in the second particle flow 106 irradiated with the laser beam are excited from a ground state of $4p\ ^2P_{\frac{1}{2}}$ to a state of $5s\ ^2S_{\frac{1}{2}}$ by the laser beam $\lambda_1$ with a wavelength of 403.3 nm and then to the Rydberg state of $30p$ in which the principal quantum number of a valence electron is 30 by the laser beam $\lambda_2$ with a wavelength of 426.2 nm.

Because Einstein's A coefficient of $4\ ^2P_{\frac{1}{2}} - 5s\ ^2S_{\frac{1}{2}}$ transition (a transition wavelength is 403.3 nm) of Ga is approximately $10^8 (1/s)$, if a power density of the laser beam $\lambda_1$ with the wavelength of 403.3 nm is approximately 10 W/cm² or more, excitation from the ground state to $5s\ ^2S_{\frac{1}{2}}$ state of the Ga atom is saturated. Because an absorption cross section of the excited beam when the Ga atoms are excited from the $5s\ ^2S_{\frac{1}{2}}$ to the Rydberg state of np changes in accordance with a value of the principal quantum number n in the Rydberg state, it is in inverse proportion to the third power of n. Because the absorption cross section is approximately $10^{-16}$ cm² in the case of $5s\ ^2S_{\frac{1}{2}} - 30p$ transition (a transition wavelength is 426.2 nm) when n=30, if the power density of the laser beam $\lambda_2$ with he wavelength of 426.2 nm is approximately $10^5$ W/cm or more, excitation from the state of $5s\ ^2S_{\frac{1}{2}}$ to the state of $30p$ of the Ga atoms is saturated.

As described above, if the power density of the pulse dye laser beam with two wavelengths from the laser beam generator 108 is $10^5$ W/cm$^2$ or more, the Ga atoms are excited from the ground state to the Rydberg state of 30p, with the result that Ga atoms in the Rydberg state can be effectively generated.

According to R. F. Stebbings, et al., in "Rydberg States of Atoms and Molecules," published by Cambridge University Press, London, 1983, the nature of any atom or molecule in the highly excited state (Rydberg state) in which the principal quantum number of a valence electron is large is mostly determined by the principal quantum number (n), which means that atoms in the Rydberg state having the same principal quantum number (n) have the same nature. Therefore, the laser output required to excite the atoms or molecules in the particle flow from the second particle flow generator 104 into the Rydberg state in which n=30 is approximately $10^5$ W/cm.

Features of atoms or molecules in the Rydberg state except for the features described above are that their lifetime is long and a binding energy of the valence electrons is small. The lifetime of the Rydberg state becomes long in proportion to the third power of n and when n=30, the lifetime is approximately 40 μs. The binding energy of the valence electrons becomes small in inverse proportion to about the second power of n and when n=30, the binding energy is approximately 20 meV.

Therefore, the atoms or molecules once excited into the Rydberg state by the laser beam flow downstream as it is. As a result, atoms or molecules excited into the Rydberg state in the upstream of the cross region 107 also flow in the cross region 107.

Since the atom or molecule in the Rydberg state has a small binding energy with the valence electron, the valence electron is easily detached due to collision of another atom or molecule and the valence electron can be easily exchanged for an electron on the atom or molecule. Especially, when the valence electron collides with a polyatomic molecule, the exchange of electrons resonantly occurs because the binding energy of the valence electron is almost the same as an excitation energy for rotation or oscillation of the polyatomic molecule, with the result that a collision cross section becomes remarkably large.

Figure 18:
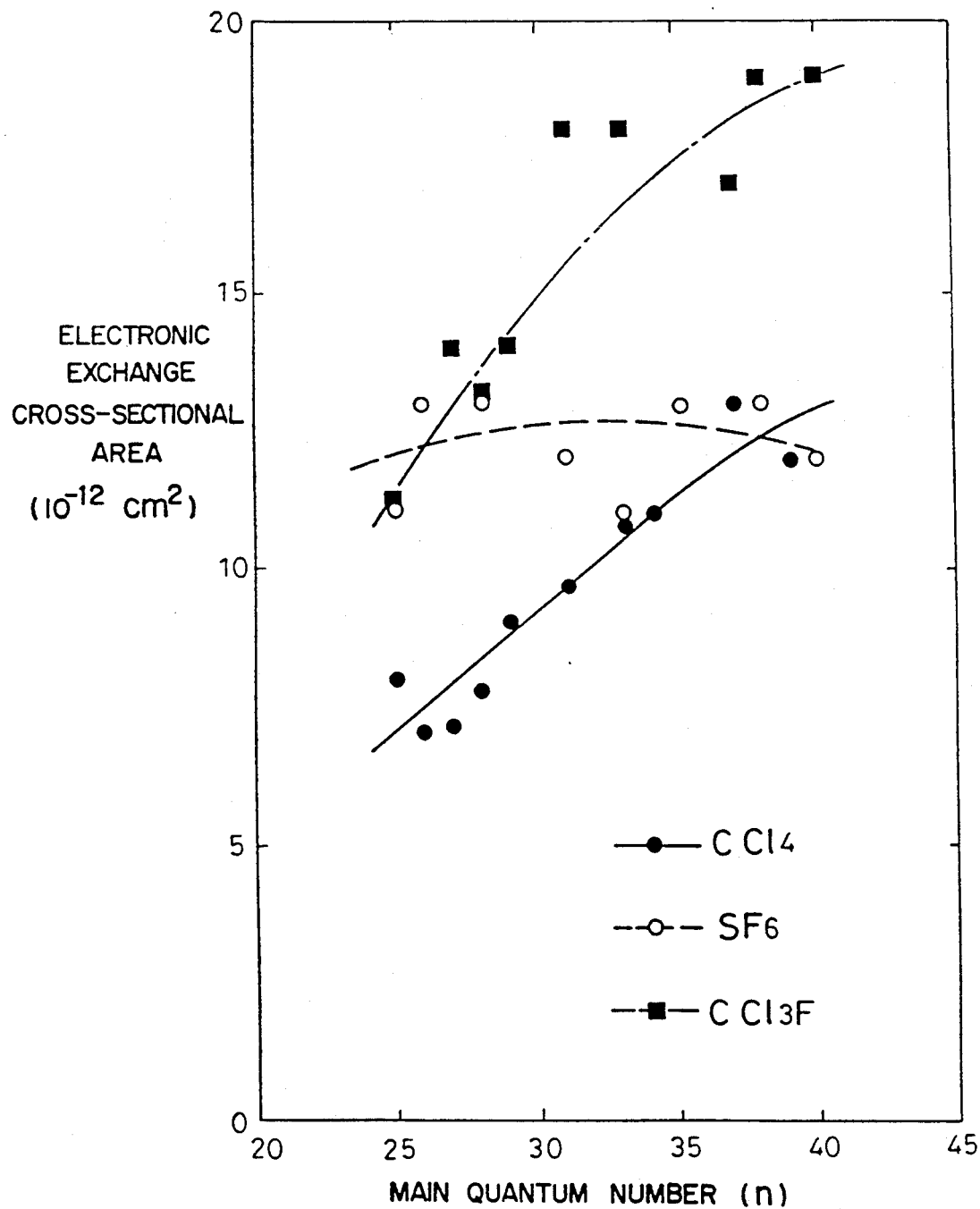
FIG. 18 is a view illustrating a cross section of an electron exchange when Xe in the Rydberg state collides with $SF_6$, $CCl_4$ and $CCl_3F$.

FIG. 18 illustrates an electronic exchange cross section when Xe (xenon) Xe** in the Rydberg state in which the principal quantum number is n collides with a polyatomic molecule of SF$_6$, CCl$_4$ or CCl$_3$F. Reaction formulae at this time are as follows.

$$Xe^{**} + SF_6 \rightarrow Xe^+ + SF_6^-$$

$$Xe^{**} + CCl_4 \rightarrow Xe^+ + CCl_3 + Cl^-$$

$$Xe^{**} + CCl_3F \rightarrow Xe^+ + CCl_2F + Cl^-$$

When CCl$_4$ and Ca$_3$F collide with Xe in the Rydberg state, CCl$_4^-$ and CCl$_3$F$^-$ are transiently generated but they are immediately dissolved and CCl$_3$ and Cl$^-$, and CCl$_2$F$_1$ and Cl$^-$ are generated. As illustrated in FIG. 18, the electronic exchange cross section of the atom or molecule in the Rydberg state is approximately $10^{-11}$ cm$^2$ and it is found that this value is very large as compared with a fact that a bottom collision ionization cross section ranges from $10^{-14}$ to $10^{-19}$ cm$^2$. For example, the mean free path of the electronic exchange is approximately several mm when atoms in the Rydberg state pass through the SF$_6$ with a density of approximately $10^{-5}$ Torr, and then it is found that positive ions of the atoms in the Rydberg state and the negative ions of SF$_6^-$ are easily generated. As described above, the Ga atoms in the second particle flow 106 irradiated with the laser beam can be effectively excited into the Rydberg state and they spread around as Ga atomic flow in the Rydberg state. Then, they collide with SF$_6$ molecules in the first particle flow 103 in the cross region 107. At this time, the electronic exchange expressed by:

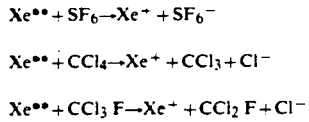

occurs and Ga$^+$ and SF$_6^-$ ions are effectively produced.

Since the electric field 116 is generated in the cross region 107 by a negative voltage applied from the power supply 115, Ga$^+$ and SF$_6^-$ are accelerated in opposite directions to each other. In addition, since electrons are not generated when the SF$_6^-$ ions are generated by collision with the atoms in the Rydberg state, the electric field 116 applied from the power supply 115 to the cross region 107 is used only for acceleration of ions, whereby ions can be effectively accelerated. Thus, SF$_6^-$ generated in the cross region 107 as described above are accelerated and drawn out through the outlet hole 114 of the electrode 113b as negative ion flow.

According to the fifth embodiment of the present invention, since specifies atoms or molecules can be ionized over a large range by using a small laser power density as compared with the conventional operation, ion flow with a large current can be obtained as compared with the conventional operation.

In addition, when the first particle flow 102 from the first particle flow generator 101 in accordance with the fifth embodiment includes CCl$_4$ or CCl$_3$F, Cl$^-$ ion flow can be generated without changing a wavelength of the laser beam form the laser beam generator 108. Similarly, if the first particle flow 102 includes SiH$_4$, SiH$_4^-$ ion flow can be generated. Therefore, ions of various atoms or molecules can be effectively generated using a laser beam with a certain wavelength if the first particle flow 102 includes the atoms or molecules to be ionized. Then, ion flow with high purity can be easily generated.

Figure 19:
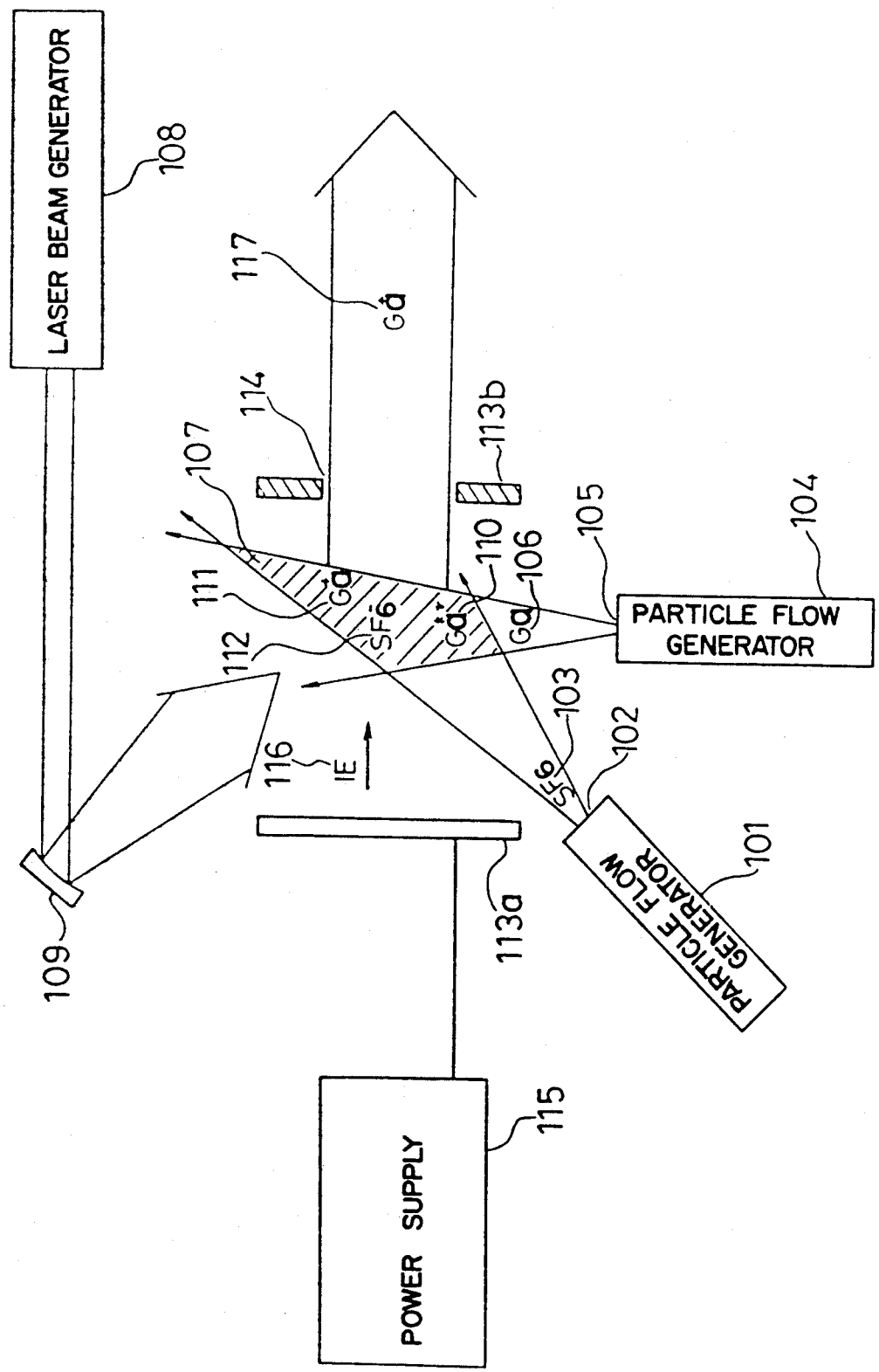
FIG. 19 is a view illustrating a positive ion flow generator in accordance with a sixth embodiment of the present invention.

FIG. 19 illustrates a sixth embodiment of the present invention in which the power supply 115 for generating a positive voltage is connected to the electrode 113a in order to generate Ga$^+$ ion flow.

In the sixth embodiment of the present invention, the Ga atoms and the SF$_6$ molecules in the Rydberg state collide with each other in the cross region 107 and Ga$^+$ and SF$_6^-$ ions are effectively generated and Ga$^+$ ions are drawn out through the electrode 113b by a positive voltage applied from the power supply 115.

Although the Ga ion flow is generated in the sixth embodiment, since the nature of the Rydberg state of an atom or molecule is determined by its principal quantum number n in the excited state, any atom or molecule can be similarly generated as ion flow. When ion flow of In (indium) is generated, In is put in the crucible 104a in the second particle flow generator 104 and particle flow 106 of In can be similarly generated as an ion beam when a wavelength $\lambda_1$ of the dye laser 109a in the laser beam generator 109 is set at 410.3 nm which is a transition wavelength of In from the ground state to the excited state of 6s and a wavelength $\lambda_2$ of the dye laser 109b is set at a transition wavelength in the case of 6s - np transition, which is shorter than 454 nm.

Although a description has been given for the generation of the ion flow of atoms or molecules in the above fifth and sixth embodiments, it is needless to say that ion flow containing many specific isotopes may be generated in such a manner that at least one wavelength band width of the laser beam which excites atoms into the Rydberg state is reduced so that isotropic uranium $^{235}U$ (uranium 235) is selectively ionized from U (uranium).

In addition, although Ga is excited from the ground state to the Rydberg state through an intermediate state by the laser beam generated from the laser beam generator 108 as a pulse beam in the fifth embodiment of the present invention, when atoms or molecules are excited into the Rydberg state by using a continuously oscillating laser beam, their lifetime in the Rydberg state is as long as several 10 μs, whereby excitation into the Rydberg state and its accumulation are gradually implemented even by a sufficiently small laser power density as compared with that in case of the pulse laser beam. For example, when Ga atoms are excited from the state of $5s\ ^2S_{\frac{1}{2}}$ to the state of $30p$, the transition thereof can be saturated by the power density of several 10 W/cm$^2$.

Therefore, when the atoms are excited into the Rydberg state by using the continuously oscillating laser beam, its required power density is several 10 W/cm$^2$. As a result, ion flow can be effectively generated using the laser with a low output as compared with the case where the pulse laser beams is used.

Although the laser beam 108e with two wavelengths is used in the above fifth and sixth embodiments, atoms or molecules may be directly excited from the ground state to the Rydberg state using one laser beam with a shorter wavelength or they may be excited from the ground state to the Rydberg state through a plurality of intermediate states using many different laser beams.

Figure 20:
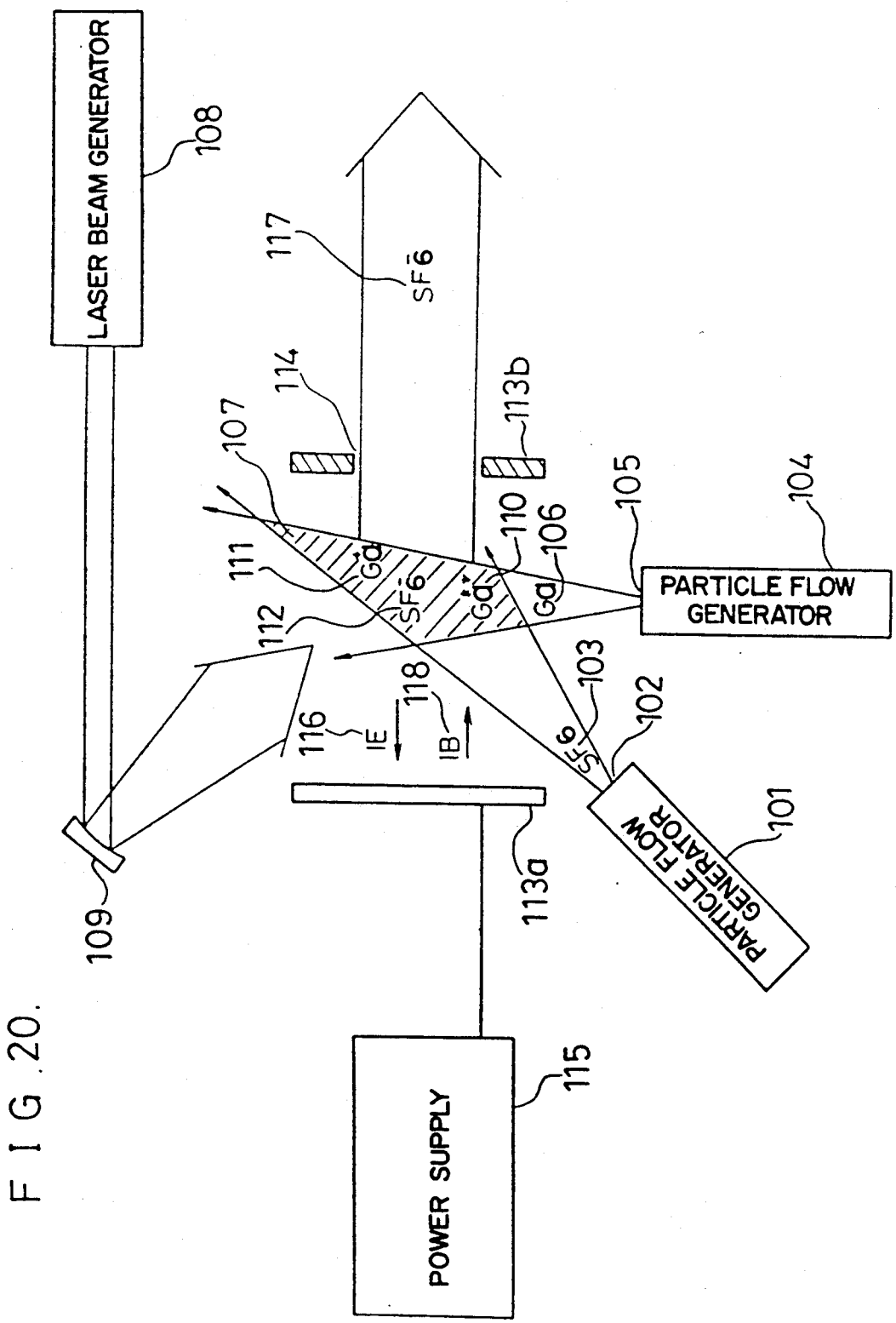
FIG. 20 is a view illustrating an ion flow generator when a magnetic field is applied almost in parallel to an electric field in accordance with a seventh embodiment of the present invention.

FIG. 20 illustrates a seventh embodiment in which, in contrast to the fifth embodiment of the present invention, a magnetic field |B 118 is applied in parallel to an electric field |E 116 generated by the electrodes 113a and 113b, whereby ions in the cross region 107 or accelerated ions into an outlet hole 114 are prevented from spreading.

As a method for applying the magnetic field |B in accordance with the seventh embodiment of the present invention, a coil may be arranged so as to surround the electrodes 113a and 113b to adjust an amount of current to the coil or a permanent magnet may be additionally provided.

In addition, although it is most preferable in the seventh embodiment of the present invention that the magnetic field |B applied between the electrodes 131a and 131b is set in parallel to the electric field |E, it is not necessarily in parallel to the electric field |E.

Figure 21:
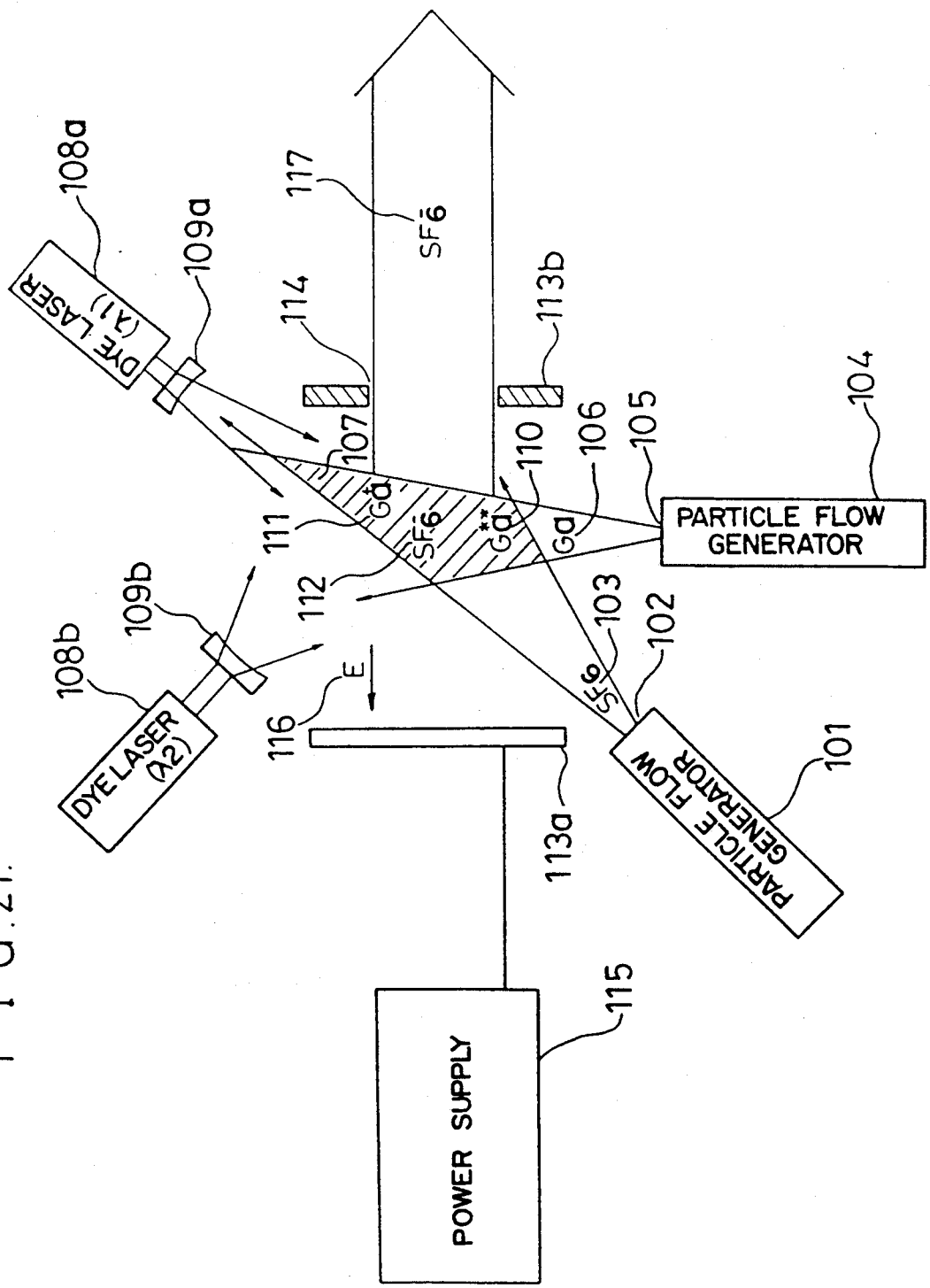
FIG. 21 is a view illustrating an ion flow generator when laser beams are irradiated at the same time to a cross region of particle flow in accordance with an eighth embodiment of the present invention.

FIG. 21 illustrates an eighth embodiment of the present invention in which the cross region 107b is irradiated with two kinds of laser beams at the same time instead of the laser beam having two different wavelengths on the same optical axis generated from the laser beam generator 108 in accordance with the fifth embodiment of the present invention. In FIG. 21, a laser beam with a wavelength of $\lambda_1$ from a dye laser 108a irradiates the cross region 107 using an optical adjuster 109a and similarly, a laser beam with a wavelength of $\lambda_2$ from a dye laser 108b irradiates the cross region 107 using an optical path adjuster 109b.

Figure 22:
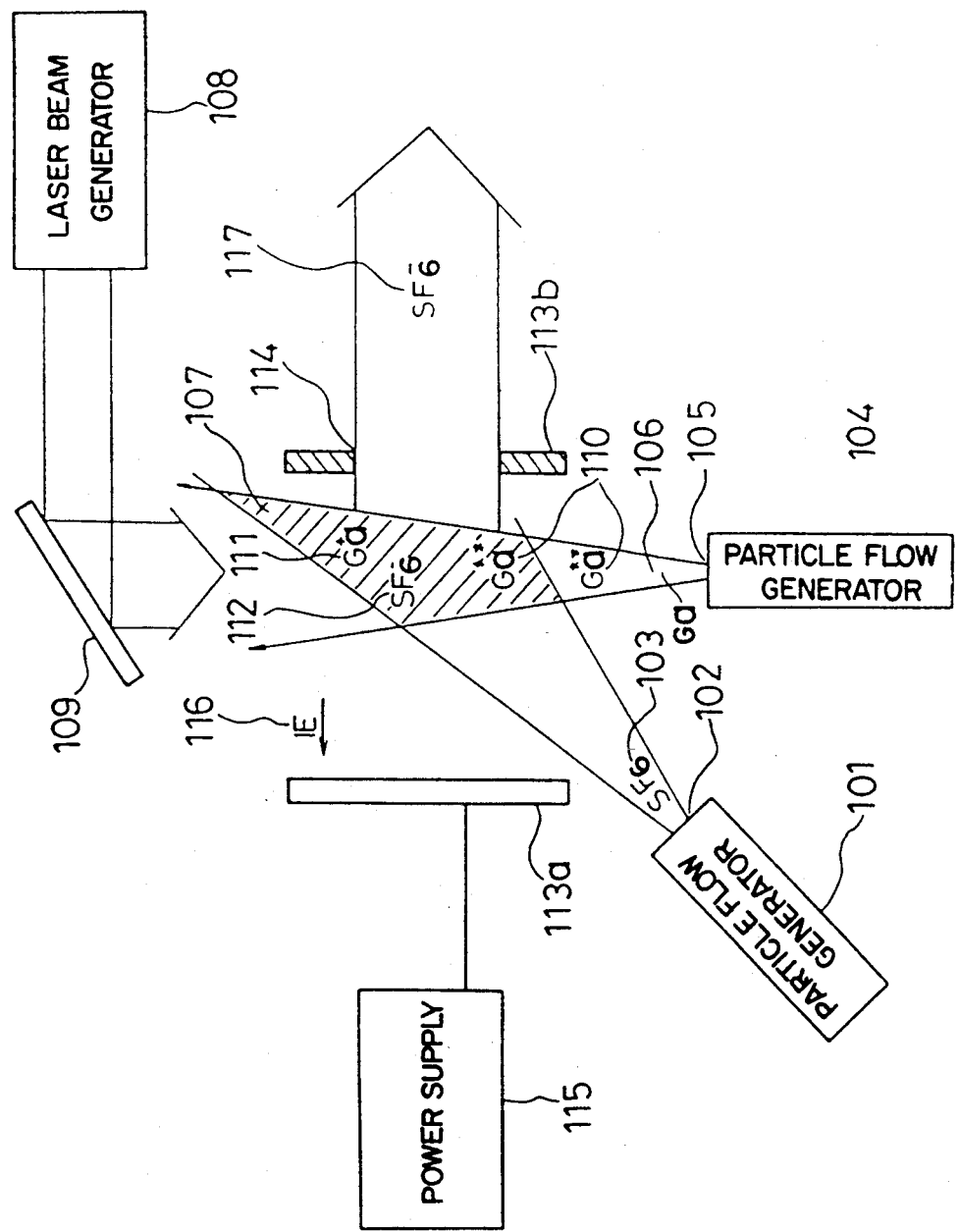
FIG. 22 is a view illustrating an ion flow generator when the laser beam is irradiated from an opposite direction on the same axis of particle flow from the particle flow generator in accordance with a ninth embodiment of the present invention.

FIG. 22 illustrates a ninth embodiment in contrast to the fifth embodiment of the present invention in which a laser beam from the laser beam generator 108 irradiates the axis of the particle flow 105 generated from the second particle flow generator 104 from an opposite direction of its flow.

According to the ninth embodiment of the present invention, specific atoms or molecules can be effectively excited into the Rydberg state over the whole region of the particle flow irradiated with the laser beam. In addition, since the lifetime of the Rydberg state is several 10 μs or more, the atoms or molecules once excited into the Rydberg state by the laser beam are as it is for several 10 μs or more, so that they flow as particle flow in the Rydberg state for several 10 μs or more.

Therefore, positive ions and negative ions are generated by collision in the cross region 107 for several 10 μs without the laser beam irradiation, with the result that ions can be effectively generated as compared with the fifth embodiment of the present invention.

Figure 23:
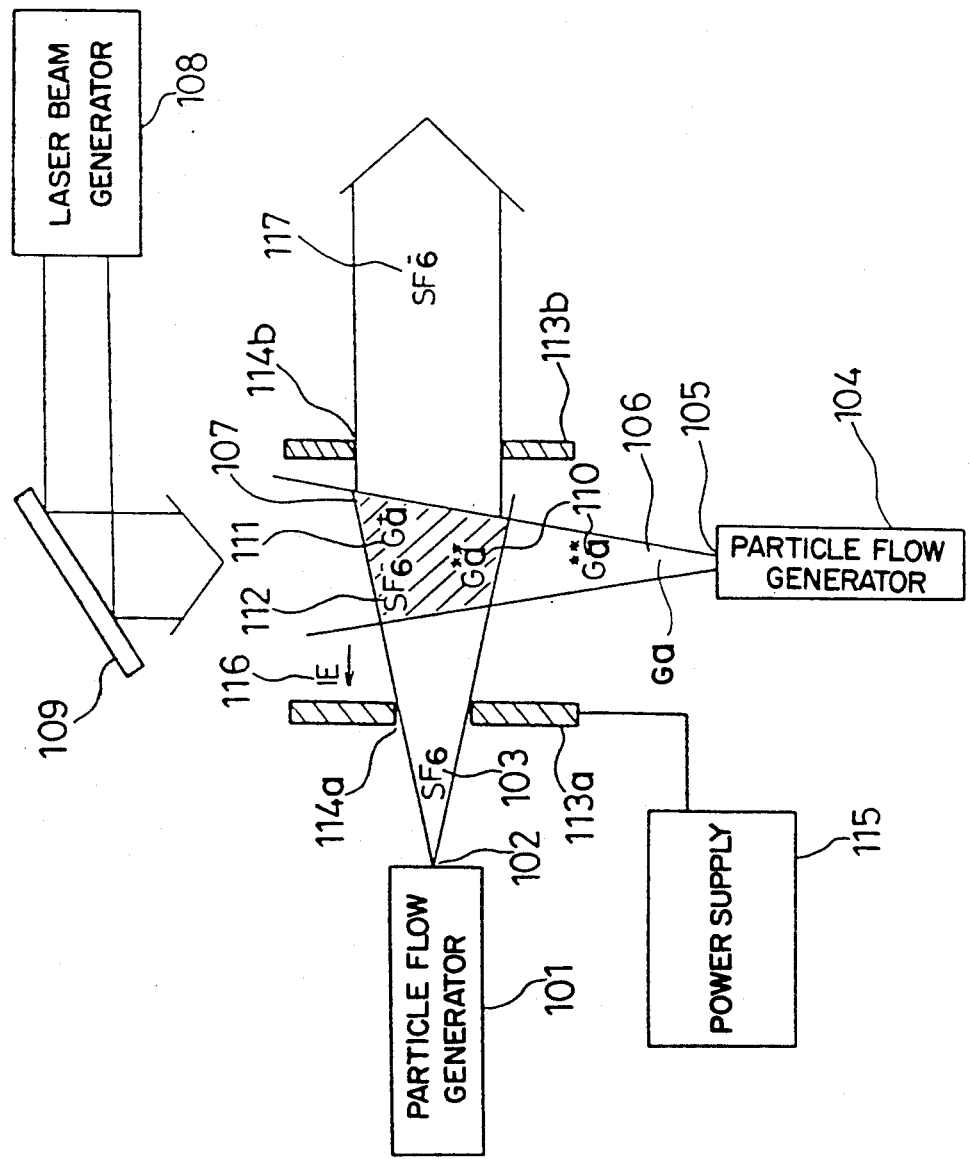
FIG. 23 is a view illustrating an ion flow generator when particle flow is introduced between electrodes through a hole on an electrode in accordance with a tenth embodiment of the present invention.

FIG. 23 illustrates a tenth embodiment in contrast to the fifth embodiment of the present invention, in which the electrode 113a has a hole 114a through which the particle flow 103 from the first particle flow generator 101 flows in almost parallel to the electric field 116.

According to the tenth embodiment of the present invention, since the cross region 107 can be almost symmetrical bout the axis of the ion flow, the ion flow can be uniformly drawn out.

Figure 24:
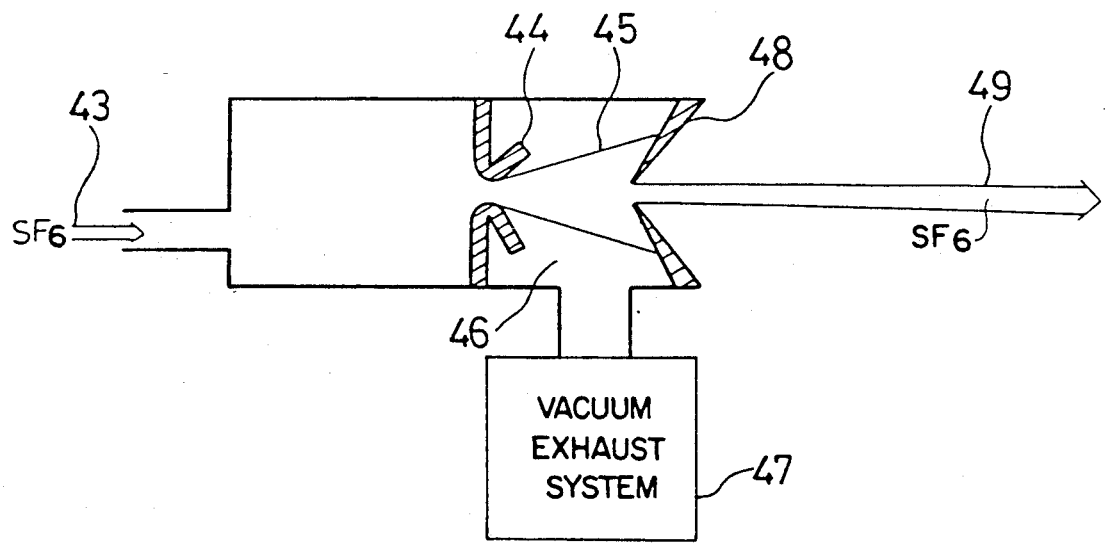
FIG. 24 is a view illustrating a supersonic nozzle beam generator as a particle flow generator.

FIG. 24 illustrates a supersonic nozzle beam as another example of the particle flow generator, used in the fifth to tenth embodiments of the present invention. In FIG. 24, reference numeral 43 designates a material supplied from a gas bomb or a crucible, which is SF$_6$ in this example. The material 43 is jetted into a vacuum chamber 46 as a free jet 45 through a nozzle 44. Pressure in the vacuum chamber 46 is kept constant by an evacuation system 47. A part of the free jet in the vacuum chamber 46 is blown out by a skimmer 48 and becomes a supersonic nozzle beam 49. Since the supersonic nozzle beam is uniform particle flow having the same speed, uniform excitation and ionization by the laser beam can be expected.

Figure 25:
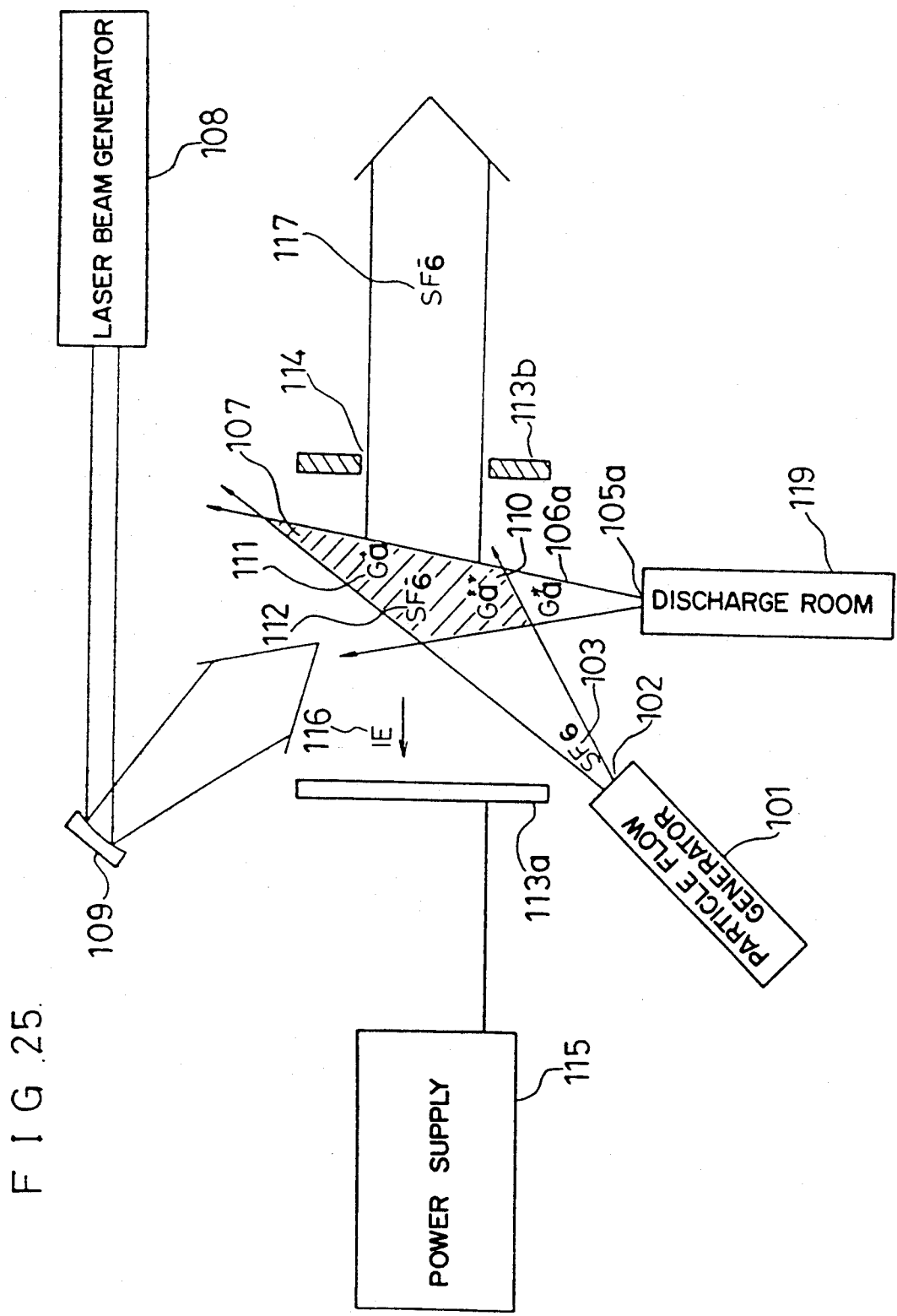
FIG. 25 is a view illustrating an ion flow generator in accordance with an eleventh embodiment of the present invention.

FIG. 25 illustrates an ion flow generator in accordance with an eleventh embodiment of the present invention, in which a discharge chamber 119 is provided instead of the second particle flow generator 104 in accordance with the fifth embodiment of the present invention, whereby a various ion flow can be generated in only a visible region by the laser beam generator 108.

In FIG. 25, reference numeral 119 designates a discharge chamber for generating atoms or molecules to be excited into the Rydberg state in the form of particle flow in an excited state and reference numeral 106a designates particle flow in the excited state drawn out in the form of a beam from the exhaust nozzle 105a of the discharge chamber 119, which is atomic flow of Ga in the excited state in this embodiment.

Figure 26:
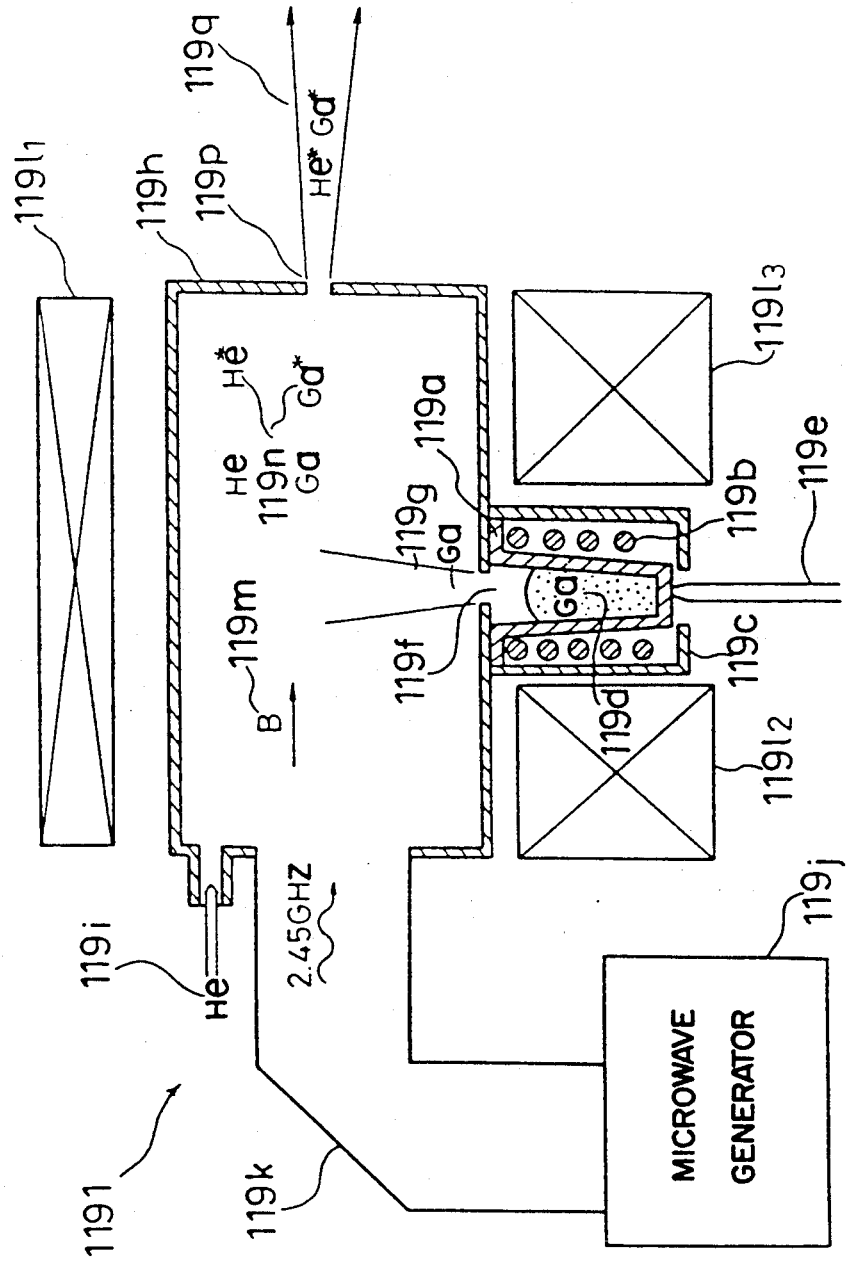
FIG. 26 is a view illustrating one example of a discharge chamber used in the eleventh embodiment of the present invention in FIG. 25.

The discharge chamber 119 used in the eleventh embodiment is constituted as illustrated in FIG. 26 and generates particle flow of atoms or molecules which are in a solid state at room temperature. In FIG. 26, reference numeral 119a designates a crucible, reference numeral 119b designates a heater wound around the crucible 119a, reference numeral 119c designates a heat shielding plate for preventing heat of the heater 119b from escaping and reference numeral 119d designates a material for generating a particle flow in the crucible 119a, which is Ga in this example. Reference numeral 119e designates a temperature gauge arranged so as to be in contact with a lower part of the crucible 119a, reference numeral 119f designates an opening of the crucible 119a and reference numeral 119g designates a particle flow jetted from the opening 119f, which includes Ga atoms in this example.

Reference numeral 119h designates a container into which the particle flow 119g flows and reference numeral 119i designates a material, which is in a gas state at room temperature, to be introduced in the container 119h, which is He (helium) in this example in order to increase ionization efficiency. For this purpose, atoms having a metastable state, for example Xe (xenon), may be also used. Reference numeral 119j designates a microwave generator, which oscillates at 2.45 Hz as a center frequency in this example. Reference numeral 119k designates a waveguide for introducing a microwave from the microwave generator 119j into the container 119h, reference numerals $1191_1$, $1191_2$ and $1191_3$ designate coils arranged around the container 119h and reference numeral 119n designates a magnetic field generated by the coils. Reference numeral 119n designates a particle in the excited state in plasma generated by the microwave in the container 119h, which are Ga (Ga*) in the excited state and He (He*) in the excited state in this example. Reference numeral 119p designates an opening in the container 119h, reference numeral 119q designates particle flow in the excited state jetted from the opening 119p, which is atomic flow in the excited state of Ga and He in this example.

According to the ion flow genera&:or in accordance with the eleventh embodiment of the present invention, when, for example negative ion flow of $SF_6^-$ is generated, the particle flow generator illustrated in FIG. 15 is used as the first particle flow generator 101 and a gas bomb filled with $SF_6$ is used as the container 101a and then a predetermined amount of flow of $SF_6$ with a predetermined pressure is jetted through the opening 101d as $SF_6$ molecular flow by using the pressure reducing valve 101b and flow regulator 101c. This $SF_6$ molecular flow passes through the exhaust nozzle 102 illustrated in FIG. 25 and then spreads and reaches the cross region 107. Meanwhile, Ga is put in the crucible 119a in the discharge chamber 119 illustrated in FIG. 26 and a temperature of the crucible 119a is increased by the heater 119b to which a current is applied from outside. Then, the temperature of the crucible 119a is kept constant by using the indication of the temperature gauge 119e. The material Ga 119d in the crucible 119a is vaporized as the temperature of the crucible is increased and flows in the container 119h from the opening 1119 as Ga atomic flow. The material He 119i which is used to stabilize the discharge, flows in the container 119h and a certain constant pressure is maintained in the container.

The microwave from the microwave generator 119j is applied to the Ga atoms and the He atoms in the container 119a through the waveguide 119k to ionize the Ga atoms and the He atoms. Efficiency of microwave discharge is increased when the magnetic field 119m is also applied with coils $1191_1$, $1191_2$ and $1191_3$ arranged around the container 119a. Especially, when the intensity of the magnetic field is 875 Gauss, and ECR (Electron Cyclotron Resonance) condition with an oscillation frequency 2.45 GHz of the microwave is satisfied, so that the discharge is more effectively performed and the Ga atoms and the He atoms are excited to the excited state or ionized. Thus, particles in the excited state generated in the container 119h are jetted from the opening 119p and then spread around through the exhaust nozzle 105a illustrated in FIG. 25 and reach the cross region 107.

Meanwhile, using the optical adjuster 109, the particle flow 106a in the excited state in the cross region or in the upstream of the cross region 107 is irradiated with the pulse laser beam with a wavelength of 426.2 nm generated from a pulse dye laser apparatus with a wavelength of 426.2 nm as the laser beam generator 108.

Figure 27:
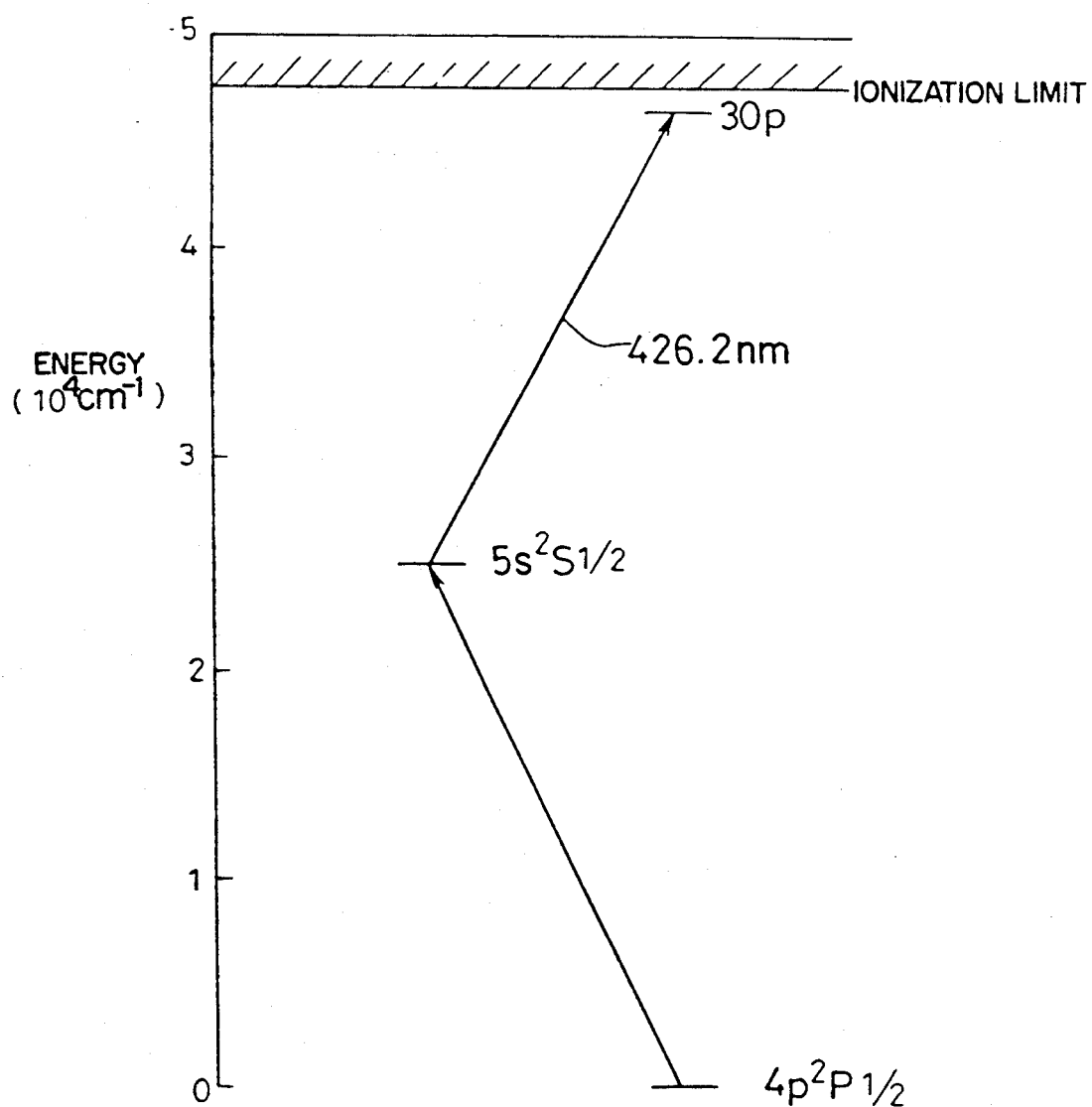
FIG. 27 is a view illustrating an energy level diagram of a Ga atom in which one example of the Ga atom in the Rydberg state is illustrated.

FIG. 27 is a graph illustrating an energy level diagram of the Ga atom, in which one example of the Ga atom which are partially in the Rydberg state is illustrated. Since the Ga atoms in the particle flow 106a in the excited state jetted from the discharge chamber 119 have already excited into the state of 5s $^2S_{\frac{1}{2}}$, they are excited into the Rydberg state in which the principal quantum number of the valence electron of 30p is 30 by the laser beam with a wavelength of 426.2 nm.

The absorption cross section of the beam for excitation of the Ga atoms from the state of 5s $^2S_{\frac{1}{2}}$ to the Rydberg state of np state changes in accordance with a value of the principal quantum number n of the Rydberg state, which is almost in inverse proportion to the third power of n. In the case of 5s $^2S_{\frac{1}{2}}$ – 30p transition (a transition wavelength is 426.2 nm) when n=30, the absorption cross section is approximately $10^{-16}$ cm$^2$. Then, if the power density of the laser beam $\lambda_2$ with a wavelength of 426.2 nm is approximately $10^5$ W/cm$^2$ or more, excitation from 5s $^2S_{\frac{1}{2}}$ to 30p state of the Ga atoms is saturated.

As described above, if the power density of the laser beam from the laser beam generator 108 is $10^5$ W/cm$^2$, or more, the Ga atoms are excited from the excited state to the Rydberg state of 30p, with the result that the Ga atoms in the Rydberg state can be effectively generated.

When Xe (xenon) Xe* in the Rydberg stage in which the principal quantum number is n collides with polyatomic molecules of $SF_6$, $CCl_4$ and $CCl_3F$, reaction formulas are as follows:

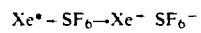

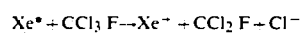

When $CCl_4$ and $Cl_3F$ collide with Xe in the Rydberg state, $CCl_4^-$ and $CCl_3F^-$ are transiently generated but they are immediately dissolved so that $CCl_3$ and $Cl^-$, and $CCl_2F$ and $Cl^-$ are generated. An electronic exchange cross section of an atom or a molecule in the Rydberg state in this case is, as illustrated in FIG. 18, approximately $10^{-11}$ cm$^2$ and it is found that this value is very large as compared with a fact that a normal collision ionization cross section ranges from $10^{-14}$ to $10^{-19}$ cm$^2$. For example, the mean free path of the electron exchange is approximately several mm when atoms in the Rydberg state pass through the $SF_6$ with a density of approximately $10^{-5}$ Torr, and then it is found that positive ions of the atoms in the Rydberg state and the negative ions of $SF_6^-$ are easily generated. As described above, the Ga atoms in particle flow in the excited state irradiated with the laser beam can be effectively excited into the Rydberg state and the Ga atoms spread around as Ga atomic flow in the Rydberg state. Then, the Ga atoms collide with $SF_6$ molecules in the first particle flow 103 in the cross region 107. At this time, the exchange expressed by:

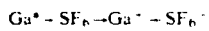

occurs and $Ga^-$ and $SF_6^-$ ions are effectively produced in the cross region 107.

Since the electric field 116 is generated in the cross region 107 by a negative voltage applied from the power supply 115, $Ga^-$ and $SF_6^-$ are accelerated in the opposite directions to each other. In addition since electrons are not generated when the $SF_6^-$ ions are generated by collision with the atoms in the Rydberg state, the electric field 116 applied from the power supply 115 to the cross region 107 is used only for acceleration of ions, whereby ions can be effectively accelerated. Thus, $SF_6^-$ generated in the cross region 107 as described above are accelerated and drawn out through the outlet hole 114 of the electrode 113b as negative ion flow.

According to the eleventh embodiment of the present invention, since specific atoms or molecules can be ionized over a large range by using the laser beam in a visible region with a small laser power density as compared with the conventional operations, ion flow with a larger current than ion flow in conventional operations is obtained.

In addition, when the first particle flow 102 from the particle flow generator 101 in accordance with the eleventh embodiment of the present invention includes $CCl_4$ or $CCl_3F$, $Cl^-$ ion flow can be generated without changing a wavelength of the laser beam from the laser beam generator 108. Similarly, if the first particle flow 102 includes $SiH_4$, $SiH_4^-$ ion flow can be generated. Therefore, ions of various atoms or molecules can be effectively generated using a laser beam with a certain wavelength in the visible region, if the first particle flow 102 includes the atoms or molecules to be ionized. Then, ion flow with high purity can be easily generated.

Figure 28:
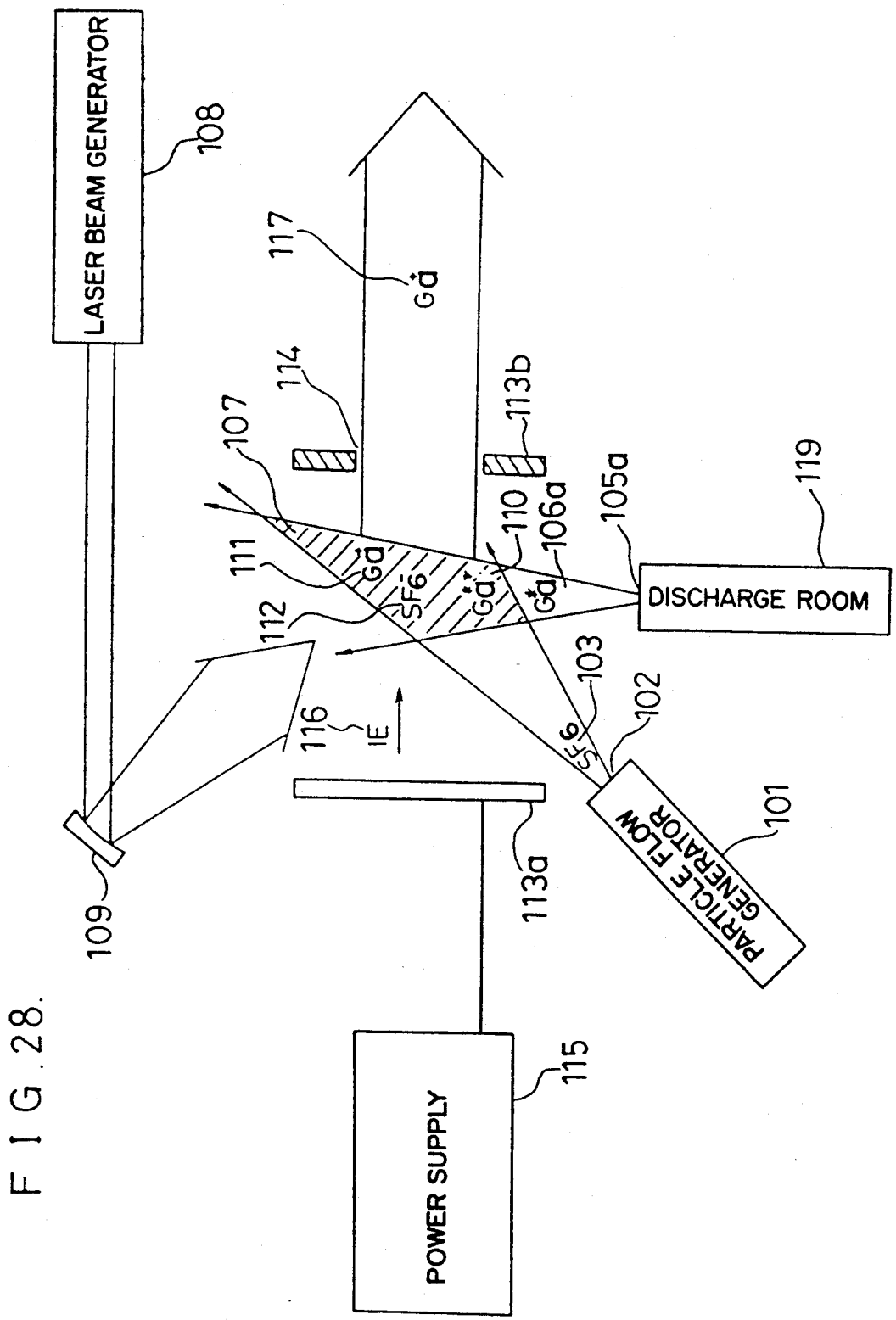
FIG. 28 is a view illustrating a positive ion flow generator in accordance with a twelfth embodiment of the present invention.

Alternatively, according to a twelfth embodiment of the present invention in FIG. 28, the power supply 115 generating a positive voltage for generating a $GA^+$ ion flow may be connected to the electrode 113a.

According to the twelfth embodiment of the present invention, the Ga atoms and the $SF_6$ molecules in the Rydberg state collide with each other in the cross region 107 and then $Ga^+$ and $SF_6^-$ ions are effectively generated and $Ga^+$ ions are drawn out through the electrode 113b by a positive voltage applied from the power supply 115.

Although the Ga ion flow is generated in the twelfth embodiment of the present invention, since the nature of the Rydberg state of an atom or a molecule is determined by its principal quantum number n in the excited state, any atom or molecule can be similarly generated as ion flow. When ion flow of In (indium) is generated, In is put in the crucible 119a in the discharge chamber 119 illustrated in FIG. 26 and then particle flow of In is jetted to the container 119h in the discharge chamber 119, whereby the particle flow 106a of In in the excited state of 6s is jetted from the exhaust nozzle 105a illustrated in FIG. 28. In addition, when the laser wavelength from the laser beam generator 108 is set at a transition wavelength of 6s−np transition shorter than 454 nm, an ion beam can be similarly generated.

Although the ion flow of a material which is in a solid state at room temperature is generated as the particle flow in the Rydberg state in accordance with the above eleventh and twelfth embodiments, when the ion flow of a material which is in a gas state at room temperature is generated, the material in the gas state is directly introduced into the container 119h illustrated in FIG. 26 and then discharge is performed. As described above, the ion flow can be also utilized as the particle flow in the excited state.

Although a description was given of generation of the ion flow of atoms or molecules in the above eleventh and twelfth embodiments, it is needless to say that ion flow containing many specific isotopes may be generated in such a manner that at least one wavelength band width of the laser beam which excites atoms into the Rydberg state is reduced and isotropic uranium $^{235}U$ (uranium 235) is selectively ionized from U (uranium).

In addition, although Ga is excited from the excited state to the Rydberg state using the laser beam from the laser beam generator 108 as a pulse beam in the eleventh embodiment of the present invention, when atoms or molecules are excited into the Rydberg state by using a continuously oscillating laser beam, the lifetime in the Rydberg state is as long as several 10 μs, whereby excitation into the Rydberg state and its accumulation are gradually implemented even by a sufficiently small laser power density as compared with the case of the pulse laser beam. For example, when Ga atoms are excited from the state of $5s\ ^2S_{\frac{1}{2}}$ to the state of $30p$, the transition thereof can be saturated by the power density of several 10 W/cm².

Therefore, when the atoms are excited into the Rydberg state by using the continuously oscillating laser beam, its required power density is several 10 W/cm². As a result, ion flow can be effectively generated using the laser with a low output as compared with the case where the pulse laser beams is used.

Although the laser beam with one wavelength is used in the above eleventh and twelfth embodiments of the present invention, atoms or molecules may be excited from the excited state to the Rydberg state through a plurality of intermediate states by using a plurality of laser beams with longer wavelengths, and for this purpose, for example the laser beam generator 108 illustrated in FIG. 14 which generates the laser beam with two different kinds of wavelengths on the same axis may be used.

Figure 29:
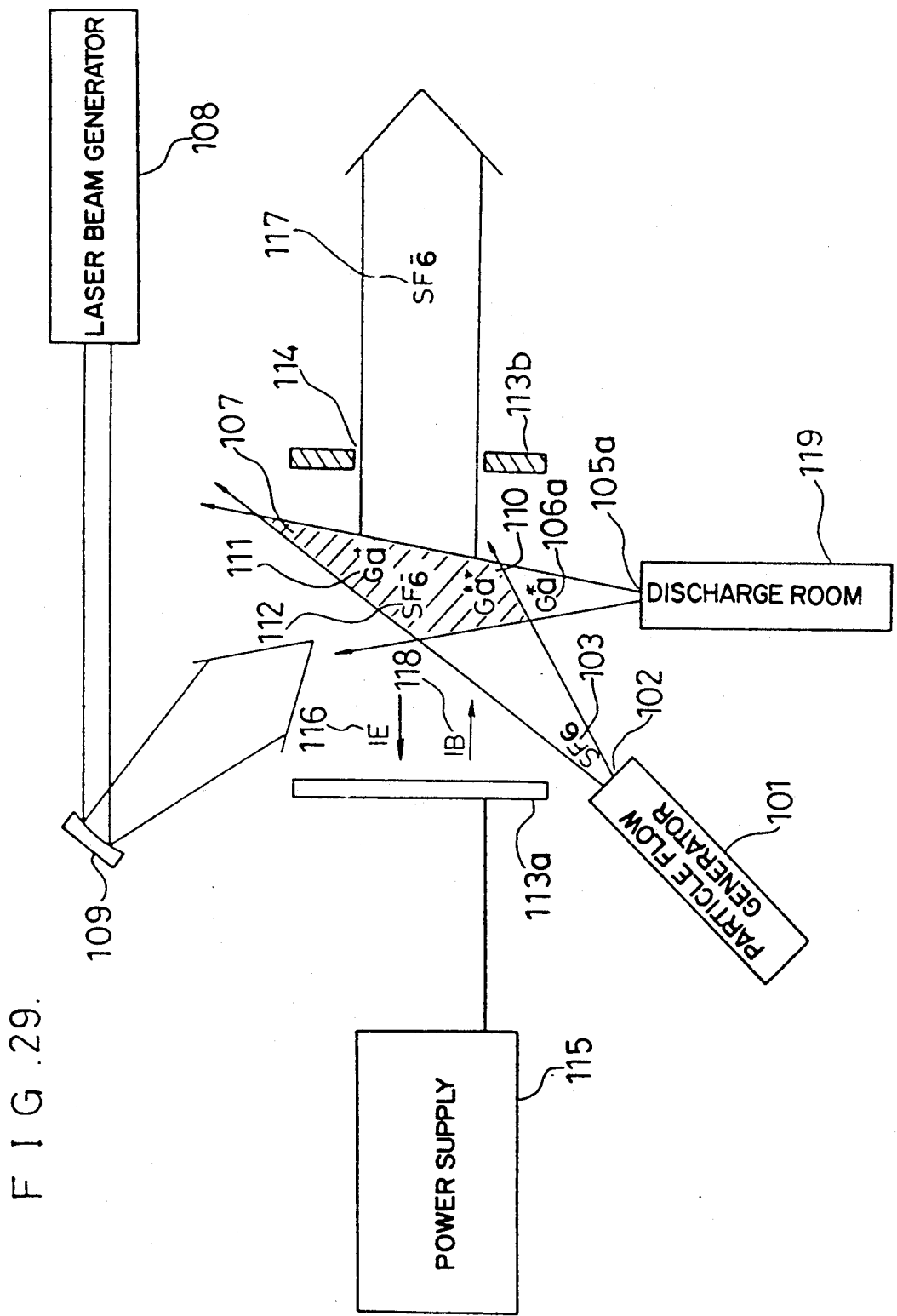
FIG. 29 is a view illustrating an ion flow generator when a magnetic field is applied almost in parallel to an electric field in accordance with a thirteenth embodiment of the present invention.

According to a thirteenth embodiment of the present invention in FIG. 29, the magnetic field |B 118 is applied to the electrodes 113a and 113b in parallel to the electric field |E 116 to prevent ions in the cross region 107 or ions accelerated toward the outlet hole from spreading.

Figure 30:
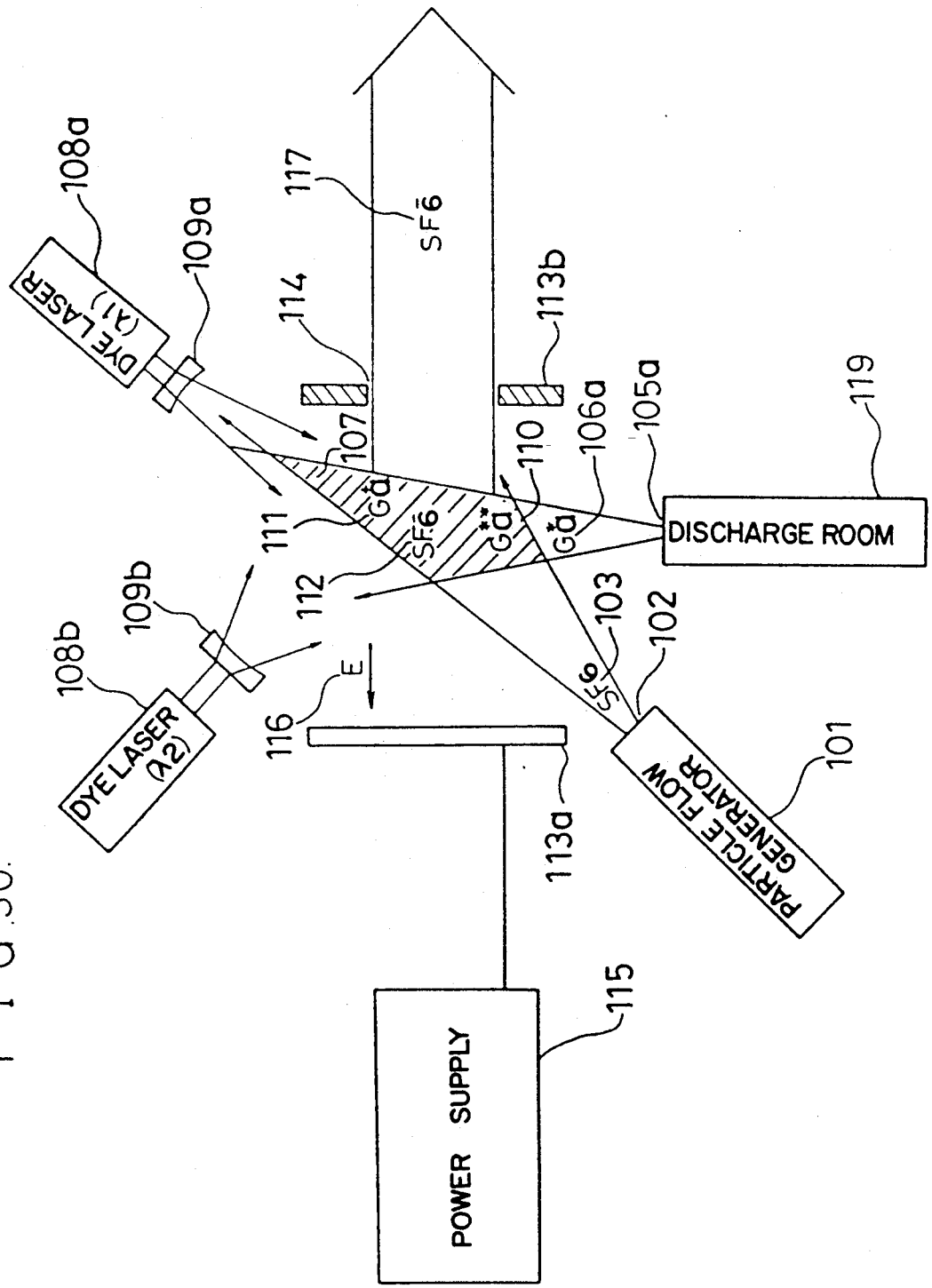
FIG. 30 is a view illustrating an ion flow generator when laser beams are irradiated at the same time to a cross region of particle flow in accordance with a fourteenth embodiment of the present invention.

FIG. 30 illustrates a fourteenth embodiment of the present invention in which two kinds of laser beams irradiate the cross region 107 at the same time instead of the laser beam having two different wavelengths on the same optical axis generated from the laser beam generator 108 in accordance with the eleventh embodiment of the present invention in FIG. 25.

In the fourteenth embodiment, the laser beam with a wavelength of $\lambda_1$, from the dye laser 108a irradiates the cross region 107 using the optical path adjuster 109a and similarly, the laser beam with a wavelength of $\lambda_2$ from the dye laser 108b irradiates the cross region 107 using the optical adjuster 109b.

Figure 31:
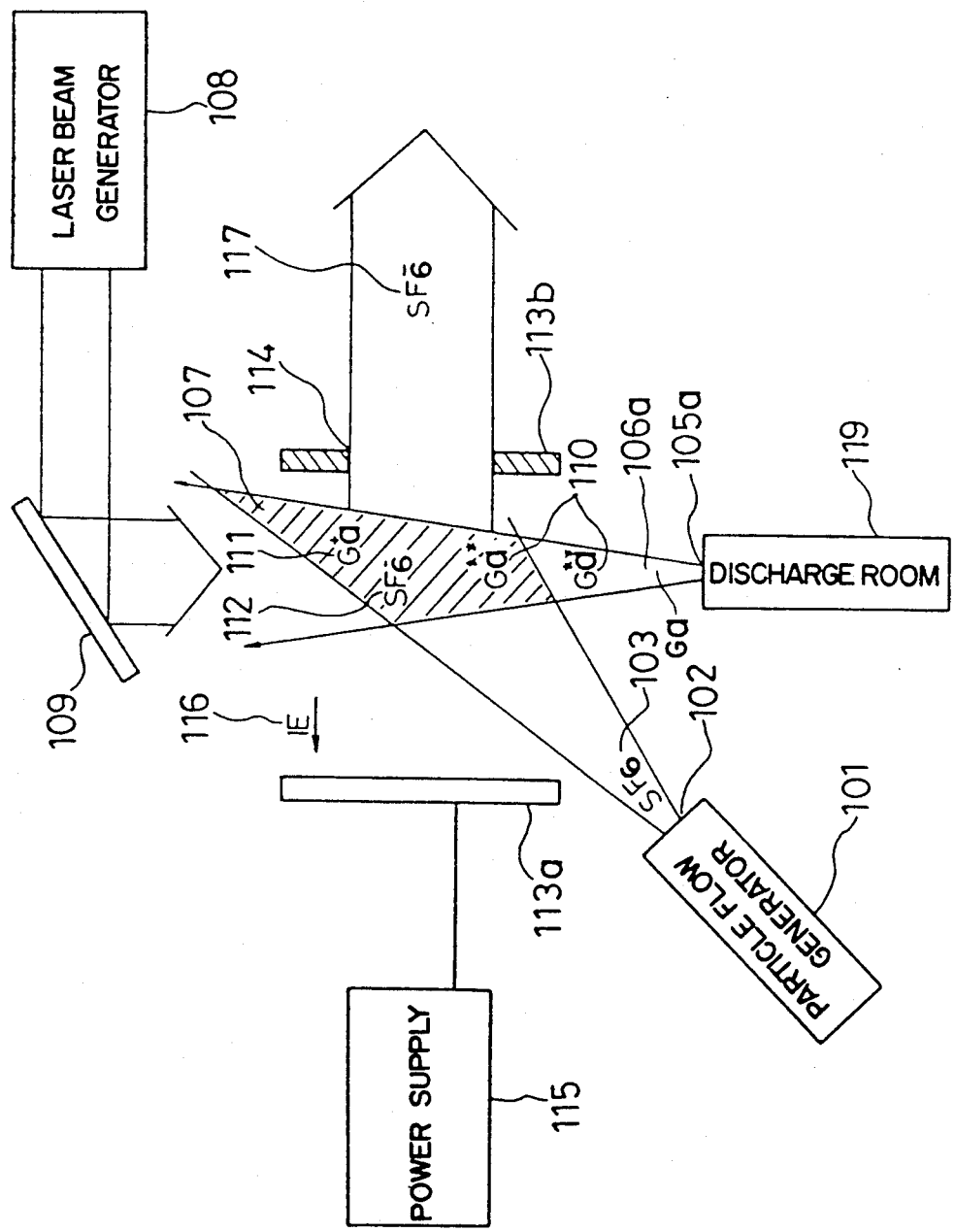
FIG. 31 is a view illustrating an ion flow generator when the laser beam is irradiated from an opposite direction on the same axis of particle flow from the particle flow generator in accordance with a fifteenth embodiment of the present invention.

FIG. 31 illustrates a fifteenth embodiment of the present invention in which the laser beam from the laser beam generator 108 irradiates the axis of the particle flow 106a in the excited state generated from the discharge chamber 119 from an opposite direction of its flow.

In this fifteenth embodiment, specific atoms or molecules can be effectively excited into the Rydberg state over the whole region of the particle flow in the excited state irradiated with the laser beam. In addition, since the lifetime of the Rydberg state is several 10 μs or more, the atoms or molecules once excited into the Rydberg state by the laser beam are as is for several 10 μs or more so that they flow as particle flow in the Rydberg state for several 10 μs or more. Therefore, positive ions and negative ions are generated by collision in the cross region 107 for several 10 μs without the laser beam irradiation, with the result that ions can be effectively generated as compared with the fifth embodiment of the present invention.

Figure 32:
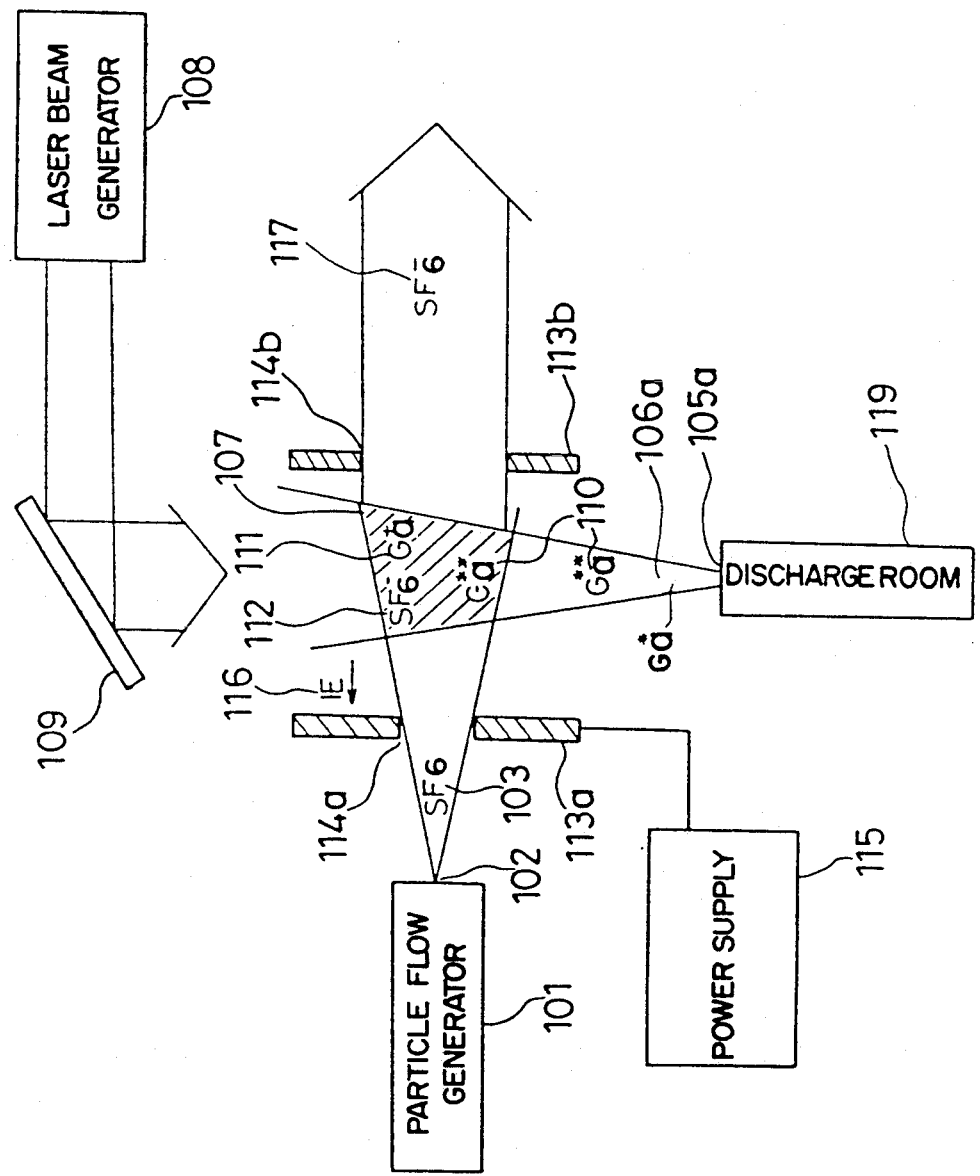
FIG. 32 is a view illustrating an ion flow generator when particle flow is introduced between electrodes through a hole on one electrode in accordance with a sixteenth embodiment of the present invention.

FIG. 32 illustrates a sixteenth embodiment in contrast to the eleventh embodiment of the present invention in FIG. 25, in which the electrode 113a has a hole through which the particle flow 103 from the particle flow generator 101 flows in almost parallel to the electric field 116.

According to this sixteenth embodiment of the present invention, since the cross region 107 can be almost symmetrical about the axis of the ion flow, the ion flow can be uniformly drawn out.

In addition, the supersonic nozzle beam generator illustrated in FIG. 24 can be used also in eleventh to sixteenth embodiments of the present invention.

Figure 33:
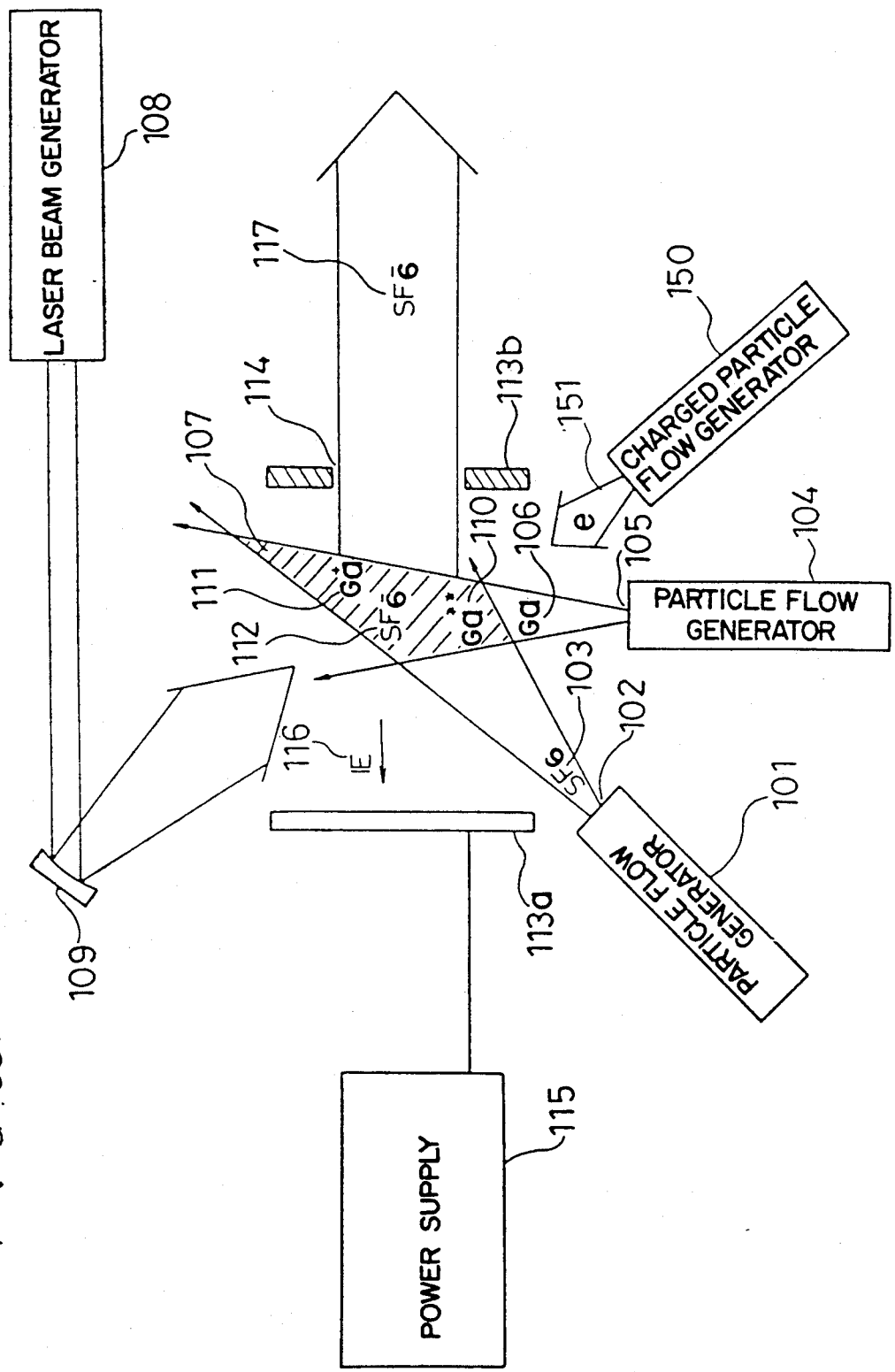
FIG. 33 is a view illustrating an ion flow generator in accordance with a seventeenth embodiment of the present invention.

FIG. 33 illustrates a seventeenth embodiment of the present invention, in which a charged particle flow generator 150 is added to the fifth embodiment of the present invention in FIG. 13. In FIG. 33, the same references designates the same in FIG. 13.

Reference numeral 150 designates a charged particle flow generator for generating charged particle flow in the form of electron flow, ion flow or plasma flow, reference numeral 151 designates charged particle flow in the form of a beam drawn out from the charged particle flow generator 150, which is electron flow in this seventeenth embodiment of the present invention. This charged particle flow 151 irradiates the second particle flow 106 in the cross region 107 of the first and second particle flows or the second particle flow 106 in the upper region of the cross region 107.

Figure 34:
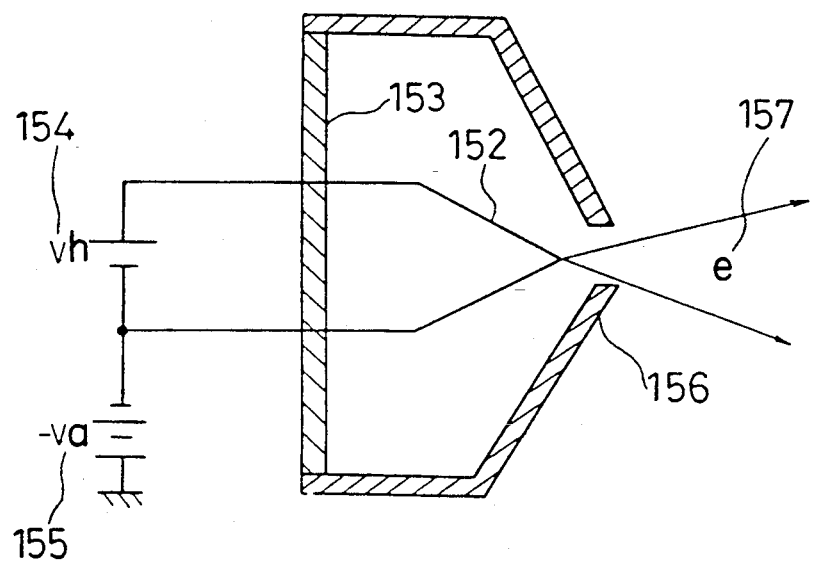
FIG. 34 is a view illustrating one example of a charged particle flow generator used in the seventeenth embodiment of the present invention in FIG. 23.

The first and second particle flow generators used in the seventeenth embodiment of the present invention are illustrated in FIGS. 15 and 16. The charge particle flow generator 150 is illustrated in FIG. 34. In FIG. 34, reference numeral 152 designates a filament for generating thermoelectrons, reference numeral 153 designates a base for holding the filament 152, which is made of an insulating material. Reference numeral 154 designates a power supply connected to the filament, reference numeral 155 designates a power supply for generating an electric field for accelerating the thermoelectrons generated from the filament 152, reference numeral 156 designates an electrode in front of the filament 152 and reference numeral 157 designates electron flow drawn out through the electrode 156.

The particle flow is generated from the ion flow generator in accordance with the seventeenth embodiment of the present invention as described in the fifth embodiment of the present invention in FIG. 13 and the $SF_6$ molecular flow spreads around through the exhaust nozzle 102 and reaches the cross region 107. In the second particle flow generator 104, Ga 104d in the crucible 104a is vaporized as a temperature of the crucible 14a is increased as illustrated in FIG. 16. The vapor is jetted from the opening 104f as the Ga electron flow and is spread around through the exhaust nozzle 105 to reach the cross region 107.

Then, a current is applied from the power supply 154 to the filament 152 in the charged particle flow generator illustrated in FIG. 34 and the filament is heated up, whereby thermoelectrons are generated from the filament 152. An electric field is generated between the filament 152 and the electrode 156 by a voltage Va of the power supply 155 connected to the filament 152. The thermoelectrons are accelerated and jetted as the electron flow 157 to irradiate the second particle flow 106 in the cross region 107 or in the upstream of the cross region 107.

The pulse laser beam with a wavelength of 426.2 nm generated from the pulse dye laser apparatus with a wavelength of 426.2 nm irradiates the particle flow 106 in the excited state in the cross region 107 or in the upstream of the cross region 107 by using the optical path adjuster 109. The energy level diagram of the Ga atom is illustrated in FIG. 27. The Ga atoms in the second particle flow 106 collide with the electrons 151 from the charged particle flow generator 150 to be excited. Then, some of the atoms are excited into $5s\ ^2S_{2/1}$. The Ga atoms excited into the $5s\ ^2S_{2/1}$ are excited into the Rydberg state of $30p$ by the laser beam with a wavelength of 426.2 nm.

If the power density of the laser beam from the laser beam generator 108 is $10^5\ W/cm^2$ or more, the Ga atoms are excited from the ground state to the Rydberg state of $30p$, so that the Ga atoms in the Rydberg state can be effectively generated.

Therefore, the atoms or molecules once excited into the Rydberg state by the laser beam flow downstream as is. Therefore, the atoms or molecules excited into the Rydberg state in the upper region of the cross region 107 also flow in the cross region 107.

Since the atom or molecule in the Rydberg state has a small binding energy with the valence electron, the valence electron is easily detached due to collision of another atom or molecule and the valence electron can be easily exchanged for an electron on the atom or molecule. Especially, when the valence electron collides with a polyatomic molecule, the exchange of electrons resonantly occurs because the binding energy of the valence electron is almost the same as an excitation energy for rotation or oscillation of the polyatomic molecule, with the result that a collision cross section becomes remarkably large.

When Xe (xenon) Xe* in the Rydberg state in which the principal quantum number is n collides with a polyatomic molecule of $SF_6$, $CCl_4$ or $CCl_3F$, reaction formulas are as follows.

$$Xe^* + SF_6 \rightarrow Xe^+ + SF_6^-$$

$$Xe^* + CCl_4 \rightarrow Xe^+ + CCl_3 + Cl^-$$

$$Xe^* + CCl_3F \rightarrow Xe^+ + CCl_2F + Cl^-$$

When $CCl_4$ and $Cl_3F$ collide with Xe in the Rydberg state, $CCl_4^-$ and $CCl_3F^-$ are transiently generated but they are immediately dissolved so that $CCl_3$ and $Cl^-$, and $CCl_2F$ and $Cl^-$ are generated. The electronic exchange cross section of the atom or molecule in the Rydberg state is approximately $10^{-11}\ cm^2$ and it is found that this value is very large as compared with a fact that usual collision ionization cross section ranges from $10^{-14}$ cm$^2$ to $10^{-19}$ cm$^2$. For example, the mean free path of the electronic exchange is approximately several mm when atoms in the Rydberg state pass through the SF$_6$ with a density of approximately $10^{-5}$ Torr, and then it is found that positive ions of the atoms in the Rydberg state and the negative ions of SF$_6$ are easily generated. Therefore, the Ga atoms in the second particle flow 106 can e effectively excited into the Rydberg state when irradiated with the charged particle flow from the charged particle flow generator 150 instead of the laser beam and they spread around as Ga atomic flow in the Rydberg state. Then, the Ga atoms collide with SF$_6$ molecules in the first particle flow 103 in the cross region 107. At this time, the electronic exchange expressed by:

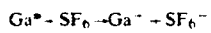

occurs and Ga$^-$ and SF$_6^-$ ions are effectively produced in the cross region 107.

According to the seventeenth embodiment of the present invention, since specific atoms or molecules can be ionized over a large range by using a laser beam in a visible region with a small laser power density as compared with the conventional operations, ion flow with a larger current than conventional operations is obtained.

In addition, when the first particle flow 103 from the first particle flow generator 101 in accordance with the seventeenth embodiment includes CCl$_4$ or CCl$_3$F, Cl$^-$ ion flow can be generated without changing a wavelength of the laser beam from the laser beam generator 108. Similarly, if the first particle flow 103 includes SiH$_4$, SiH$_4^-$ ion flow can be generated. Therefore, ions of various atoms or molecules can be effectively generated using a laser beam with a certain wavelength in the visible region if the first particle flow 102 includes the atoms or molecules to be ionized. Then, ion flow with high purity can be easily generated.

Figure 35:
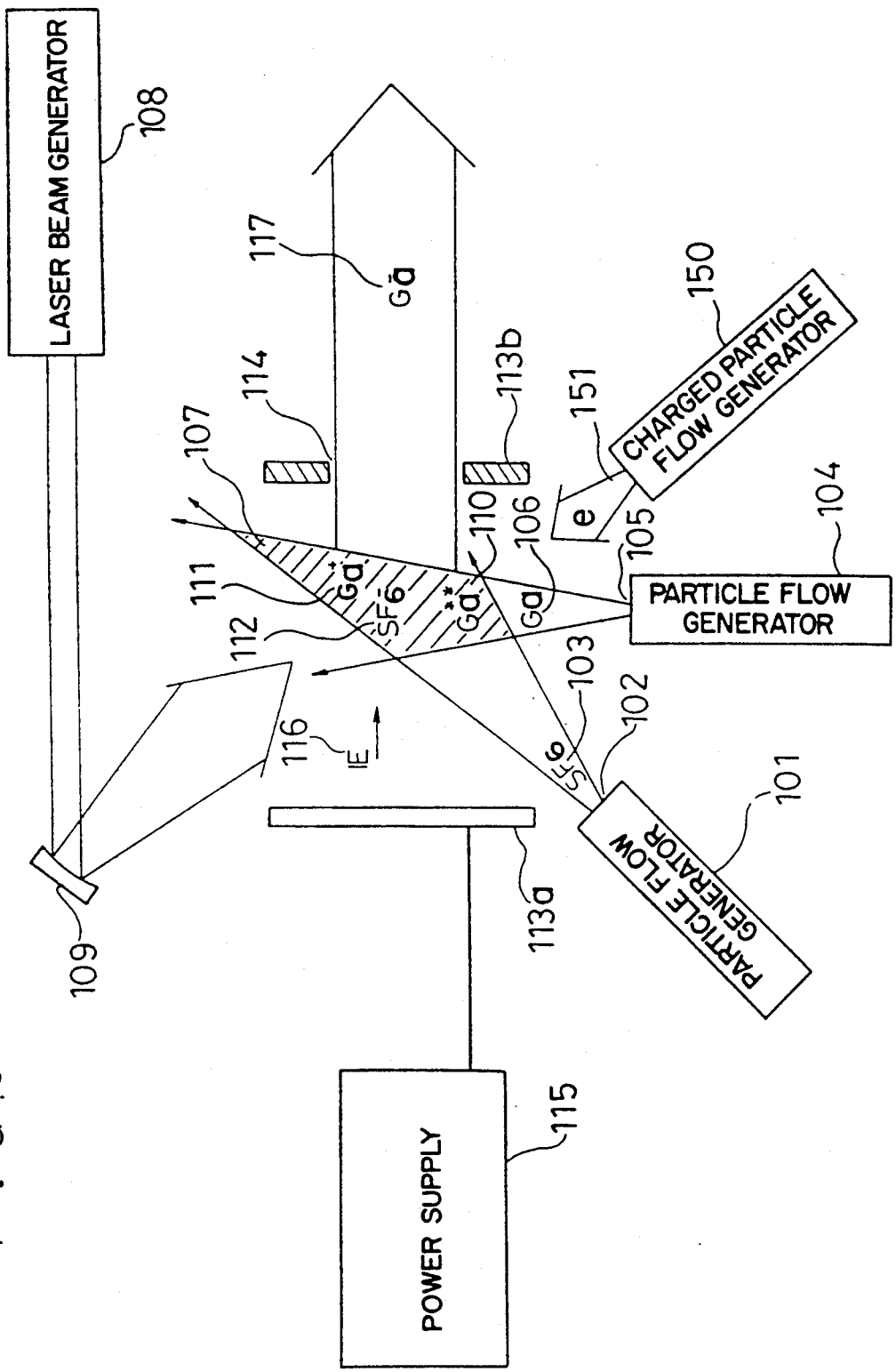
FIG. 35 is a view illustrating a positive ion flow generator in accordance with an eighteenth embodiment of the present invention.

FIG. 35 illustrates an eighteenth embodiment of the present invention in which the power supply 115 for generating a positive voltage is connected to the electrode 113a in order to generate Ga. ion flow in contrast to the seventeenth embodiment of the present invention in FIG. 33.

According to the eighteenth embodiment of the present invention, the Ga atoms and the SF molecules in the Rydberg state collide with each other in the cross region 107. Ga$^-$ and SF$_6^-$ ions are effectively generated and Ga ions are drawn out through the electrode 113b by a positive voltage applied from the power supply 115.

Although the Ga ion flow is generated in the eighteenth embodiment, since the nature of the Rydberg state of an atom or molecule is determined by its principal quantum number n in the excited state, any atom or molecule can be similarly generated as ion flow. When ion flow of In (indium) is generated, In is put in the crucible 104a in the second particle flow generator 104 illustrated in FIG. 16 and particle flow 106 of In can be similarly generated as an ion beam when a wavelength of the dye laser in the laser beam generator 108 is set at a transition wavelength in the case of 6s−np transition, which is shorter than 454 nm.

Although a description was given of generation of the ion flow of atoms or molecules in the above eighteenth embodiment, it is needless to say that ion flow containing many specific isotopes may be generated in such a manner that at least one wavelength band width of the laser beam which excites atoms into the Rydberg state is reduced and isotropic uranium $^{235}$U (uranium 235) is selectively ionized from U (uranium).

In addition, although Ga is excited from the excited state to the Rydberg state by the laser beam generated from the laser beam generator 108 as a pulse beam in the seventeenth and eighteenth embodiments of the present invention in FIGS. 33 and 35, when atoms or molecules are excited into the Rydberg state by using a continuously oscillating laser beam, their lifetime in the Rydberg state is as long as several 10 μs, whereby excitation into the Rydberg state and its accumulation are gradually implemented even by a sufficiently small laser power density as compared with the case of the pulse laser beam. For example, when Ga atoms are excited from the state of 5s $^2$S$_{\frac{1}{2}}$ to the state of 30p, the transition thereof can be saturated by the power density of several 10 W/cm$_2$.

Therefore, when the atoms are excited into the Rydberg state by using the continuously oscillating laser beam, its required power density is several 10 W/cm$^2$. As a result, ion flow can be effectively generated using the laser with a low output as compared with the case where the pulse laser beam is used.

Although the laser beam with one wavelength is used in the above seventeenth and eighteenth embodiments of the present invention, atoms or molecules may be excited from the excited state to the Rydberg state through a plurality of intermediate states by using a plurality of laser beams with longer wavelengths. In this purpose, for example, the laser beam generator 108 illustrated in FIG. 14 which generates the laser beam with two different kinds of wavelengths on the same axis may be used.

In addition, although the electron flow generator is used as the charged particle flow generator 150 in the above seventeenth and eighteenth embodiments of the present invention, it is needless to say that the same effect can be obtained even if ion flow is generated from an ion source or plasma flow is generated from a plasma flow generator.

Figure 36:
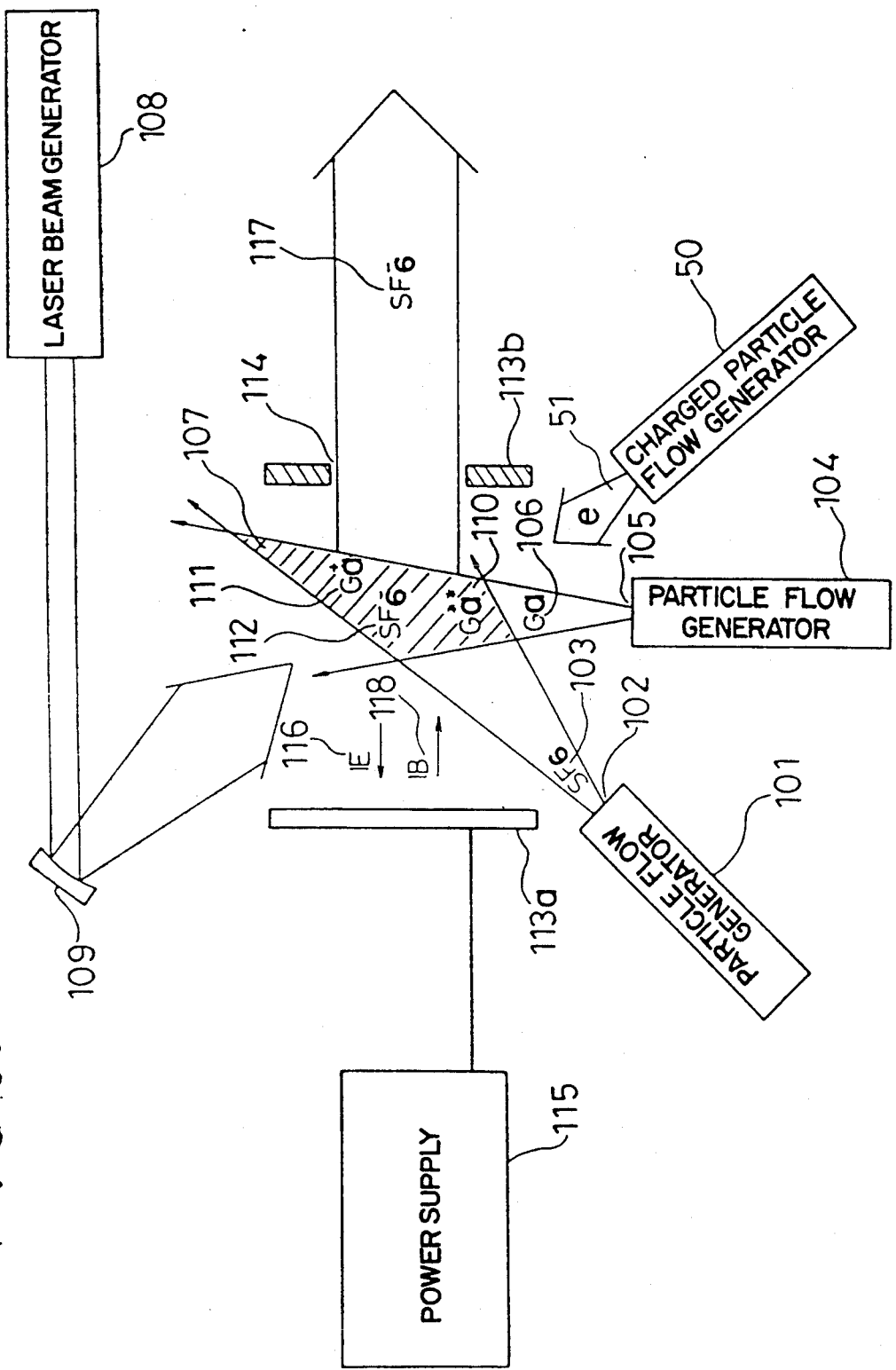
FIG. 36 is a view illustrating an ion flow generator when a magnetic field is applied almost in parallel to an electric field in accordance with a nineteenth embodiment of the present invention.

FIG. 36 illustrates a nineteenth embodiment in contrast to the seventeenth embodiment of the present invention in which a magnetic field |B 118 is applied in parallel to an electric field |E 116 generated by the electrodes 113a and 113b, whereby ions in the cross region 107 or accelerated ions into an outlet hole 114 are prevented from spreading.

As a method for applying the magnetic field |B 118 in accordance with the nineteenth embodiment of the present invention, a coil may be arranged so as to surround the electrodes 113a and 113b to adjust an amount of current to the coil or a permanent magnet may be additionally provided. In addition, although it is most preferable that the magnetic field |B 118 applied between the electrodes 131a and 131b is set in parallel to the electric field |E 116, it is not necessarily in parallel to the electric field |E 116.

Figure 37:
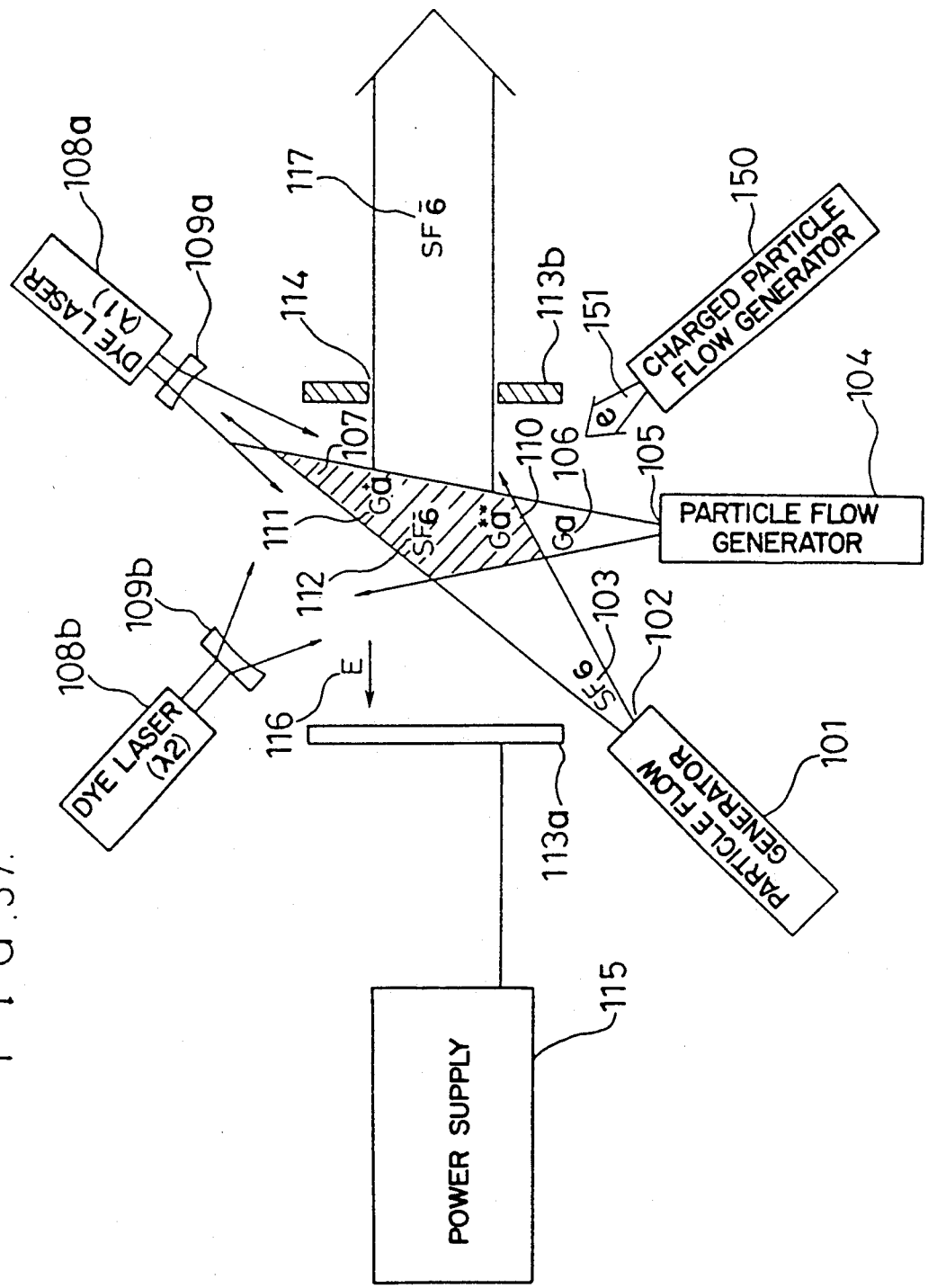
FIG. 37 is a view illustrating an ion flow generator when laser beams are irradiated at the same time to a cross region of particle flow in accordance with a twentieth embodiment of the present invention.

FIG. 37 illustrates a twentieth embodiment of the present invention in which the cross region 107 is irradiated with two kinds of laser beams at the same time instead of the laser beam having two different wavelengths on the same optical axis generated from the laser beam generator 108 in accordance with the seventeenth embodiment of the present invention in FIG. 33. A laser beam with a wavelength of λ$_1$ from a dye laser 108a irradiates the cross region 107 using an optical adjuster 109a and similarly, a laser beam with a wavelength of $\lambda_2$ from a dye laser 108b irradiates to the cross region 107 using an optical path adjuster 109b.

Figure 38:
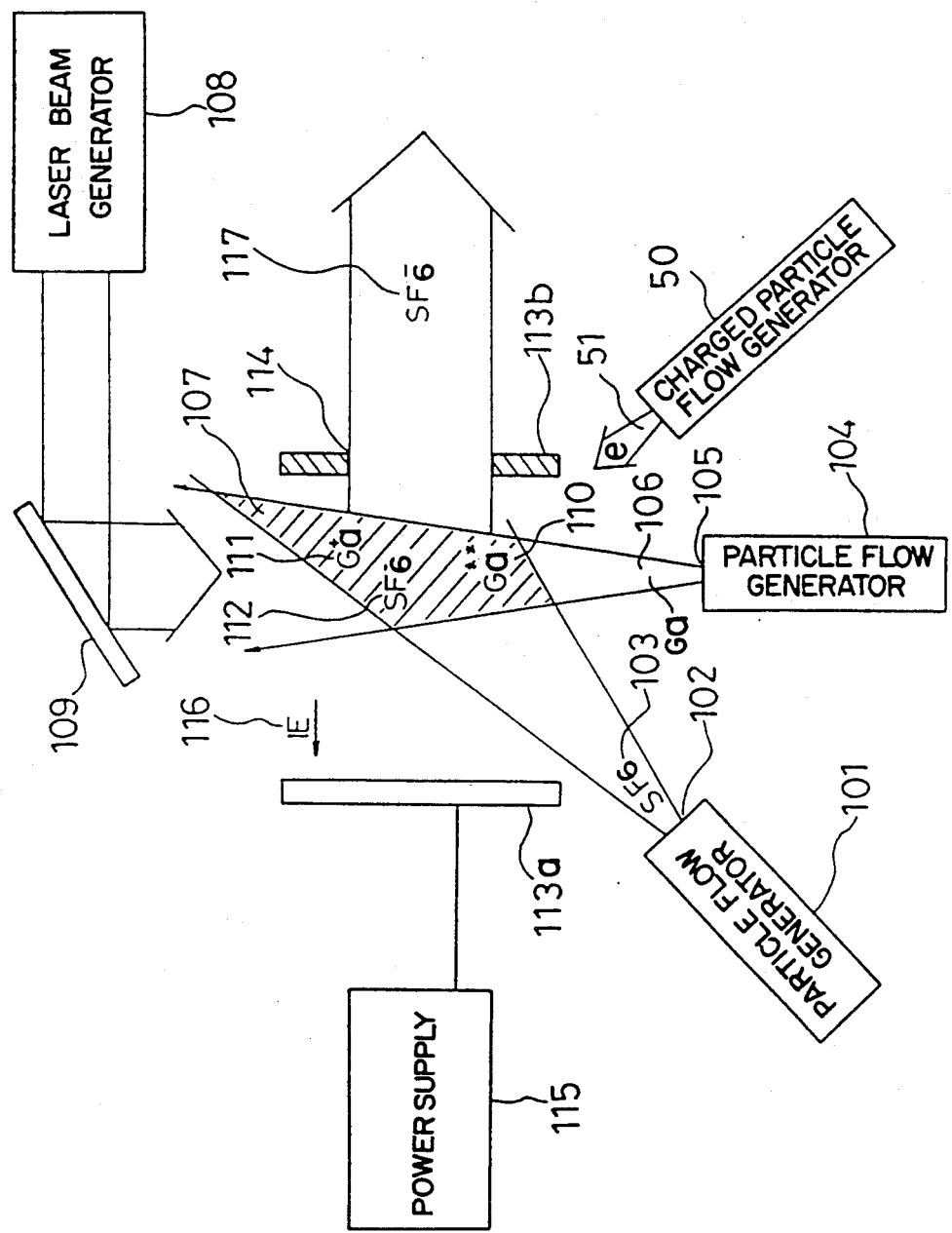
FIG. 38 is a view illustrating an ion flow generator when the laser beam is irradiated from an opposite direction on the same axis of particle flow from the particle flow generator in accordance with a twenty-first embodiment of the present invention.

FIG. 38 illustrates a twenty-first embodiment in FIG. 33 in which in contrast to the seventeenth embodiment of the present invention a laser beam from the laser beam generator 108 irradiates the axis of the particle flow 105 generated from the second particle flow generator 104 from an opposite direction of its flow.

According to the twenty-first embodiment of the present invention, specific atoms or molecules can be effectively excited into the Rydberg state over the whole region of the particle flow irradiated by the laser beam. In addition, since the lifetime of the Rydberg state is several 10 $\mu$s or more, the atoms or molecules once excited into the Rydberg state by the laser beam are as is for several 10 $\mu$s or more, so that they flow as particle flow in the Rydberg state for several 10 $\mu$s or more. Therefore, positive ions and negative ions are generated by collision in the cross region 107 for several 10 $\mu$s without the laser beam irradiation, with the result that ions can be effectively generated as compared with the seventeenth embodiment of the present invention in FIG. 38.

Figure 39:
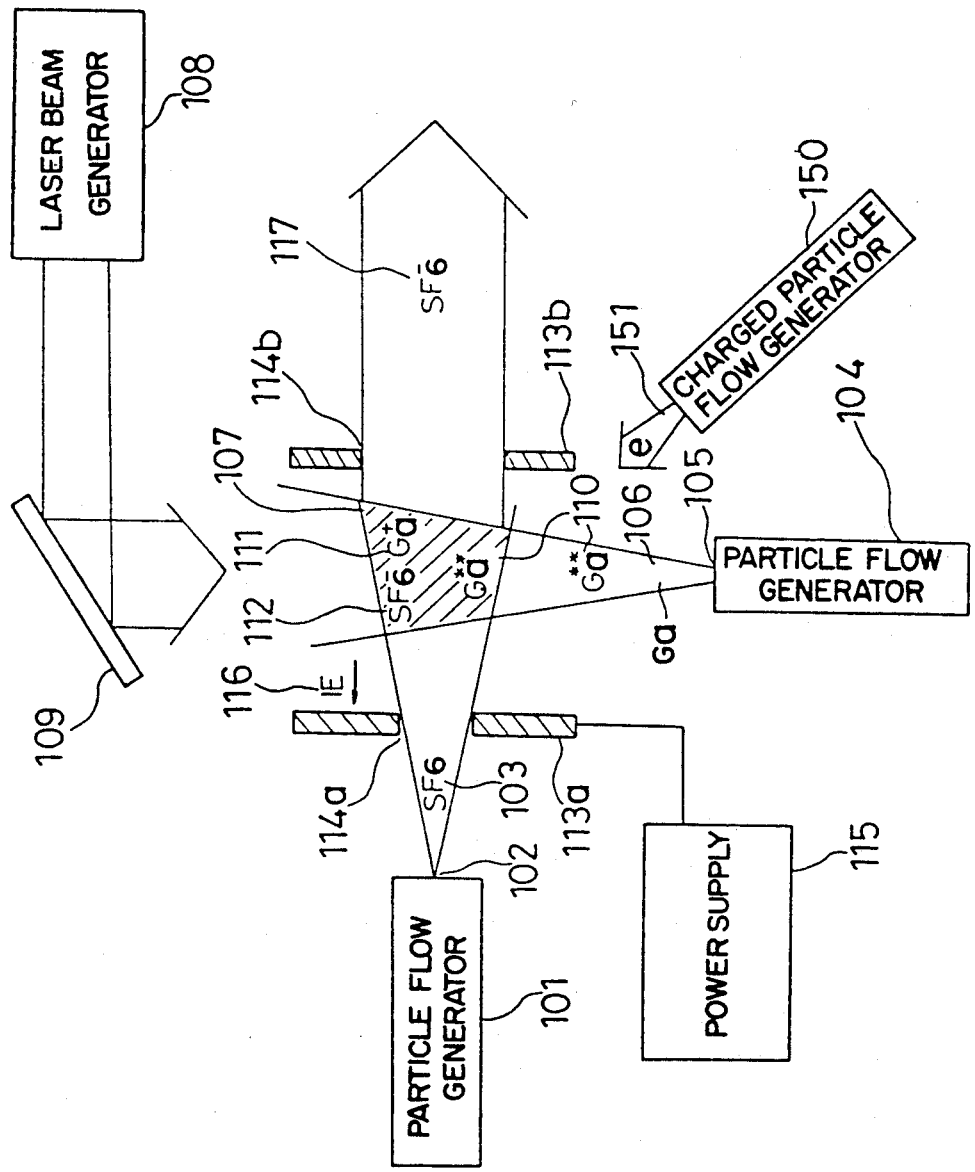
FIG. 39 is a view illustrating an ion flow generator when particle flow is introduced between electrodes through a hole on one electrode in accordance with a twenty-second embodiment of the present invention.

FIG. 39 illustrates a twenty-second embodiment in contrast to the twenty-first embodiment of the present invention in FIG. 38, in which the electrode 113a has a hole 114a through which the particle flow 103 from the first particle flow generator 101 flows in almost parallel to the electric field $|E$ 116.

According to the twenty-second embodiment of the present invention, since the cross region 107 can be almost symmetrical about the axis of the ion flow, the ion flow can be uniformly drawn out.

In addition, a supersonic nozzle beam generator illustrated in FIG. 24 may be used as the particle flow generator in the seventeenth to twenty-second embodiments of the present invention.

Figure 40:
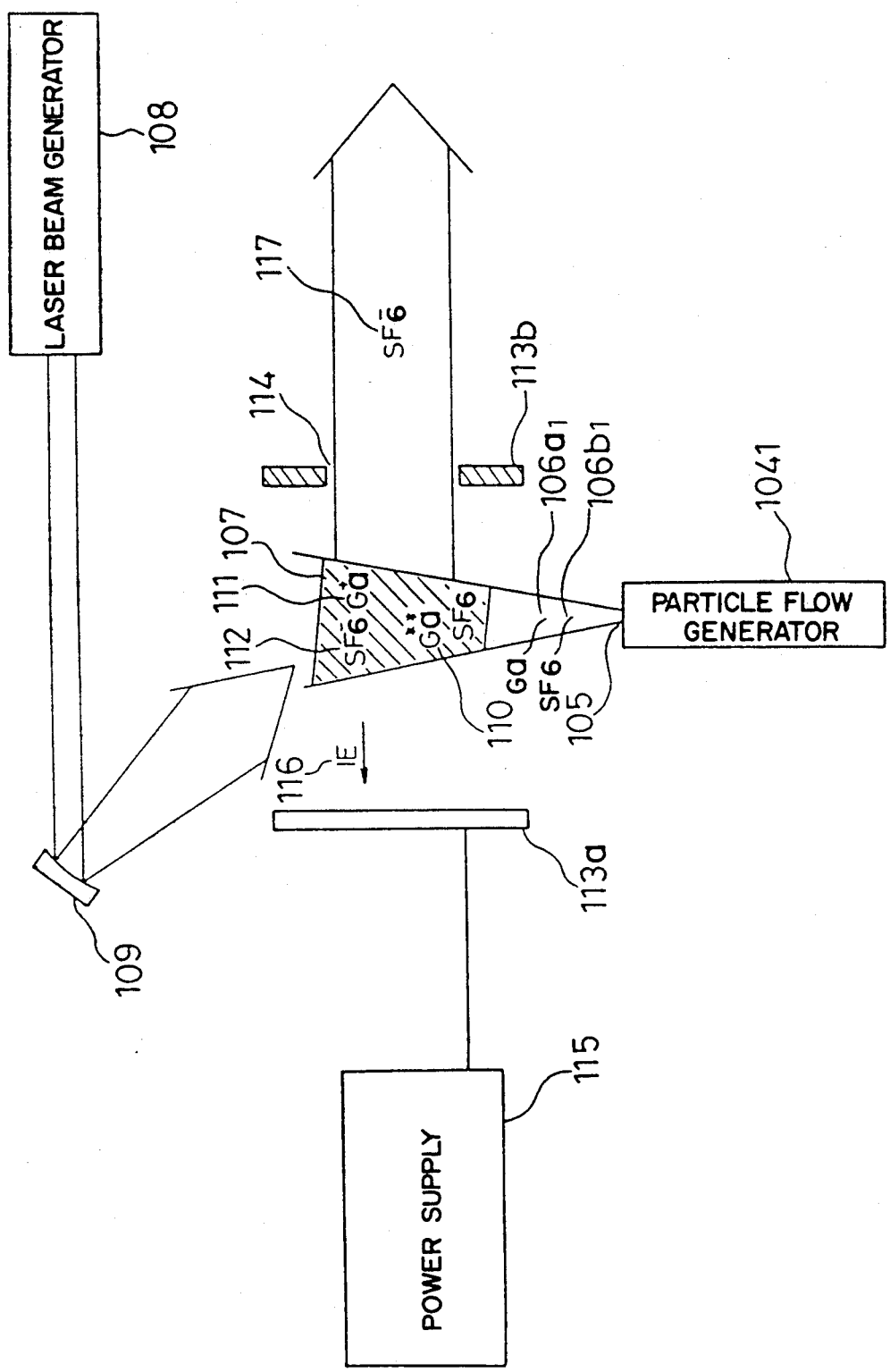
FIG. 40 is a view illustrating a twenty-third embodiment of the present invention.

FIG. 40 illustrates a twenty-third embodiment of the present invention in which a particle flow generator 104l for generating atoms or molecules to be excited into the Rydberg state and another atom or molecule, which are molecular flow containing Ga and $SF_6$ in this embodiment, is used instead of the first and second particle flow generators 1011 and 104 in accordance with the fifth embodiment of the present invention in FIG. 13. This particle flow generator 104l used in this twenty-third embodiment of the present invention integrally includes the first particle flow generator 101 illustrated in FIG. 15 and the second particle flow generator 104 illustrated in FIG. 16 as illustrated in FIG. 41 in which the opening 101e of the first particle flow generator 101 is positioned on an upper part of the crucible 104a of the second particle flow generator 104.

Figure 41:
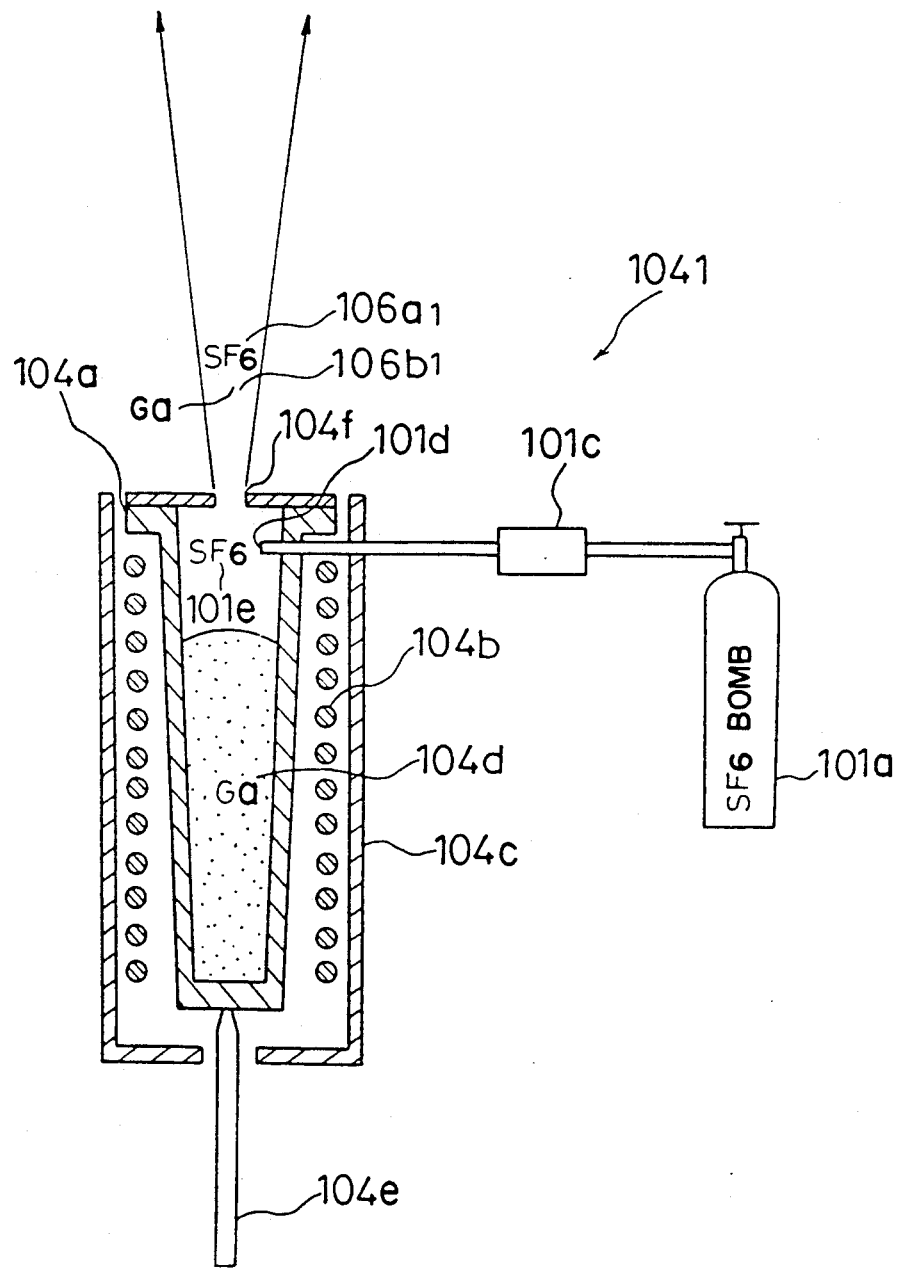
FIG. 41 is a view illustrating one example of the particle flow generator in accordance with the twenty-third embodiment of the present invention in FIG. 40.
Figure 42:
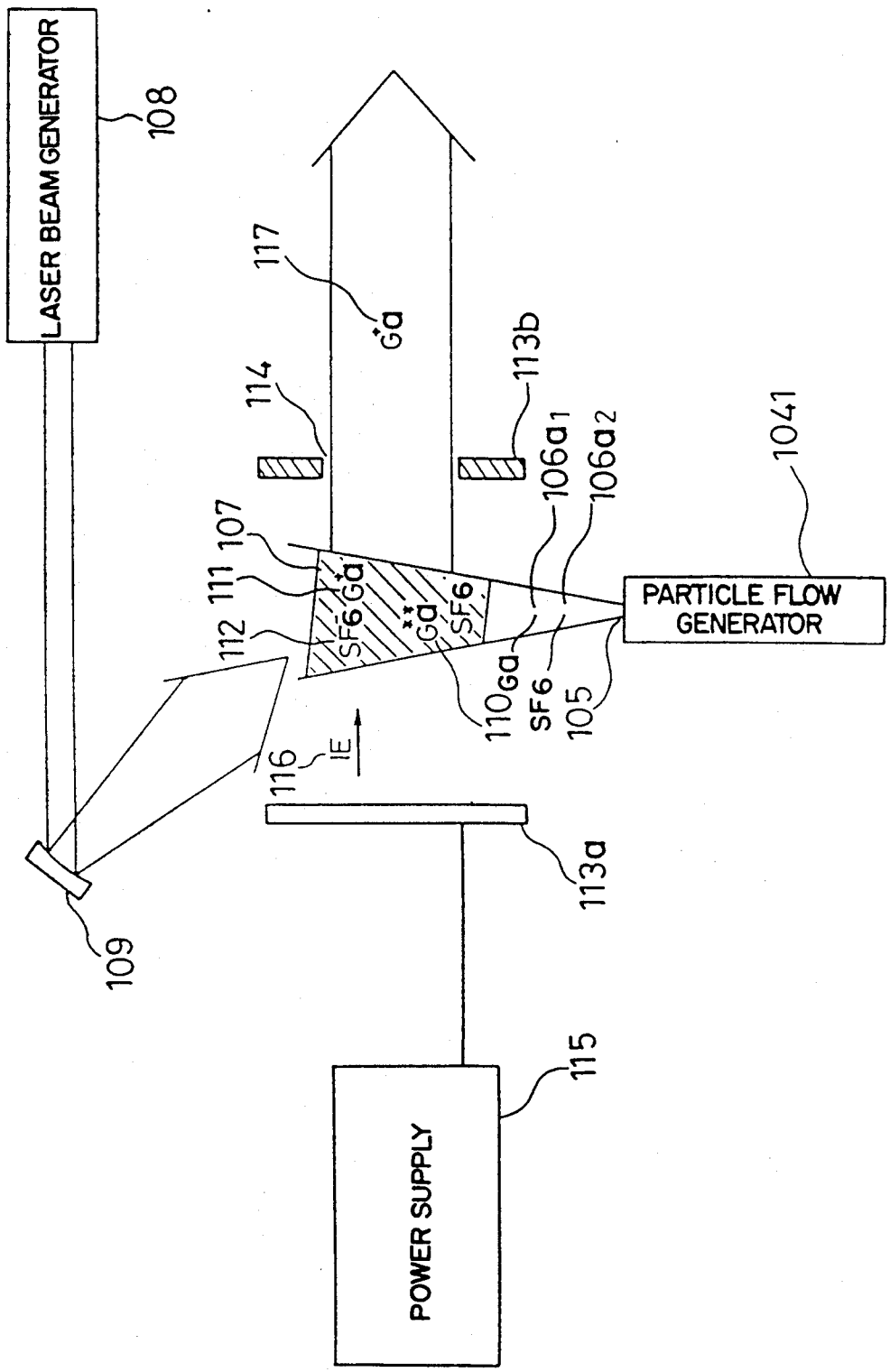
FIGS. 42 through 46 are views illustrating twenty-fourth through twenty-eighth embodiments of the present invention.

FIG. 42 illustrates a twenty-fourth embodiment of the present invention in which the particle flow generator 104l illustrated in FIG. 41 is used instead of the first and second particle flow generators 101 and 104 in the sixth embodiment of the present invention in FIG. 19.

Figure 43:
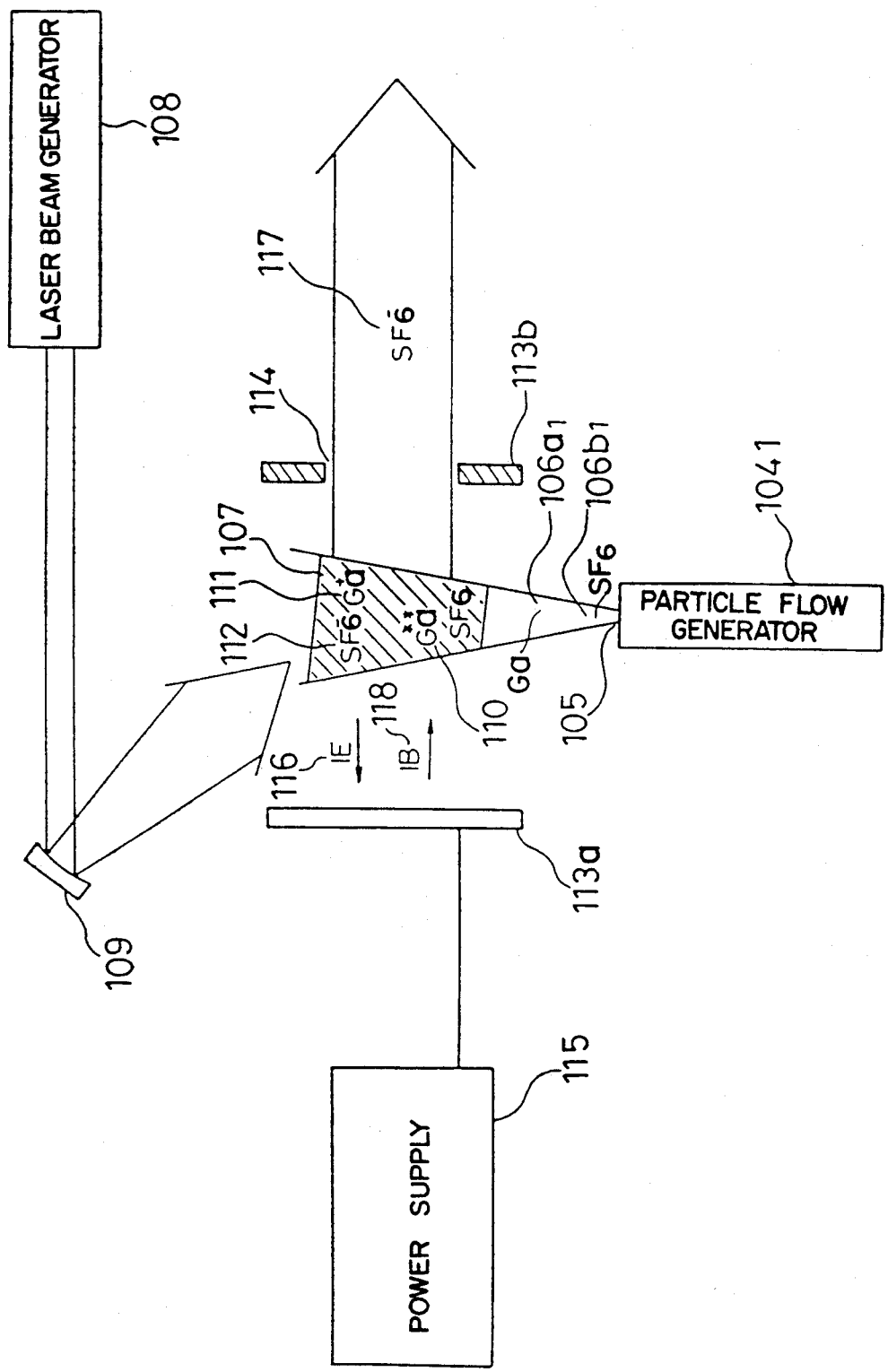

FIG. 43 illustrates a twenty-fifth embodiment of the present invention in which the particle flow generator 104l illustrated in FIG. 41 is used instead of the first and second particle flow generators 101 and 104 in accordance with the seventh embodiment of the present invention in FIG. 20.

Figure 44:
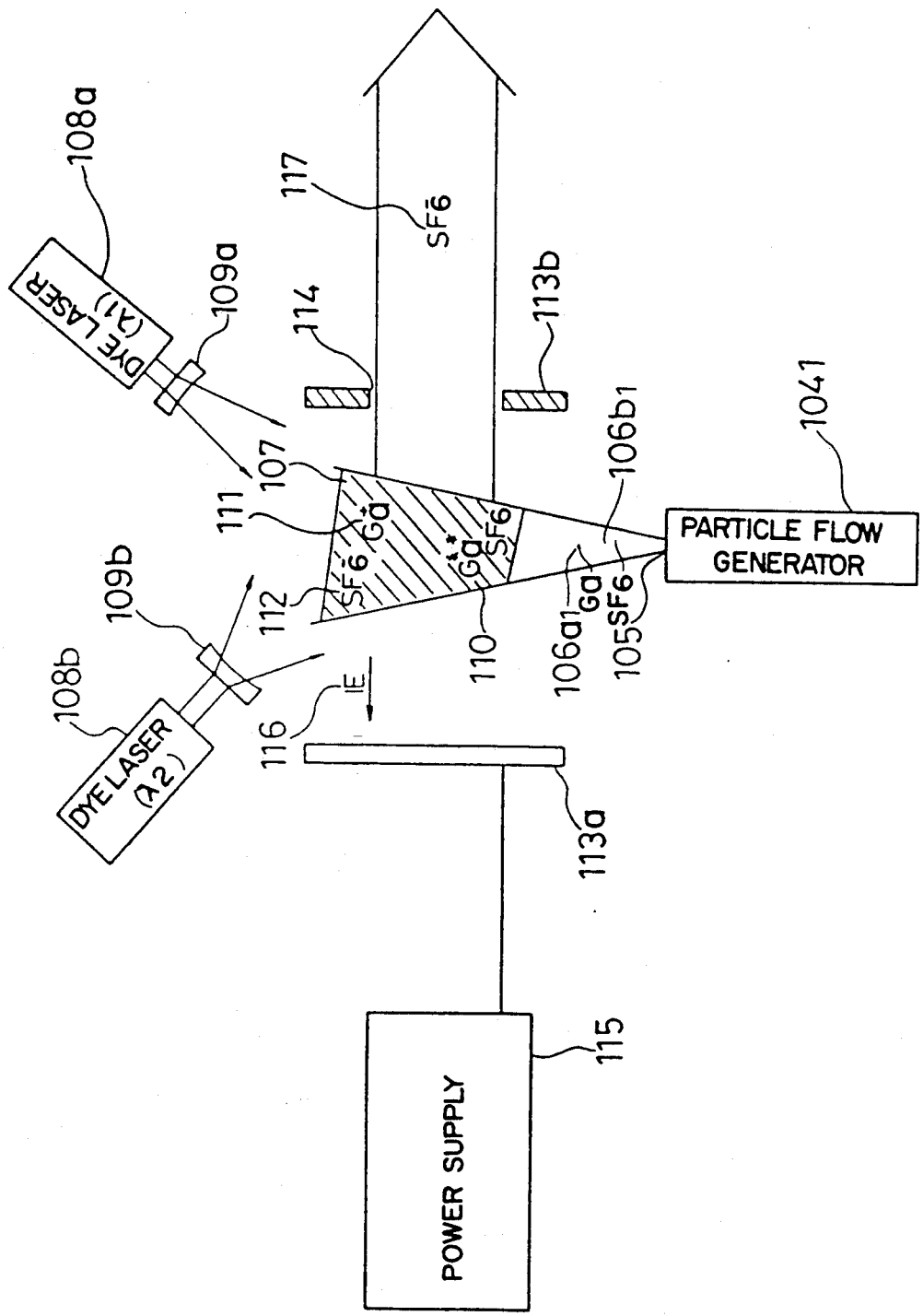

FIG. 44 illustrates a twenty-sixth embodiment of the present invention in which the particle flow generator 104l illustrated in FIG. 41 is used instead of the first and second particle flow generators 101 and 104 in accordance with the eighth embodiment of the present invention in FIG. 21.

Figure 45:
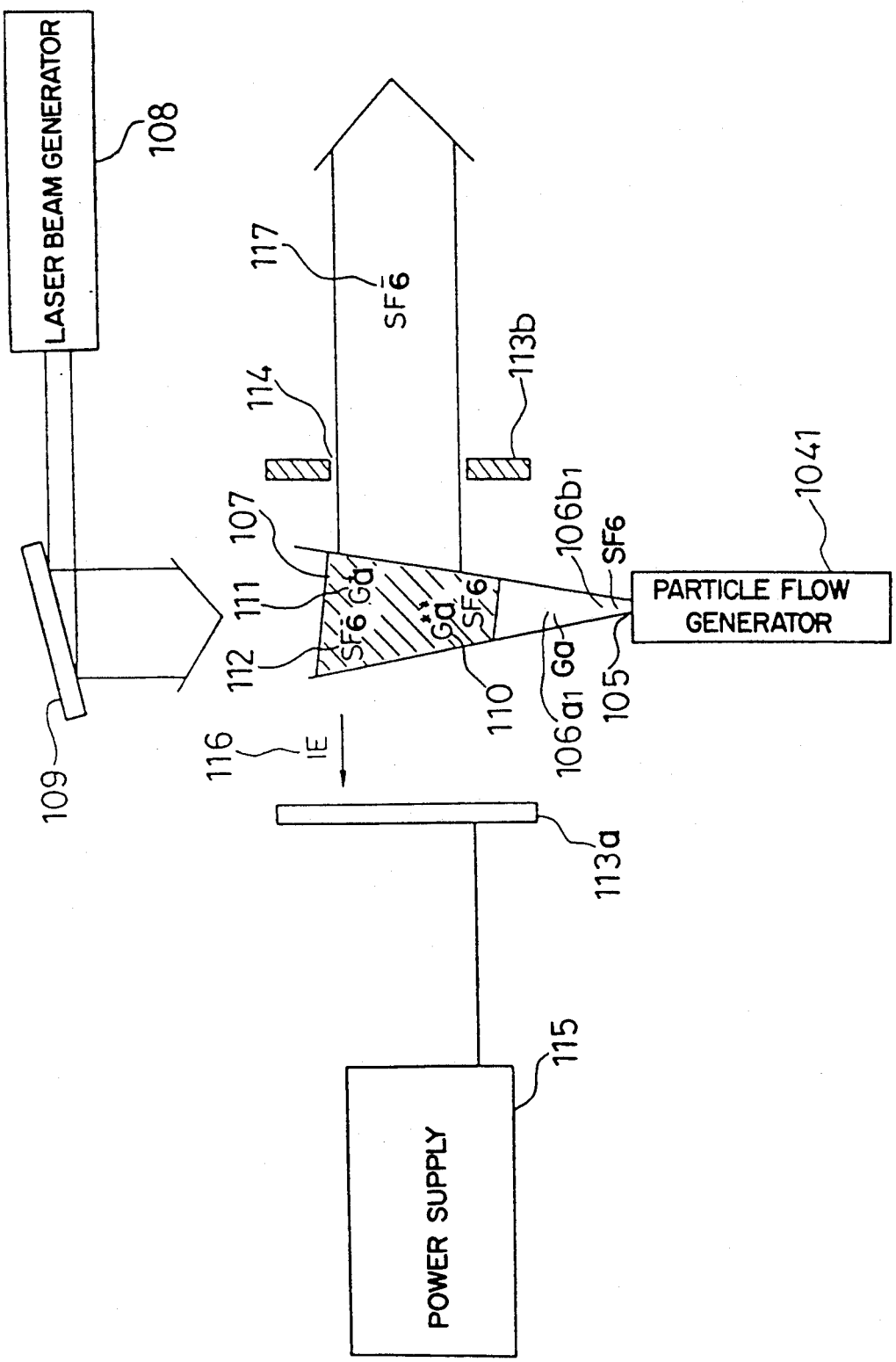

FIG. 45 illustrates a twenty-seventh embodiment of the present invention in which the particle flow generator 104l illustrated in FIG. 41 is used instead of the first and second particle flow generators 101 and 104 in accordance with the ninth embodiment of the present invention in FIG. 22.

Figure 46:
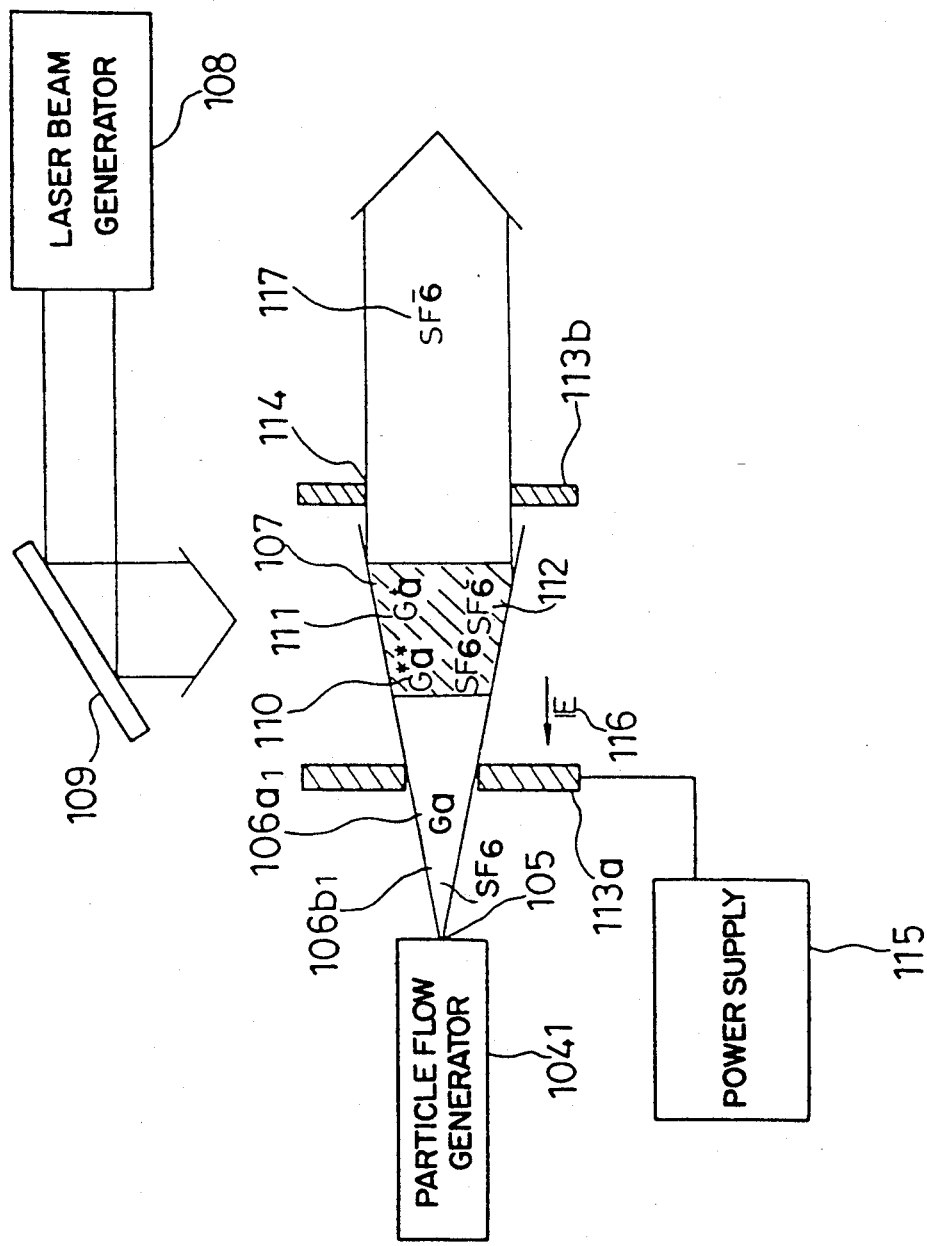

FIG. 46 illustrates a twenty-eighth embodiment of the present invention in which the particle flow generator 104l illustrated in FIG. 41 is used instead of the first and second particle flow generators 101 and 104 in accordance with the tenth embodiment of the present invention in FIG. 23.

Figure 47:
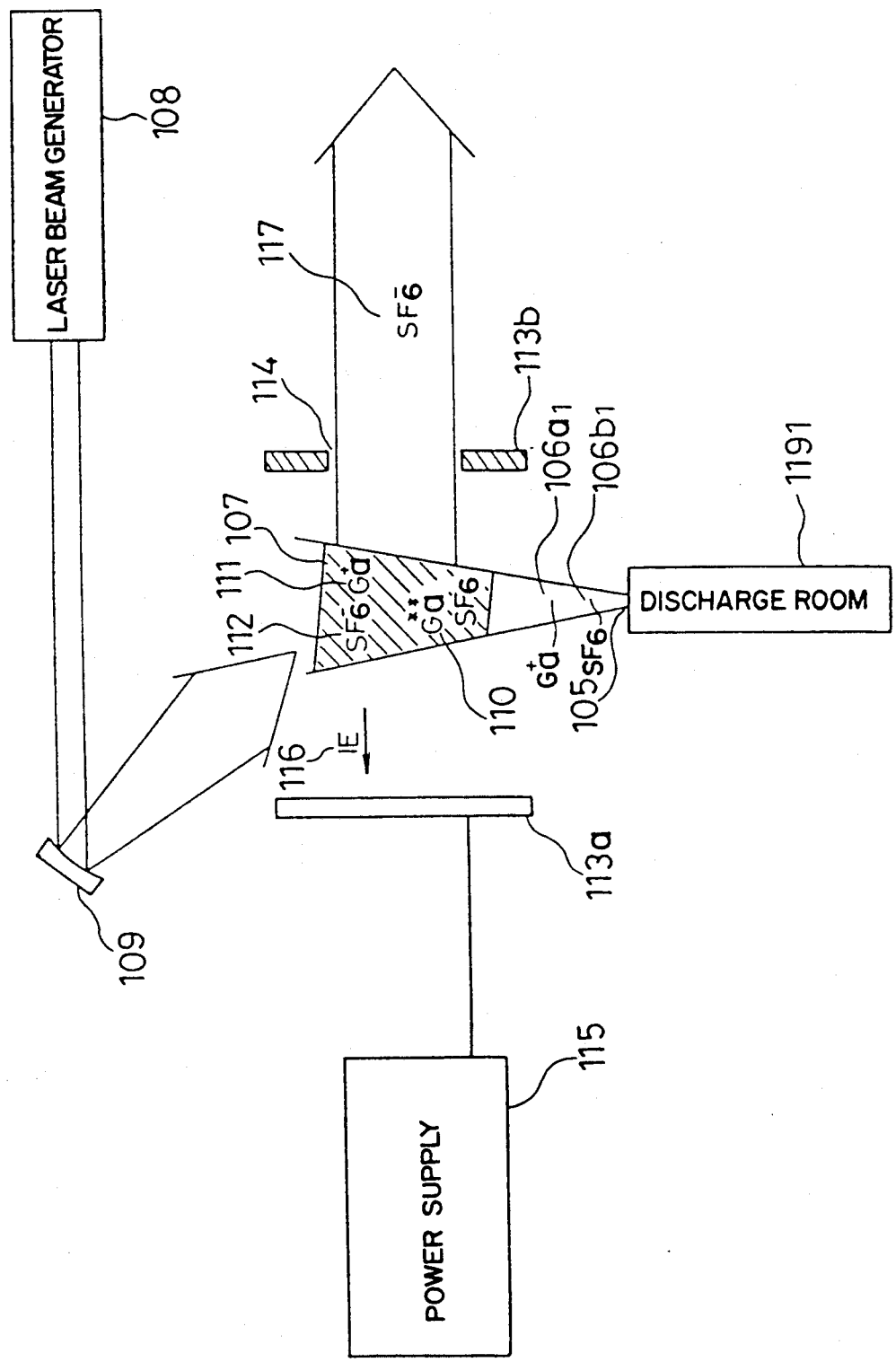
FIG. 47 is a view illustrating a twenty-ninth embodiment of the present invention.
Figure 48:
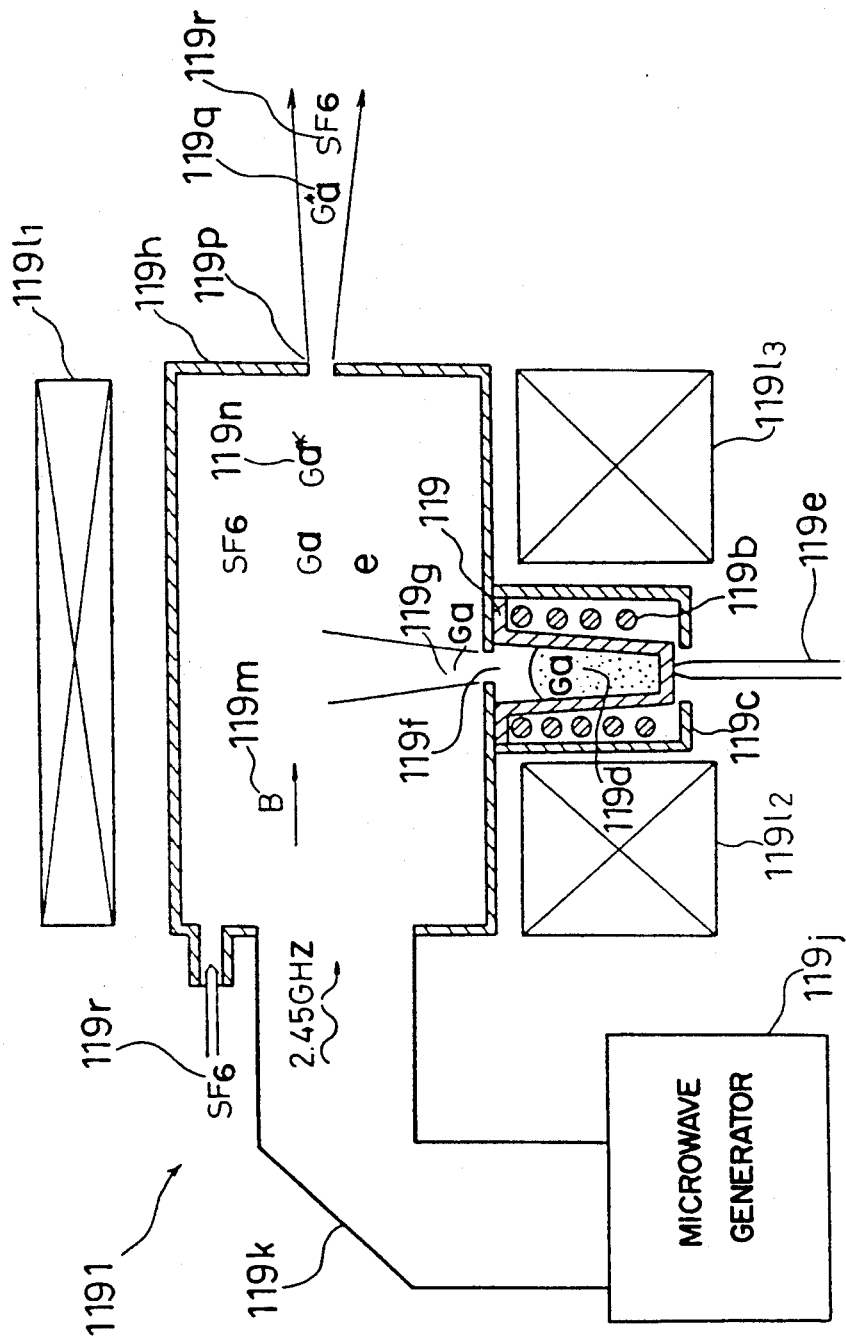
FIG. 48 is a view illustrating one example of the discharge chamber in accordance with the twenty-ninth embodiment of the present invention in FIG. 47.

FIG. 47 illustrates a twenty-ninth embodiment of the present invention in which the discharge chamber 119l illustrated in FIG. 48 is used instead of the particle flow generator 101 and the discharge chamber 119 in accordance with the eleventh embodiment of the present invention in FIG. 25. The discharge chamber 119l generates the particle flow containing Ga atoms or molecules to be excited into the Rydberg state an $SF_6$ atoms or molecules to be ionized which are partially in the excited state.

The discharge chamber 119l used in this twenty-ninth embodiment of the present invention is illustrated in FIG. 48, which is almost the same as the discharge chamber 119 illustrated in FIG. 26. In FIG. 48, the same references designate the same elements in FIG. 26. Although the material 119l introduced into the discharge chamber 119 is He in FIG. 26, $SF_6$ is introduced into the discharge chamber 119 and Ga particle flow 119q and $SF_6$ particle flow 119r are jetted through the opening 119p in FIG. 48.

In the discharge chamber illustrated in FIG. 48, He is not introduced but $SF_6$ is introduced into the container 119h to adjust the intensity of the magnetic field. As a result, the ECR condition is satisfied, discharge is effectively performed and several percents of Ga atoms or $SF_6$ molecules are excited into the excited state or ionized.

As described above, particles 119q in the excited state and in the bottom state in the container 119h of the discharge chamber 119l are jetted through the opening 119p and then spread around through the exhaust nozzle 12.

Figure 49:
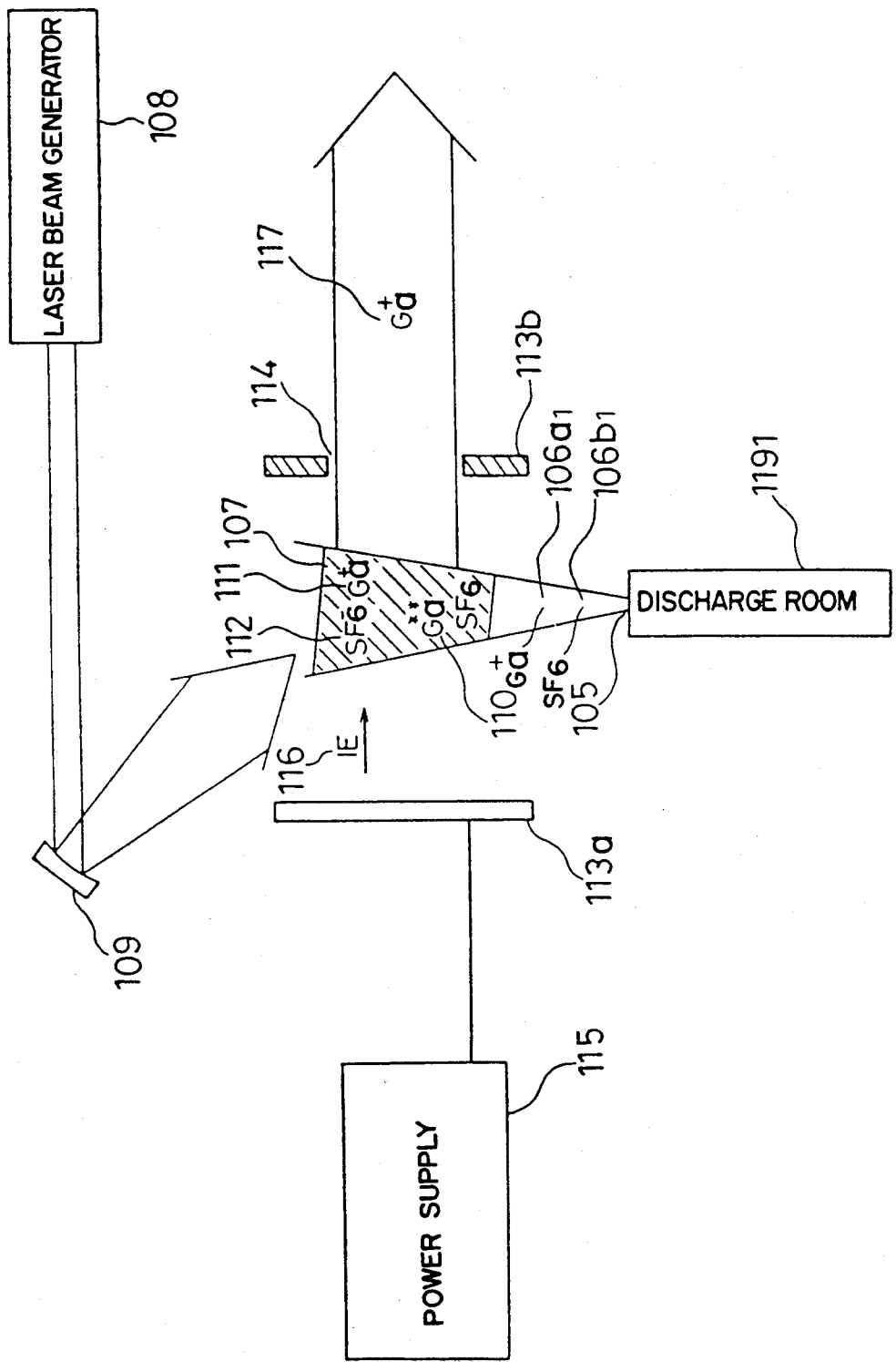

FIG. 49 is a thirtieth embodiment of the present invention in which the discharge chamber 119l illustrated in FIG. 48 is used instead of the particle flow generator 101 and the discharge chamber 119 in accordance with the twelfth embodiment of the present invention in FIG. 28.

Figure 50:
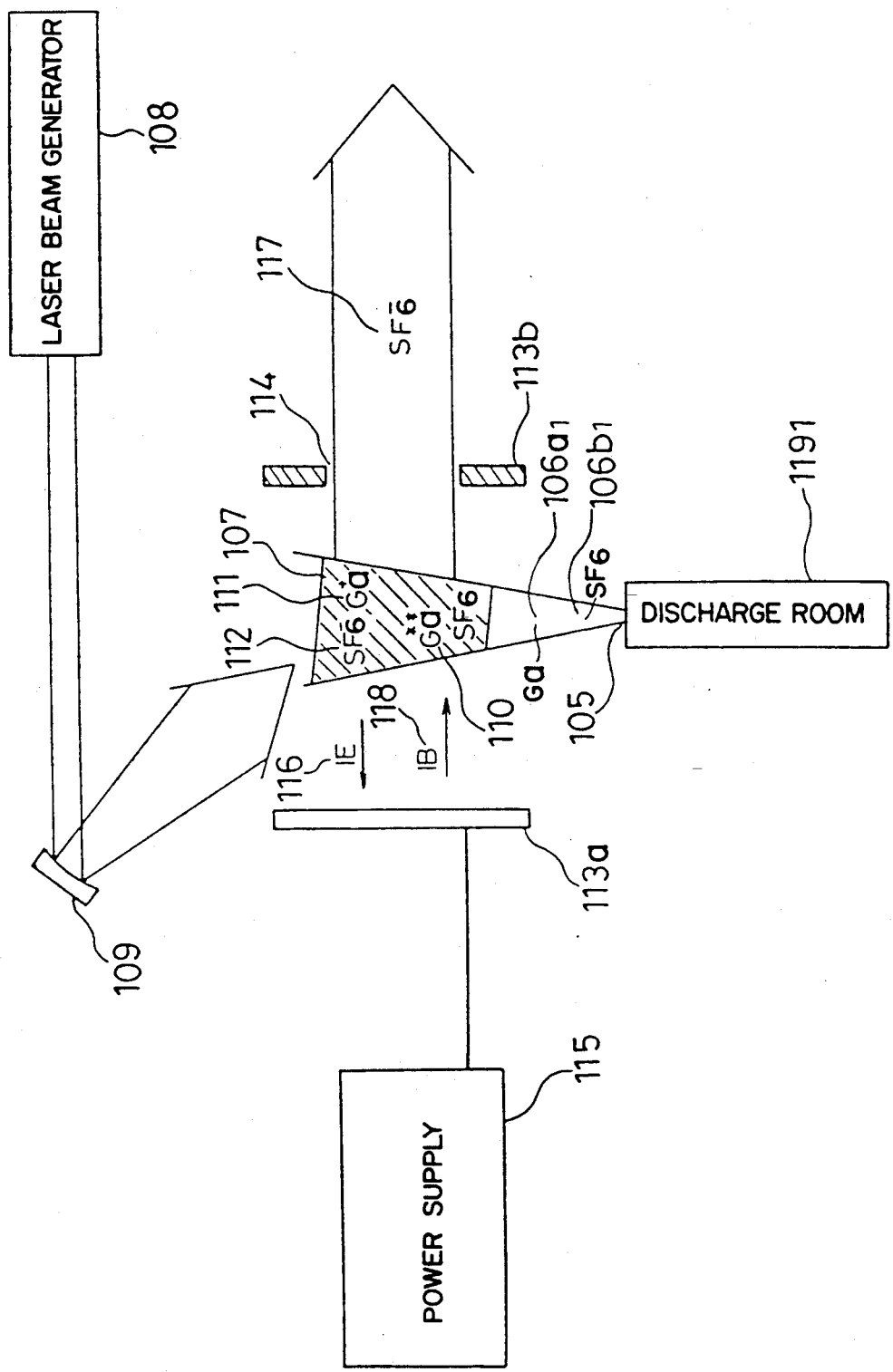

FIG. 50 is a thirty-first embodiment of the present invention in which the discharge chamber 119l illustrated in FIG. 48 is used instead of the particle flow generator 101 and the discharge chamber 119 in accordance with the thirteenth embodiment of the present invention in FIG. 29.

Figure 51:
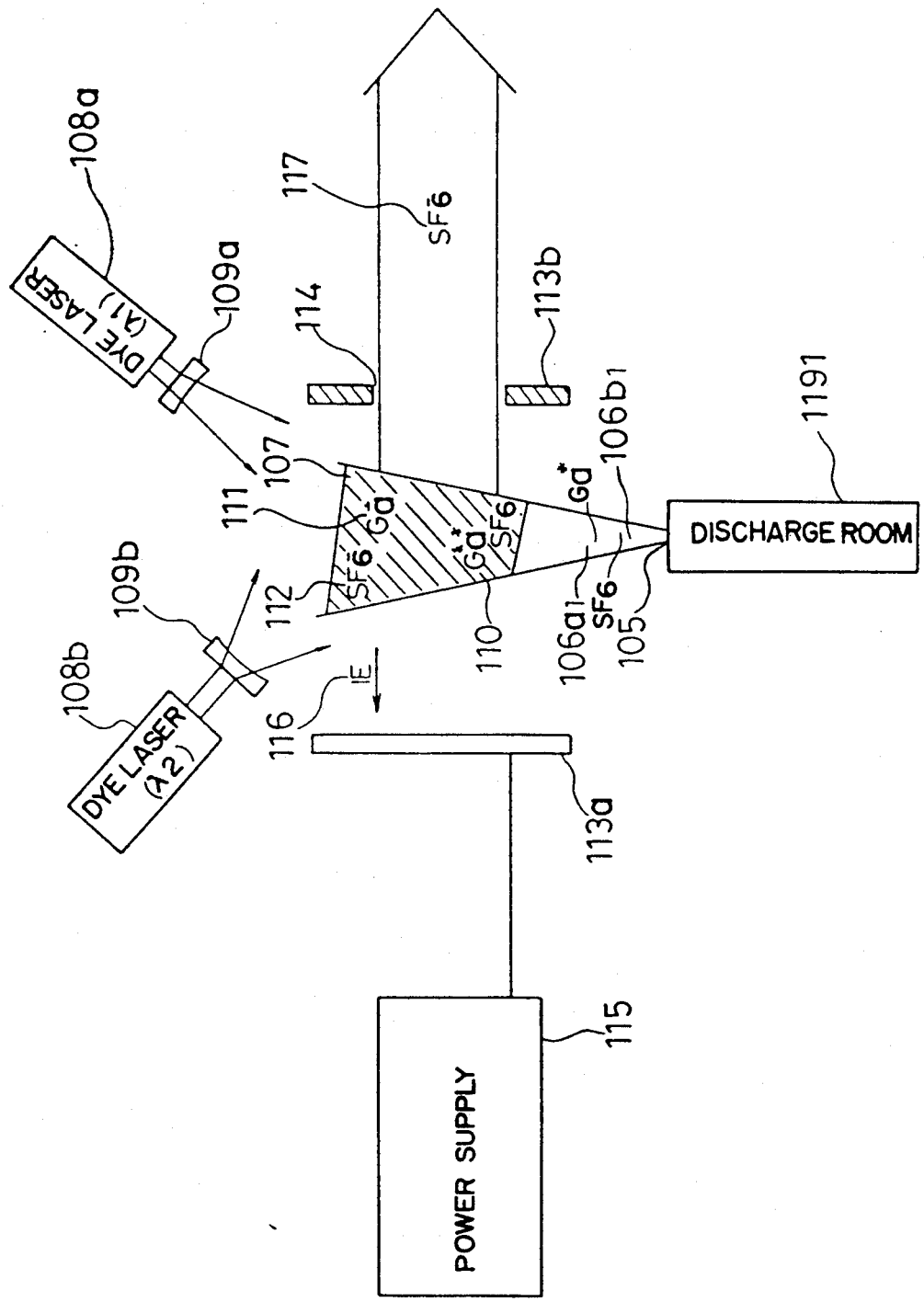

FIG. 51 is a thirty-second embodiment of the present invention in which the discharge chamber 119l illustrated in FIG. 48 is used instead of the particle flow generator 101 and the discharge chamber 119 in accordance with the fourteenth embodiment of the present invention in FIG. 30.

Figure 52:
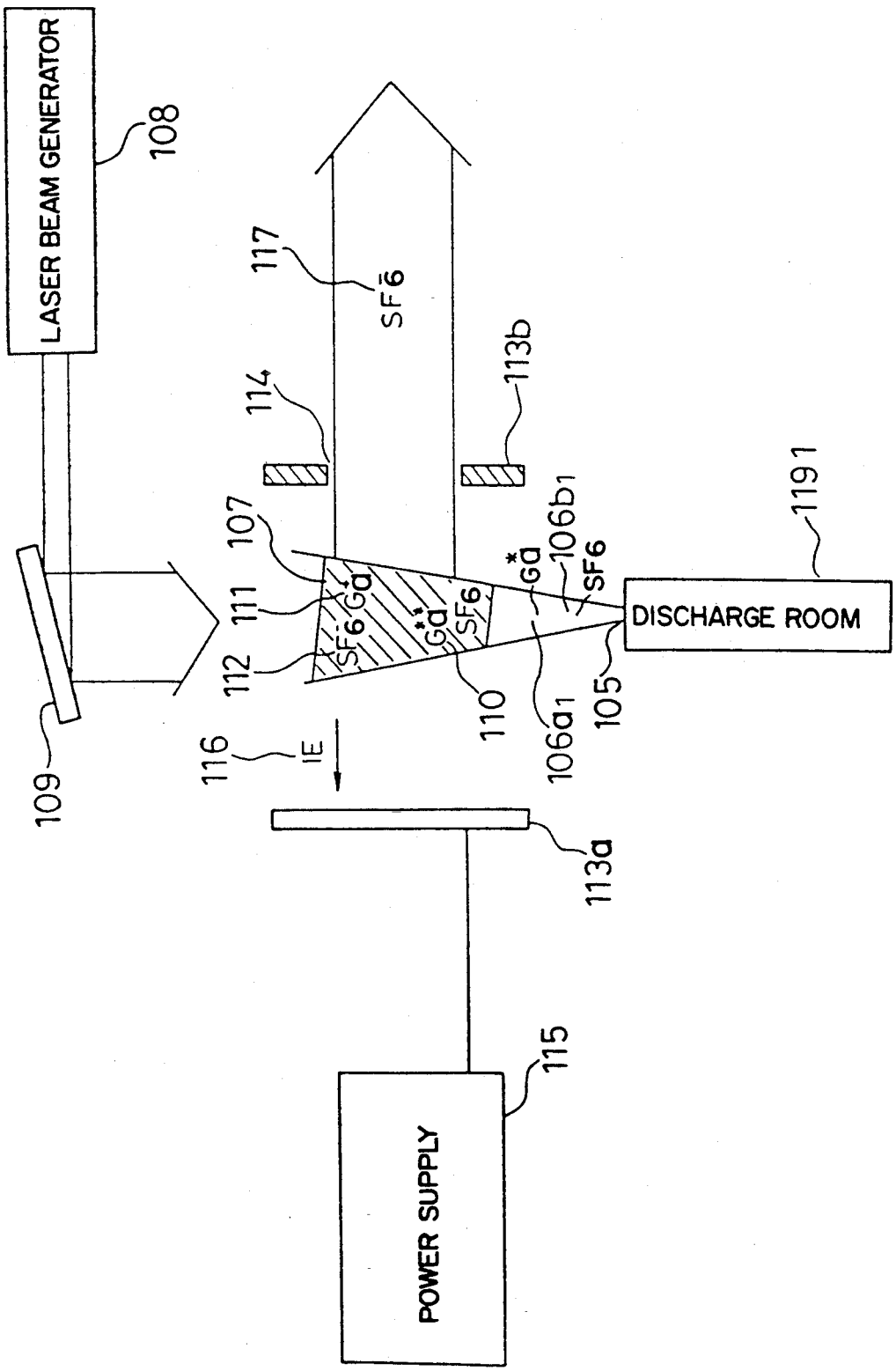

FIG. 52 is a thirty-third embodiment of the present invention in which the discharge chamber 119l illustrated in FIG. 48 is used instead of the particle flow generator 101 and the discharge chamber 119 in accordance with the fifteenth embodiment of the present invention in FIG. 31.

Figure 53:
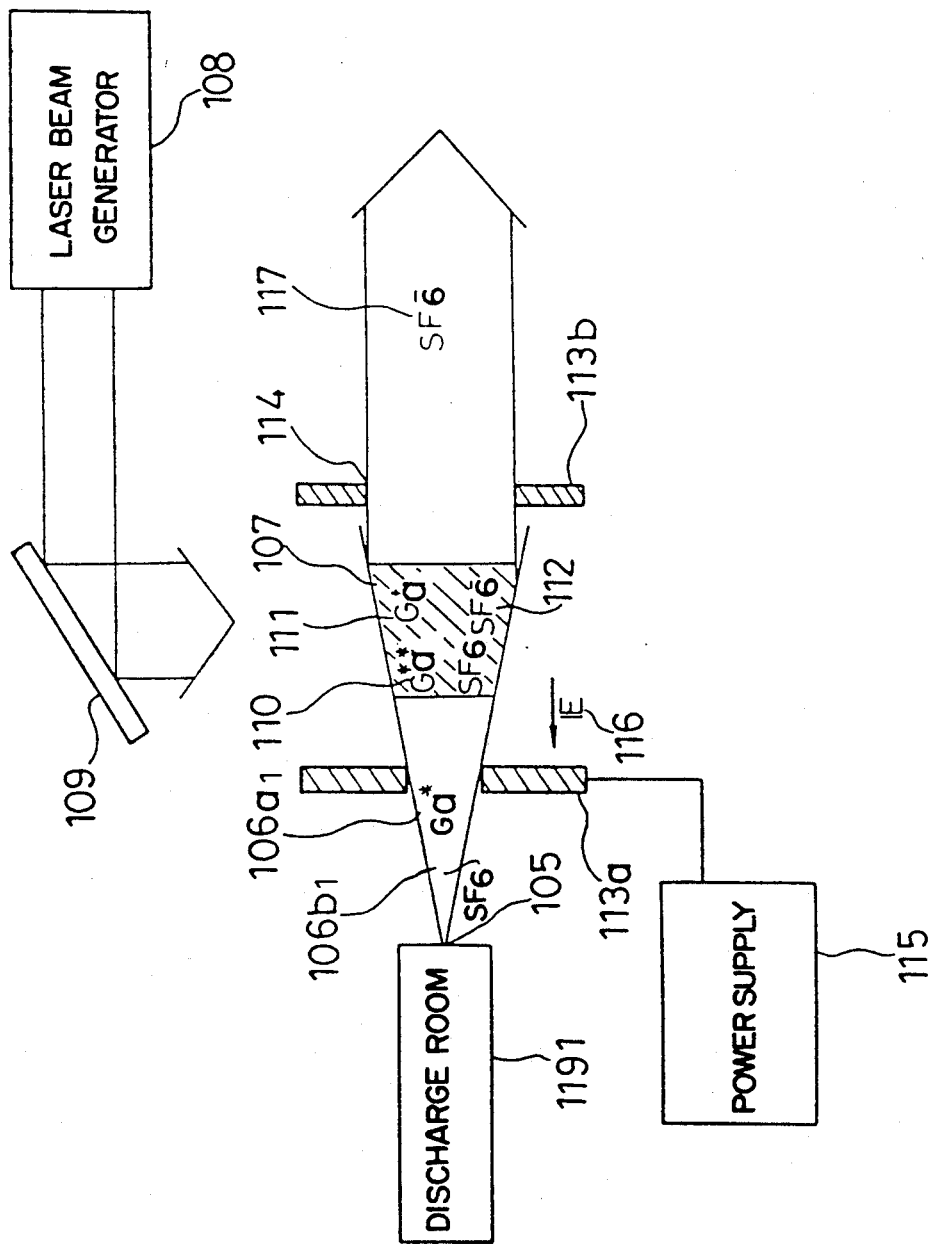

FIG. 53 is a thirty-fourth embodiment of the present invention in which the discharge chamber 119f illustrated in FIG. 48 is used instead of the particle flow generator 101 and the discharge chamber 119 in accordance with the sixteenth embodiment of the present invention in FIG. 32.

Figure 54:
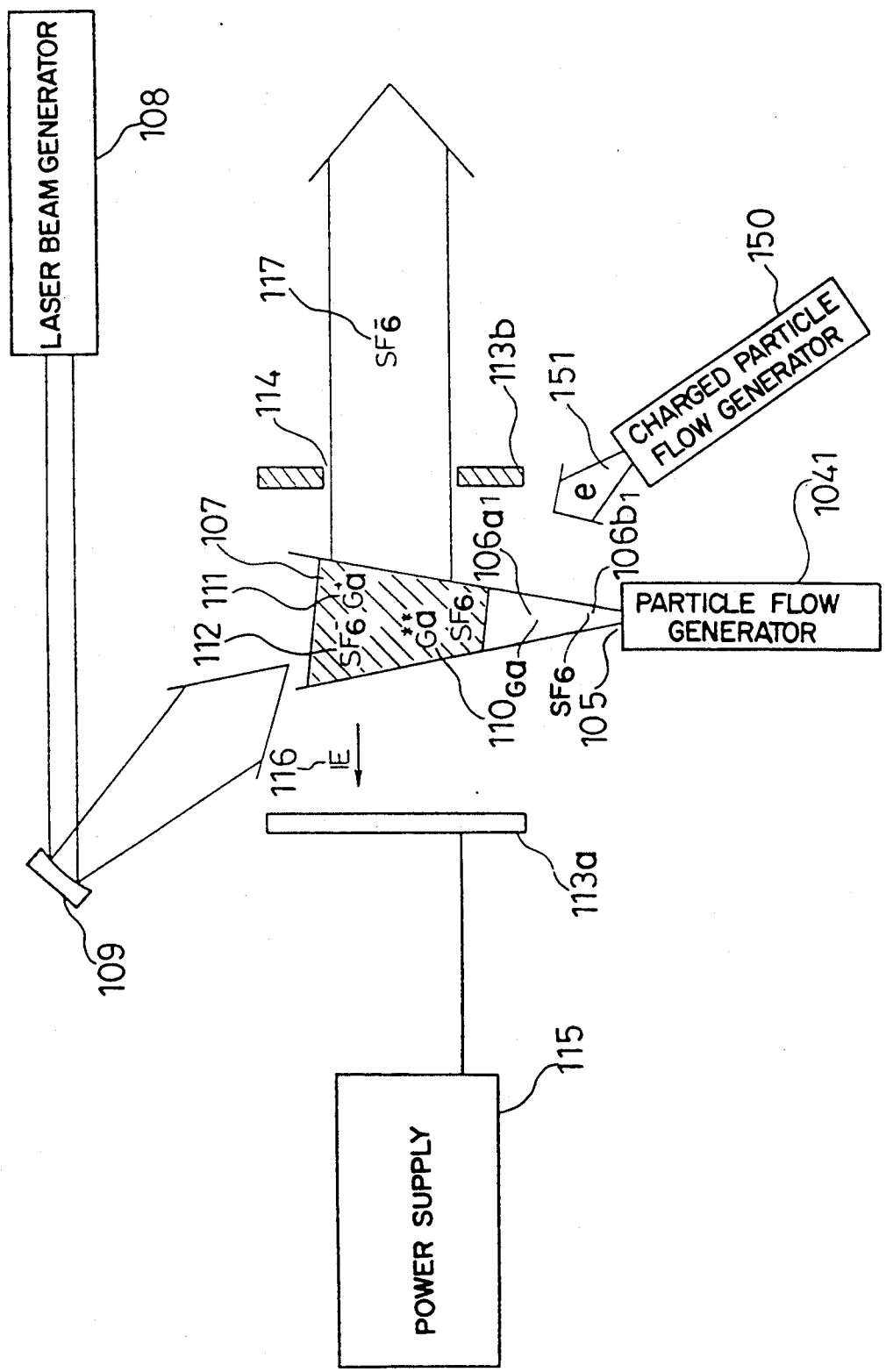

FIG. 54 is a thirty-fifth embodiment of the present invention in which the particle flow generator 1041 illustrated in FIG. 41 is used instead of the first and second particle flow generators 101 and 104 in accordance with the seventeenth embodiment of the present invention in FIG. 33.

Figure 55:
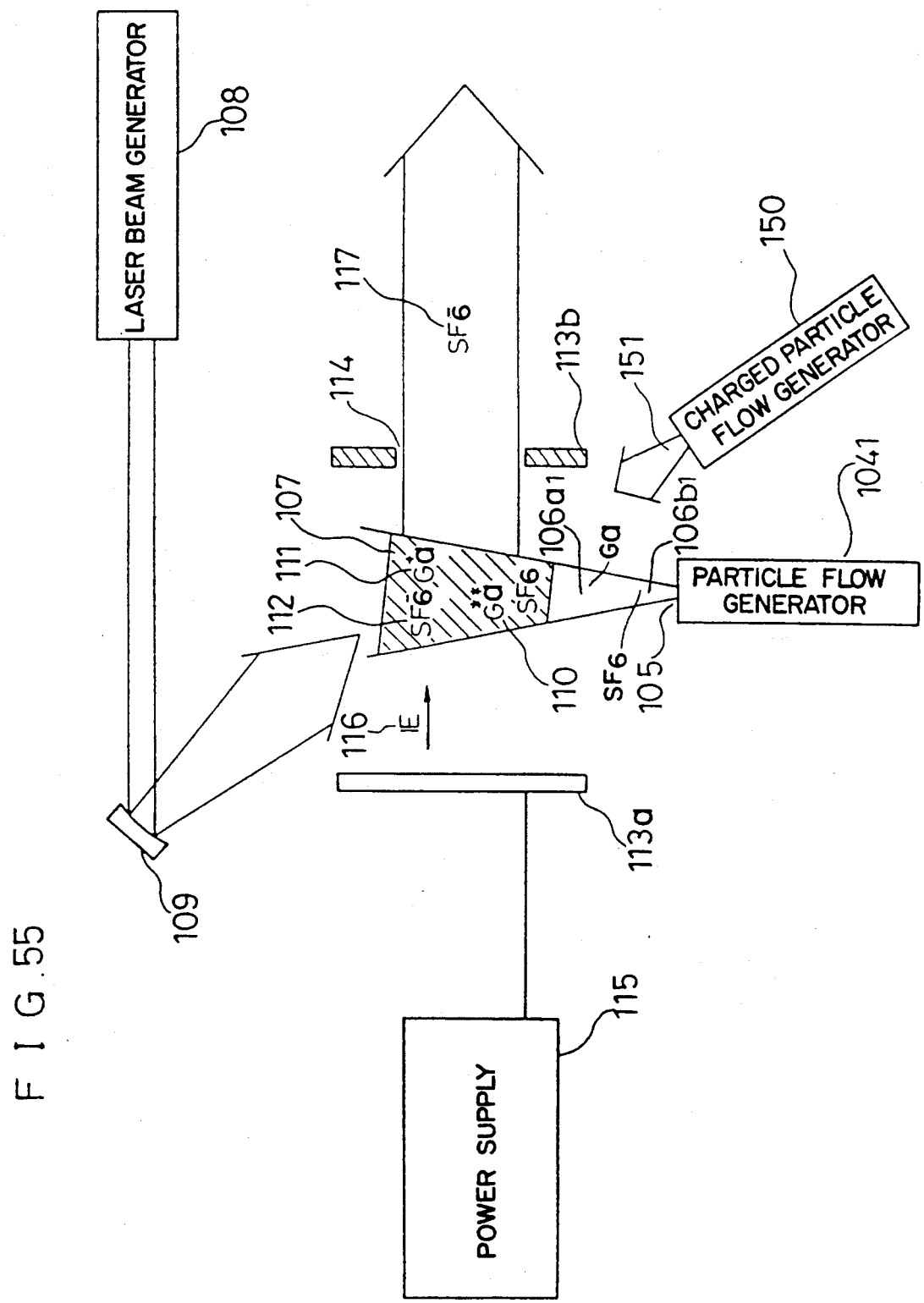

FIG. 55 is a thirty-sixth embodiment of the present invention in which the particle flow generator 1041 illustrated in FIG. 41 is used instead of the first and second particle flow generators 101 and 104 in accordance with the eighteenth embodiment of the present invention in FIG. 35.

Figure 56:
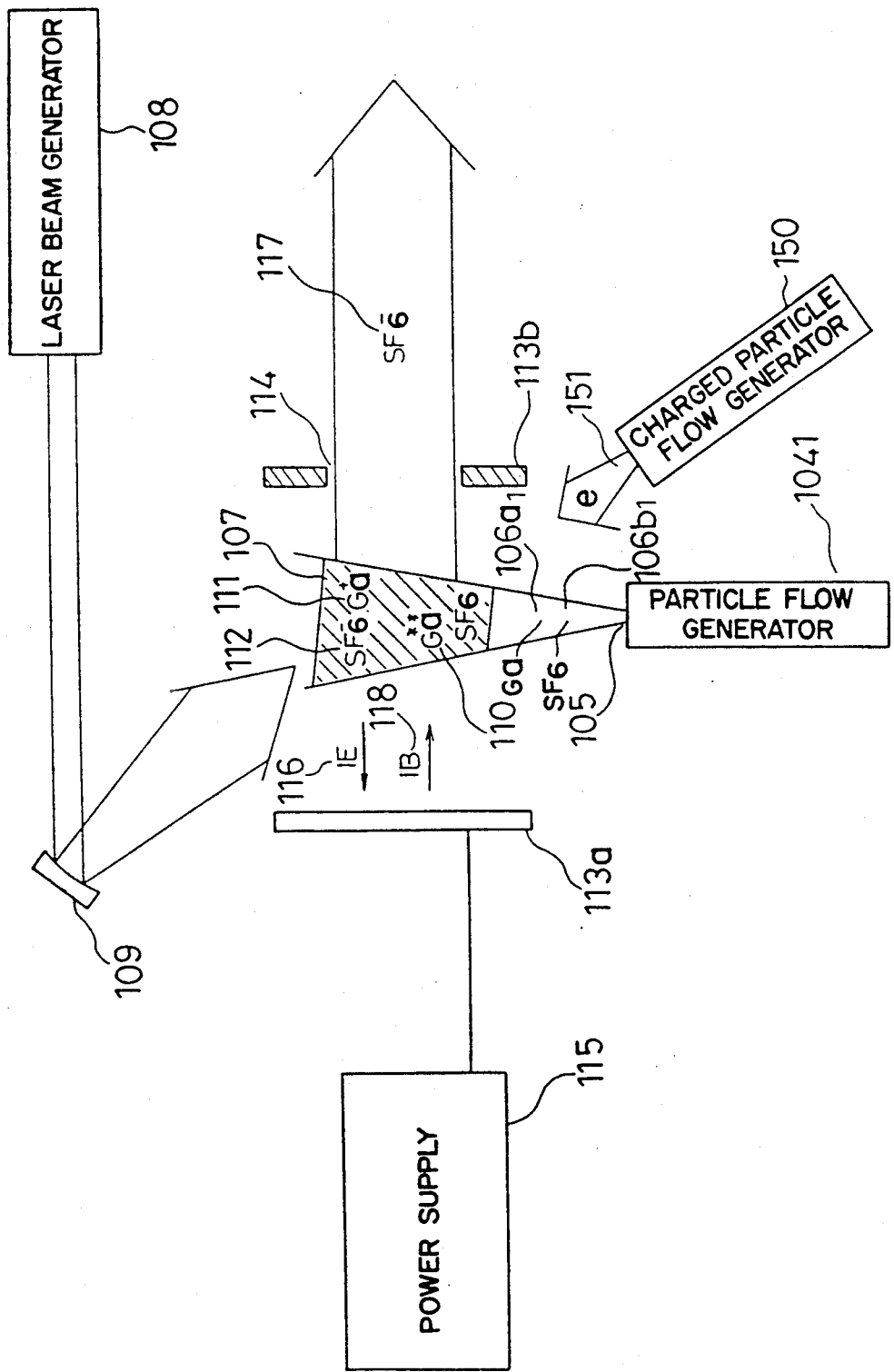

FIG. 56 is a thirty-seventh embodiment of the present invention in which the particle flow generator 1041 illustrated in FIG. 41 is used instead of the first and second particle flow generators 104 and 104 in accordance with the nineteenth embodiment of the present invention in FIG. 36.

Figure 57:
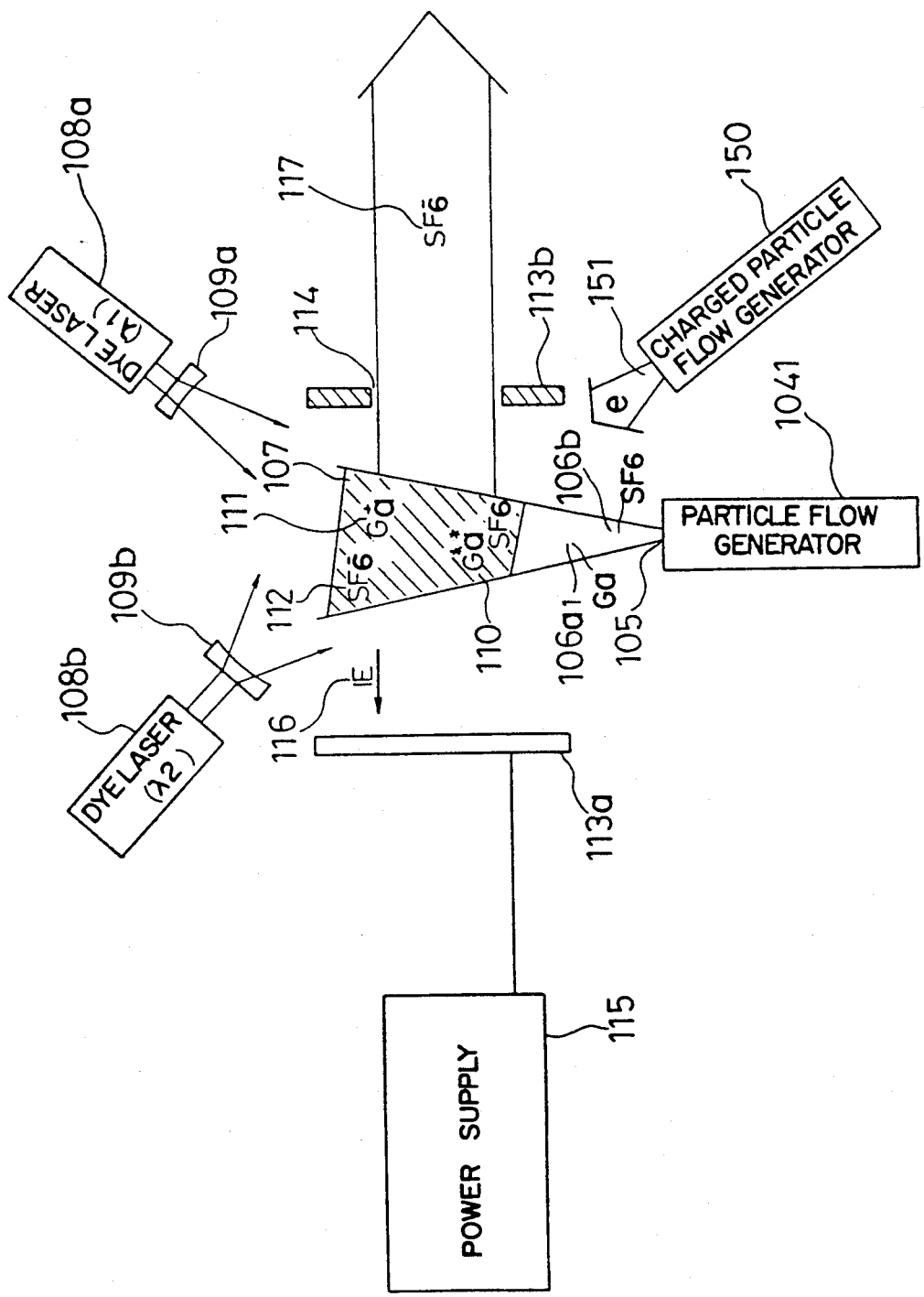

FIG. 57 is a thirty-eighth embodiment of the present invention in which the particle flow generator 1041 illustrated in FIG. 41 is used instead of the first and second particle flow generators 101 and 104 in accordance with the twentieth embodiment of the present invention in FIG. 37.

Figure 58:
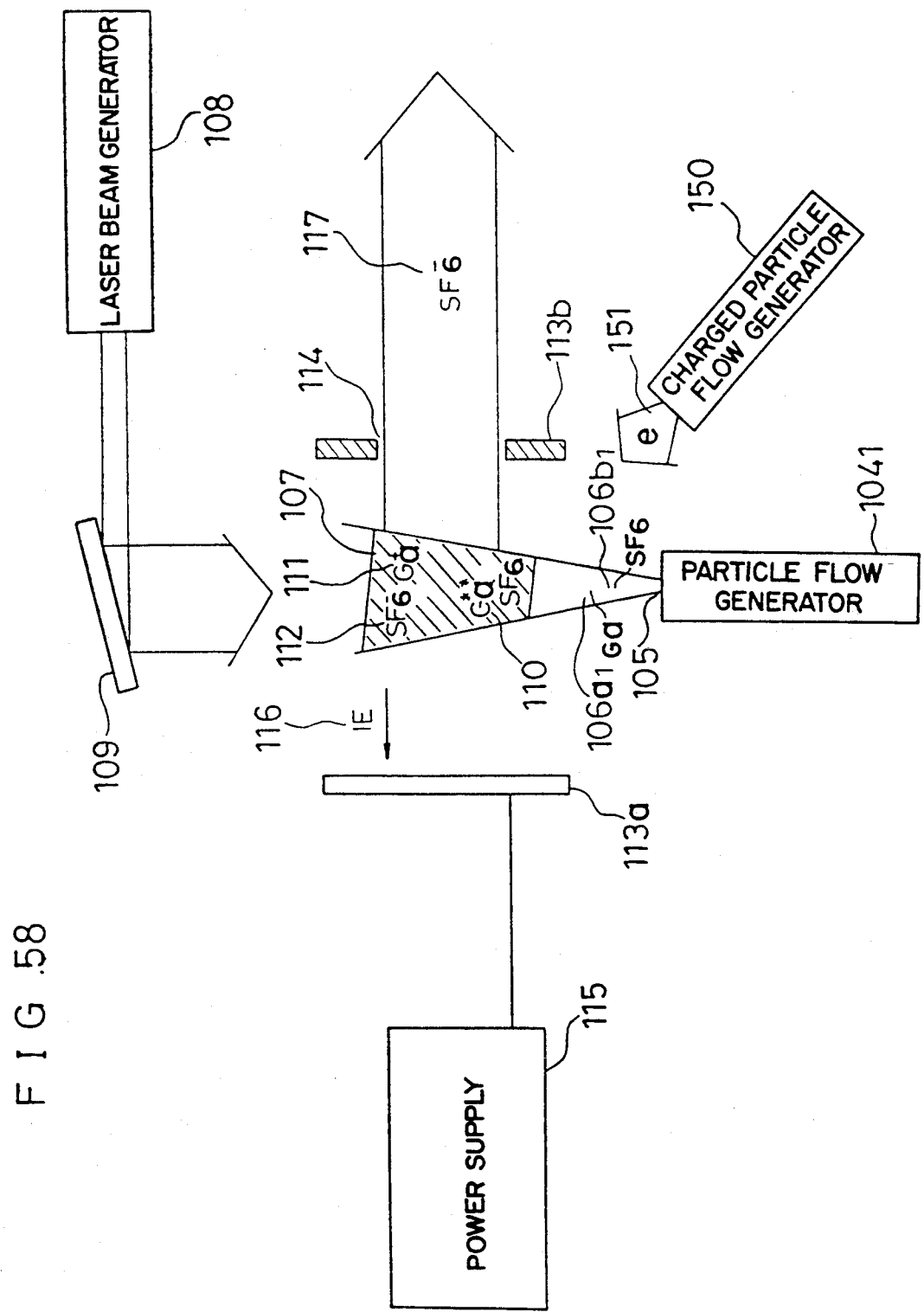

FIG. 58 is a thirty-ninth embodiment of the present invention in which the particle flow generator 1041 illustrated in FIG. 41 is used instead of the first and second particle flow generators 101 and 104 in accordance with the twenty-first embodiment of the present invention in FIG. 38.

FIG. 59 is a fortieth embodiment of the present invention in which the particle flow generator 1041 illustrated in FIG. 41 is used instead of the first and second particle flow generators 101 and 104 in accordance with the twenty-second embodiment of the present invention in FIG. 39.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An ion source comprising:
   a particle flow generator for generating particle flow comprising atoms or molecules;
   a laser beam generator for generating a laser beam with one or a plurality of wavelengths which irradiates a region of the whole or one part of the atoms or molecules in the particle flow near an exhaust nozzle of said particle flow generator;
   a pair of electrodes for applying an electric field over one part or the whole of the particle flow after the particle flow has been sufficiently defused in a downstream region of the region irradiated with said laser beam said pair of electrodes located downstream form the region irradiated; and
   a power supply for applying a voltage to said pair of electrodes which generates the electric field between said pair of electrodes,
   wherein said laser beam has one or a plurality of excitation wavelengths for exciting specific atoms or molecules in the particle flow from a ground state to highly excited state of the Rydberg state in which the principal quantum number of a valence electron is large.
   said voltage for generating the electric field of more than a minimum electric field for ionizing the atoms or molecules in said Rydberg state is applied between said pair of electrodes after irradiation of the laser beam, and
   one or a plurality of outlet holes through which an ion beam is drawn out are provided at predetermined portions of said pair electrodes.

2. An ion source in accordance with claim 1, wherein said pair of electrodes are arranged in such a manner that directions of the electric field and a direction of the particle flow cross each other.

3. An ion source in accordance with claim 1, wherein said of electrodes are arranged in such a manner that a direction of the electric field is in parallel to a direction of the particle flow.

4. An ion source in accordance with claim 1, wherein the atoms or molecules are excited from the group state to the Rydberg state through a multiple of states by using said laser beam with at least two kinds of wavelengths from said laser beam generator.

5. An ion source in accordance with claim 1, wherein at least one laser beam from said laser beam generator is a pulser laser, particles excited into the Rydberg state by said pulser laser beam flow between said pair of electrodes and then said electric field comprises a pulse electric field applied between said pair of electrodes one time or a plurality of times.

6. An ion source in accordance with claim 5, wherein a period of pause between said pulse electric field and a subsequent pulse electric field is longer than a time required for the particle flow to pass through a region to which the electric field is applied in a case where the pulse electric field is applied between said pair of electrodes said plurality of times.

7. An ion source in accordance with claim 5, wherein irradiation of said pulse laser beam and application of said pulse electric field are repeated.

8. An ion source in accordance with claim 1, wherein the laser beam from said laser beam generator comprises a continuously oscillating laser beam and a pulse electric field is repetitively and periodically applied between said pair of electrodes.

9. An ion source in accordance with claim 8, wherein a period of pause between said pulse electric field and a subsequent pulse electric field is longer than time required for the particle flow to pass through a region to which the electric field is applied in a case where the pulse electric field is applied between said pair of electrodes a plurality of times.

10. An ion source in accordance with claim 1, wherein said Rydberg state is said highly excited state having a principal quantum number of 20 or more.

11. An ion source in accordance with claim 1, further comprising a magnetic field generator for generating a magnetic field between said pair of electrodes.

12. An ion source in accordance with claim 11, wherein said magnetic field is in parallel to the electric field.

13. An ion source in accordance with claim 1, wherein the laser beam comprising a wavelength of 403.3 nm irradiates the particle flow comprising gallium for exciting said gallium from a ground state of 4p to an excited state of 5s as a first stage and then the laser beam comprising a wavelength shorter than 403.3 nm irradiates the particle flow for exciting the gallium into the Rydberg state.

14. A ion source in accordance with claim 1, wherein a wavelength band width of at least one laser beam is smaller than an isotope shift of a transition wavelength of atoms to be excited and said laser wavelength coincides with a wavelength by which only an isotope of specific atoms in excited into the Rydberg state.

15. An ion source in accordance with claim 1, wherein a thin film is formed on a substrate, ion implantation is performed on a substrate or a substrate is etched away by using the ion beam drawn out from said ion source.

16. An ion source in accordance with claim 15, wherein said substrate is arranged between said pair of electrodes.

17. An ion flow generator comprising:
particle flow generating means for generating a single particle flow comprising one or a plurality of atoms or molecules or a plurality of particle flows comprising atoms or molecules having a region in which said particle flows cross each other;
exciting means having a laser beam generator which generates a laser beam having one or a plurality of wavelengths to irradiate at least one region of said particle flow near an exhaust nozzle of said particle flow generator and in the region in which said particle flows cross each other, for exciting specific atoms or molecules in said particle flow from a bottom or an excited state to a highly excited state of the Rydberg state having a large principal quantum number of a valence electron, so that ionization occurs by utilization of collision of particles in the Rydberg state; and
electric field applying means for applying an electric field near a cross region of said particle flow or near the region irradiated with said laser beam to provide specific ions.

18. An ion flow generator comprising:
first particle flow generating means for generating a first particle flow of atoms or molecules comprising a first material;
second particle flow generating means for generating a second particle flow of atoms or molecules comprising a second material so as to cross said first particle flow from said first particle flow generating means;
laser generating means for generating a laser beam which irradiates at least one region of a combined particle flow from said first and second particle flow generating means and excites the atoms or molecules comprising said first or second material into a highly excited state of the Rydberg state, so that ionization is carried out by collision of particles in the Rydberg state; and
electric field applying means for applying an electric field near a region in which said combined particle flow from said first and second particle flow generating means cross each other at or near a region irradiated by said laser beam to obtain specific ions.

19. An ion flow generator in accordance with claim 18, wherein said electric field applying means comprises a pair of electrodes and potential generating means for supplying a potential to one electrode of said pair of electrodes.

20. An ion flow generator in accordance with claim 19, wherein said potential generating means of said electric field applying means generates a pulse of negative potential.

21. An ion flow generator in accordance with claim 19, wherein said potential generating means of said electric field applying means generates a pulse of a positive potential.

22. An ion flow generator in accordance with claim 19, wherein said potential generating means of said electric field applying means generates a continuous potential of a negative potential.

23. An ion flow generator in accordance with claim 19, wherein said potential generating means of said electric field applying means generates a continuous potential of a positive potential.

24. An ion flow generator in accordance with claim 19, wherein the other electrode of said pair of electrodes of said electric field applying means has an outlet hole through which specific ions pass.

25. An ion flow generator in accordance with claim 18, wherein said laser generating means comprises a first generating means for generating a first laser beamline with a first wavelength and second generating means for generating a second laser beam with a second wavelength.

26. An ion flow generator in accordance with claim 18, wherein said laser generating means generates said laser beam in a pulse form.

27. An ion flow generator in accordance with claim 18, wherein said laser generating means generates said laser beam comprising a continuous laser beam.

28. An ion flow generator in accordance with claim 18, wherein said laser generating means generates said laser beam for irradiating said combined particle flow in parallel to a flow direction from a position opposite to the direction of said first particle flow from the first particle flow generating means.

29. An ion flow generator in accordance with claim 18, wherein said first particle flow from the first particle flow generating means crosses the second particle flow at right angles.

30. An ion flow generator in accordance with claim 18, wherein said first particle flow generating means and said second particle flow generating means are integrally constituted.

31. An ion flow generator comprising:
first particle flow generating means for generating a first particle flow of atoms or molecules comprising a first material;
second particle flow generating means for generating a second particle flow of atoms or molecules comprising a second material which is excited into an excited state by an electric field and a magnetic field so as to cross said first particle flow from said first particle flow generating means;
laser generating means for generating a laser beam which irradiates at least one region of a combined particle flow from said first and second particle flow generating means and excites the atoms of molecules comprising said first or second material into a highly excited state of the Rydberg state, so that ionization is carried out by utilization of collision of the particles in the particle flow; and
electric field applying means for applying said electric field near a region in which said combined particles flow from said first and second particle flow generating means cross each other at or near a region irradiated by said laser beam to obtain specific ions.

32. An ion flow generator in accordance with claim 31, wherein said first particle flow generating means and said second particle flow generating means are integrally constituted.

33. An ion flow generator comprising:
first particle flow generating means for generating a first particle flow of atoms or molecules comprising a first material;
second particle flow generating means for generating a second particle flow of atoms or molecules comprising a second material so as to cross said first particle flow from said first particle flow generating means;
charged particle generating means for generating a charged particle with which at least one region upstream of a cross region of said second particle flow of said second particle flow generating means and said first particle flow of said first particle flow generating means is irradiated;
laser generating means for generating a laser beam which irradiates at least one region of a combine particle flow from said first and second particle flow generating means and excites the atoms or molecules comprising said first or second material into a highly excited state of the Rydberg state, so that ionization is carried out by utilization of collision of the particles in the particle flow; and electric field applying means for applying an electric field near a region in which said combined particle flow from said first and second particle flow generating means cross each other at or near a region irradiated by laser beam to obtain specific ions.

34. An ion source comprising:
a particle flow generator for generating a particle flow comprising atoms or molecules;
a laser beam generator for generating a laser beam with one or a plurality of wavelengths which irradiates a region of the whole or one part of the atoms or molecules in the particle flow near an exhaust nozzle of said particle flow generator;
a pair of electrodes for applying an electric field over one part or the whole of the particle flow in a downstream region of the region irradiated with said laser beam;
a substrate arranged between said pair of electrodes for forming a thin film on said substrate, performing ion implantation on said substrate, performing ion implantation on said substrate or etching said substrate by using the ion beam drawn out from an ion source,
wherein said laser beam has one or a plurality of excitation wavelengths for exciting specific atoms or molecules in the particle flow from a ground state to a highly excited state of the Rydberg state in which the principal quantum number of a valence electron is large so that ionization is carried out by particle collision in the particle flow.
said voltage for generating the electric field of more than a minimum electric field for ionizing the atoms or molecules in said Rydberg state is applied between said pair of electrodes after irradiation of the laser beam, and
one or a plurality of outlet holes through which an ion beam is drawn out are provided at predetermined positions of said pair of electrodes.

35. A method of ionizing a material using a laser, comprising the steps of:
(a) generating particle flow comprising atoms or molecules by a particle flow generator;
(b) generating a laser beam with one or a plurality of wavelengths which irradiates a region of the whole or one part of the atoms or molecules in the particles flow near an exhaust nozzle of said particle flow generator;
(c) applying an electric field between a pair of electrodes over one part or the whole of the particle flow in a downstream region of the region irradiated with said laser beam;
(d) applying a voltage to said pair of electrodes to generate the electric field between said pair of electrodes;
(e) exciting specific atoms or molecules in the particle flow from a ground state to a highly excited states of the Rydberg state in which the principal quantum number of a valence electron is large by said laser beam having one or a plurality of excitation wavelengths so that ionization is carried out by utilization of collision of particles in the particle flow;
(f) generating said electric field or more than a minimum electric field by applying said voltage between said pair of electrodes after irradiation of the laser beam for ionizing the atoms or molecules in said Rydberg state; and
(g) drawing out an ion beam through one or a plurality of outlet holes provided at predetermined portions of said pair of electrodes.

36. The method in accordance with claim 35, further comprising the steps of:
(h) arranging a substrate between said pair of electrodes;
(i) forming a thin film on said substrate, performing ion implantation on said substrate or etching said substrate by using the ion beam drawn out at said step (g).

* * * * *